(12) United States Patent
Kanamitsu et al.

(10) Patent No.: US 6,603,680 B2
(45) Date of Patent: Aug. 5, 2003

(54) SEMICONDUCTOR DEVICE AND DATA PROCESSING SYSTEM

(75) Inventors: Michitaro Kanamitsu, Ome (JP); Yoshinori Takase, Tokyo (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 29 days.

(21) Appl. No.: 10/013,538

(22) Filed: Dec. 13, 2001

(65) Prior Publication Data

US 2002/0080660 A1 Jun. 27, 2002

(30) Foreign Application Priority Data

Dec. 26, 2000 (JP) .......................................... 2000-394935

(51) Int. Cl.[7] .............................. G11C 16/04; G11C 7/00
(52) U.S. Cl. .............................. 365/185.03; 365/185.24; 365/196; 365/189.05
(58) Field of Search ...................... 365/185.03, 185.24, 365/196, 218, 230.02, 230.06, 230.08, 189.02, 189.05, 185.29

(56) References Cited

U.S. PATENT DOCUMENTS

| | | | |
|---|---|---|---|
| 6,046,936 A | 4/2000 | Tsujikawa et al. ..... | 365/185.03 |
| 6,078,519 A | 6/2000 | Kanamitsu et al. ..... | 365/185.03 |
| 6,097,634 A * | 8/2000 | Sugiyama .............. | 365/185.21 |
| 6,125,052 A * | 9/2000 | Tanaka .................. | 365/185.03 |

FOREIGN PATENT DOCUMENTS

| | | |
|---|---|---|
| JP | 11-232886 | 8/1999 |
| JP | 11-345494 | 12/1999 |

* cited by examiner

*Primary Examiner*—Thong Le
(74) *Attorney, Agent, or Firm*—Miles & Stockbridge P.C.

(57) ABSTRACT

The present invention provides a semiconductor device such as a multi-valued flash memory or the like, which is capable of shortening a processing time required to set write control information to a sense latch. The semiconductor device is capable of electrically writing multi-value information therein. Bit lines are connected to the right and left input/output terminals of a sense latch, and data latches are connected to the respective bit lines. A decoder is provided which decodes write data supplied from outside to thereby generate write control information. The write control information is latched in each of the sense latch and data latches, and the latched control information is set as information indicative of go/no-go of the application of a write voltage, which corresponds to each value in a multivalue.

24 Claims, 49 Drawing Sheets

FIG. 5

|  | DESIGNATION | DEFINITION |
|---|---|---|
| I/O7 | Ready/$\overline{\text{Busy}}$ | "V$_{OH}$"=Ready  "V$_{OL}$"=Busy |
| I/O6 | Reserved |  |
| I/O5 | Erase Check | "V$_{OH}$"=Fail  "V$_{OL}$"=Pass |
| I/O4 | Program Check | "V$_{OH}$"=Fail  "V$_{OL}$"=Pass |
| I/O3 | Reserved |  |
| I/O2 | Reserved |  |
| I/O1 | Reserved |  |
| I/O0 | Reserved |  |

STATUS REGISTER

| WRITE DATA | I/O 4 | I/O 0 | DLL | DLR |
|---|---|---|---|---|
| 01 | 0 | 1 | 0 | 1 |
| 00 | 0 | 0 | 0 | 0 |
| 10 | 1 | 0 | 1 | 0 |
| 11 | 1 | 1 | 1 | 1 |

INPUT WRITE DATA

THRESHOLD VOLTAGE DISTRIBUTION OF MEMORY CELLS

OPERATING VOLTAGE

FIG. 12

| | SELECTED BLOCK | | UNSELECTED BLOCK | |
|---|---|---|---|---|
| | SELECTED WORD | UNSELECTED WORD | SELECTED WORD | UNSELECTED WORD |
| READ | 2.4/3.2/4.0V, 1.0V / Vss, Vss | Vss, 1.0V / Vss, Vss | Vss, OPEN / OPEN, Vss | Vss, OPEN / OPEN, Vss |
| ERASE | -16V, 2.0V / 2.0V, 2.0V | Vss, 2.0V / 2.0V, 2.0V | 2.0V, 2.0V / 2.0V, 2.0V | 2.0V, 2.0V / 2.0V, 2.0V |
| WRITE — WRITE DATA | 15.1/15.8/17.0V, Vss / OPEN, Vss | 4.5V, Vss / Vss, Vss | OPEN, OPEN / OPEN, Vss | Vss, OPEN / OPEN, Vss |
| WRITE — NON-WRITE DATA | 15.1/15.8/17.0V, 6.0V / OPEN, Vss | 4.5V, 6.0V / Vss, Vss | OPEN, OPEN / OPEN, Vss | Vss, OPEN / OPEN, Vss |
| WRITE — VERIFY | 2.8/3.6/4.5V, 1.0V / Vss, Vss | Vss, 1.0V / Vss, Vss | Vss, OPEN / OPEN, Vss | Vss, OPEN / OPEN, Vss |
| WRITE — ERRATIC DETECTION / DISTURB DETECTION | 2.3V/3.1/3.9V, 1.0V / Vss, Vss | Vss, 1.0V / Vss, Vss | Vss, OPEN / OPEN, Vss | Vss, OPEN / OPEN, Vss |

FIG. 15 WRITE/ADDITIONAL WRITE FLOW

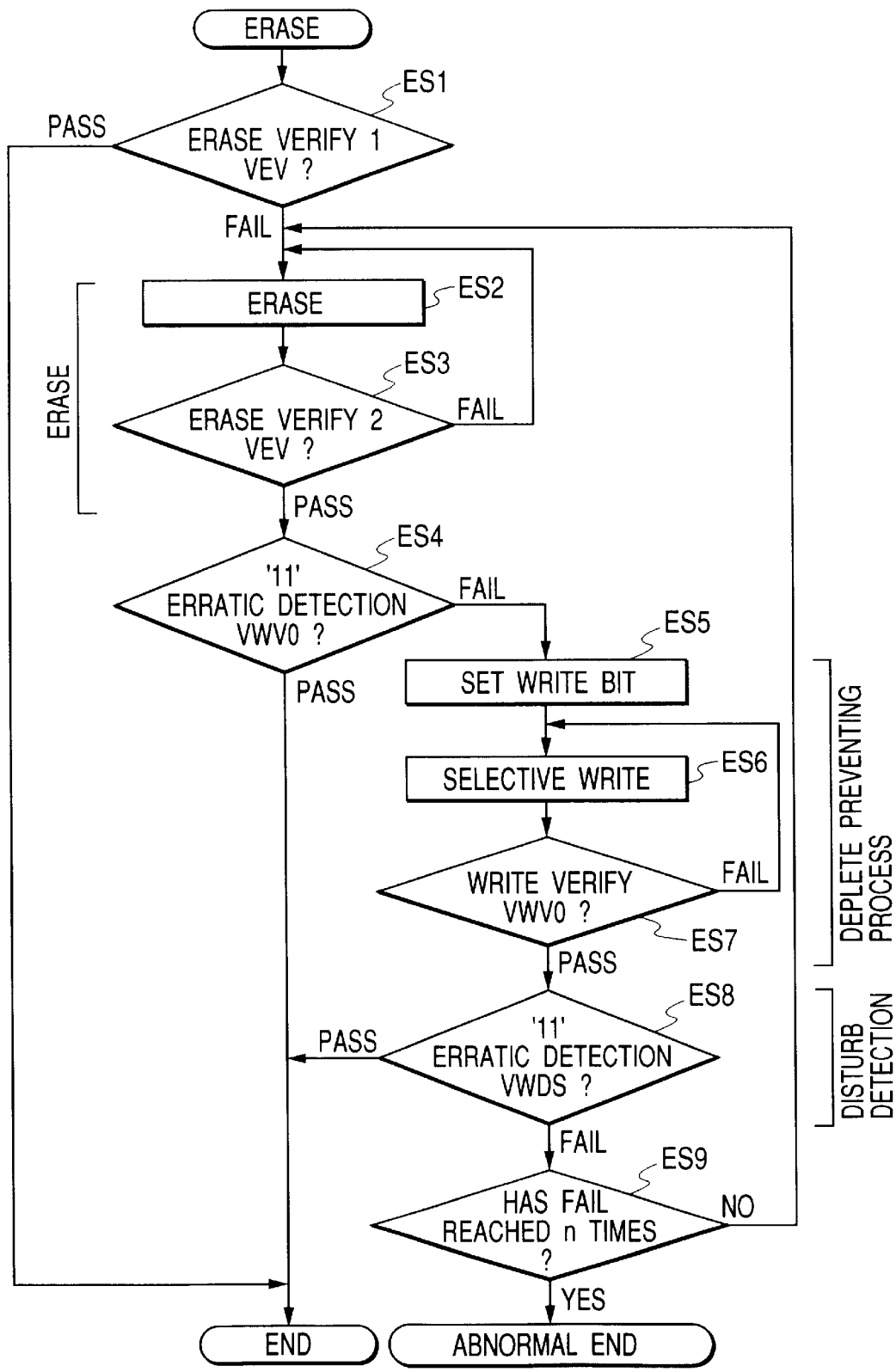

FIG. 21

| DATA LATCH PROCESSING | CONTENTS OF OPERATION (SENSE LATCH DATA ON SELECTED MAT SIDE) |
|---|---|
| "01" WRITE DATA | $A+\overline{B}$ |
| "00" WRITE DATA | $A+B$ |
| "10" WRITE DATA | $\overline{A}+B$ |
| "00" ERRATIC DETECTION DATA | $\overline{A+B}$ |
| "10" ERRATIC DETECTION DATA | $A \cdot \overline{B}$ |
| "11" DISTURB DETECTION DATA | $A \cdot B$ |

A : UPPER DATA   B : LOWER DATA

FIG. 22

| A UPPER | B LOWER | $A+\overline{B}$ | $A+B$ | $\overline{A}+B$ | $\overline{A+B}$ | $A \cdot \overline{B}$ | $A \cdot B$ |
|---|---|---|---|---|---|---|---|
| 0 | 1 | 0 | 1 | 1 | 0 | 0 | 0 |
| 0 | 0 | 1 | 0 | 1 | 1 | 0 | 0 |
| 1 | 0 | 1 | 1 | 0 | 0 | 1 | 0 |
| 1 | 1 | 1 | 1 | 1 | 0 | 0 | 1 |

CONCEPT OF ADDITIONAL WRITING (AFTER ADDITIONAL WRITING)

FIG. 24

LOWER BIT : $a0 \cdot \overline{(b1 \oplus b3)}$
UPPER BIT : $\overline{a1} \oplus \overline{b2}$

- a0 : ADDITIONAL WRITE DATA (LOWER BIT)
- a1 : ADDITIONAL WRITE DATA (UPPER BIT)
- b1 : MEMORY READ DATA (VRW1 (2.4V) READ)
- b2 : MEMORY READ DATA (VRW2 (3.2V) READ)
- b3 : MEMORY READ DATA (VRW3 (4.0V) READ)
- $\oplus$ : EXCLUSIVE OR

| STATE OF MEMORY CELL | ADDITIONAL WRITE DATA | a1 | a0 | b1 | b2 | b3 |
|---|---|---|---|---|---|---|
| 01 | 11 | 1 | 1 | 1 | 1 | 1 |
| 00 | 11 | 1 | 1 | 1 | 1 | 0 |
| 10 | 11 | 1 | 1 | 1 | 0 | 0 |
| 11 | 01 | 0 | 1 | 0 | 0 | 0 |
| 11 | 00 | 0 | 0 | 0 | 0 | 0 |
| 11 | 10 | 1 | 0 | 0 | 0 | 0 |
| 11 | 11 | 1 | 1 | 0 | 0 | 0 |

(4) '11' WORD DISTURB DETECTION

'11' WORD DISTURB DATA LATCH

| STEP | STEP 38 | | | | | | STEP 39 | | | | | | STEP 40 | | | | | | STEP 41 | | | | | | STEP 42 | | | | | | STEP 43 | | | | | |
|---|---|---|---|---|---|---|---|---|---|---|---|---|---|---|---|---|---|---|---|---|---|---|---|---|---|---|---|---|---|---|---|---|---|---|---|---|
| CONTENTS | DATA TRANSFER DLL → G-BLL G-BLR PRECHARGE | | | | | | SL SENSE | | | | | | G-BLL/R DISCHARGE G-BLL/R PRECHARGE | | | | | | OPERATION (SL(R), G-BLR) | | | | | | OPERATION (G-BLR, DLR) SL CLEAR | | | | | | SL SENSE | | | | | |
|  | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR |
| 01 | (1)0 | 0.0 |  |  | 0.5 | (0)1 | (1)0 | 0 |  | 1 | 0 | (0)1 | (1)0 | 0.5 | 0 | 1 | 1.0 | (0)1 | (1)0 | 0.5 | 0 | 0 | 0.0 | (0)1 | (1)0 | 0.5 | 0 | 0 | 0.0 | (0)1 | (1)0 | 1 | 1 | 0 | 0 | (0)1 |
| 00 | (1)0 | 0.0 |  |  | 0.5 | (1)0 | (1)0 | 0 |  | 1 | 0 | (1)0 | (1)0 | 0.5 | 0 | 1 | 1.0 | (1)0 | (1)0 | 0.5 | 0 | 0 | 0.0 | (1)0 | (1)0 | 0.5 | 0 | 0 | 0.0 | (1)0 | (1)0 | 1 | 1 | 0 | 0 | (1)0 |
| 10 | (0)1 | 1.0 |  |  | 0.5 | (1)0 | (0)1 | 1 |  | 0 | 0 | (1)0 | (0)1 | 0.5 | 1 | 0 | 1.0 | (0)1 | (0)1 | 0.5 | 1 | 0 | 1.0 | (1)0 | (0)1 | 0.5 | 0 | 0 | 1.0 | (1)0 | (0)1 | 1 | 1 | 0 | 1 | (1)0 |
| 11 | (0)1 | 1.0 |  |  | 0.5 | (0)1 | (0)1 | 1 |  | 0 | 0 | (0)1 | (0)1 | 0.5 | 1 | 0 | 1.0 | (0)1 | (0)1 | 0.5 | 1 | 0 | 1.0 | (0)1 | (0)1 | 0.5 | 0 | 0 | 1.0 | (0)1 | (0)1 | 0 | 0 | 1 | 1 | (0)1 |

'11' WORD DISTURB DETECTION

| | STEP 44 | | | | | | STEP 45 | | | | | | STEP 46 | | | | | | STEP 47 | | | | | | STEP 48 | | | | | |
|---|---|---|---|---|---|---|---|---|---|---|---|---|---|---|---|---|---|---|---|---|---|---|---|---|---|---|---|---|---|---|
| | G-BLL/R DISCHARGE | | | | | | G-BLR SELECT PRECHARGE G-BLL PRECHARGE | | | | | | MEMORY DISCHARGE (VWDS) | | | | | | SL CLEAR SL SENSE & ALL DETERMINATION | | | | | | G-BLL/R DISCHARGE SL CLEAR | | | | | |
| | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR | DLL | G-BLL | SL(L) | SL(R) | G-BLR | DLR |
| | (1)0 | 0 | 1 | 0 | 0 | (1)0 | (1)0 | 0.5 | 1 | 0 | 0.0 | (0)1 | (1)0 | 0.5 | 1 | 0 | 0.0 | (0)1 | (1)0 | 0.5 | 1 | 0 | 0.0 | (0)1 | (1)0 | 0.0 | 0 | 0 | 0.0 | (0)1 |
| | (1)0 | 0 | 1 | 0 | 0 | (1)0 | (1)0 | 0.5 | 1 | 0 | 0.0 | (1)0 | (1)0 | 0.5 | 1 | 0 | 0.0 | (1)0 | (1)0 | 0.5 | 1 | 0 | 0.0 | (1)0 | (1)0 | 0.0 | 0 | 0 | 0.0 | (1)0 |
| | (0)1 | 0 | 0 | 1 | 0 | (1)0 | (0)1 | 0.5 | 0 | 1 | 0.0 | (1)0 | (0)1 | 0.5 | 0 | 1 | 1.0 | (0)1 | (0)1 | 0.5 | 1 | 0 | 0.0 | (0)1 | (0)1 | 0.0 | 0 | 0 | 0.0 | (0)1 |
| | (0)1 | 0 | 0 | 1 | 0 | (0)1 | (0)1 | 0.5 | 0 | 1 | 0.0 | (0)1 | (0)1 | 0.5 | 0 | 1 | 0.0 | (0)1 | (0)1 | 0.5 | 1 | 0 | 0.0 | (0)1 | (0)1 | 0.0 | 0 | 0 | 0.0 | (0)1 |

ALL DETERMINATION: TO ERASE IF FAIL IS REACHED

2. ERASE SEQUENCE

| STEP | ERASE VERIFY 1 | | | |
|---|---|---|---|---|
| | STEP 1 | STEP 2 | STEP 3 | STEP 4 |
| CONTENTS | G-BLL/R PRECHARGE | MEMORY DISCHARGE (VEV=2.0V) | SL SENSE & ALL DETERMINATION | G-BLL/R DISCHARGE, SL CLEAR |
| | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR |
| 11 | 0.5 / / / / 1.0 / | 0.5 / / / / 1.0 / | / 0 / 0 / 1 / 1 / | / 0 / 0 / 0 / 0 / |
| BELOW 11 | 0.5 / / / / 1.0 / | 0.5 / / / / 1.0 / | / 0 / 0 / 1 / 1 / | / 0 / 0 / 0 / 0 / |

※ 11: BIT IN WHICH POST-ERASURE Vth IS LESS THAN OR EQUAL TO VEV
BELOW 11: BIT IN WHICH Vth OUT OF 11 IS LESS THAN OR EQUAL TO VWV0 (BIT INTENDED FOR WRITEBACK)
ALL DETERMINATION: ERASE END UPON PASS

| ERASE | ERASE VERIFY 2 | | |
|---|---|---|---|
| Step 5 | Step 6 | Step 7 | Step 8 |
| ERASE | G-BLL/R PRECHARGE | MEMORY DISCHARGE (VEV=2.0V) | SL SENSE & ALL DETERMINATION |
| DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR |
| | / 0.5 / / / 1.0 / | / 0.5 / / / 0.0 / | / 1 / 1 / 0 / 0 / |
| | / 0.5 / / / 1.0 / | / 0.5 / / / 0.0 / | / 1 / 1 / 0 / 0 / |

ALL DETERMINATION: TO STEP 5 UPON FAIL

| '11' ERRATIC DETECTION | | | |
|---|---|---|---|
| Step 9 | Step 10 | Step 11 | Step 12 |
| G-BLL/R DISCHARGE, SL CLEAR | G-BLL/R PRECHARGE | MEMORY DISCHARGE (VWV0=1.2V) | SL SENSE & ALL DETERMINATION |
| DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR |
| 0 / 0 / 0 / 0 / / | / 0.5 / / / 1.0 / | / 0.5 / / / 1.0 / | / 0 / 0 / 1 / 1 / |
| 0 / 0 / 0 / 0 / / | / 0.5 / / / 1.0 / | / 0.5 / / / 0.0 / | / 1 / 1 / 0 / 0 / |

(a)
ALL DETERMINATION: ERASE END UPON PASS

| WRITE (DEPLETE PREVENTING PROCESS) | | | |
|---|---|---|---|
| Step 13 | Step 14 | Step 15 | Step 16 |
| WRITE | G-BLL/R DISCHARGE G-BLL/R PRECHARGE | MEMORY DISCHARGE (VWV0=1.2V) | SL CLEAR, SL SENSE & ALL DETERMINATION |
| DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR |
| 0.0 / 0.0 / 6.0 / 6.0 / / | / 0.5 / 0 / 1 / 1.0 / | / 0.5 / 0 / 1 / 1.0 / | / 0 / 0 / 1 / 1 / |
| 6.0 / 6.0 / 0.0 / 0.0 / / | / 0.5 / 1 / 0 / 1.0 / | / 0.5 / 1 / 0 / 1.0 / | / 0 / 0 / 1 / 1 / |

ALL DETERMINATION: TO STEP 13 UPON FAIL

| '11' ERRATIC DETECTION | | | |
|---|---|---|---|
| Step 17 | Step 18 | Step 19 | Step 20 |
| G-BLL/R PRECHARGE | MEMORY DISCHARGE (VWDS) | SL SENSE & ALL DETERMINATION | G-BLL/R DISCHARGE, SL CLEAR |
| DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR | DLL / G-BLL / SL(L) / SL(R) / G-BLR / DLR |
| 0.5 / / / / 1.0 / | 0.5 / / / / 0.0 / | / 1 / 1 / 0 / 0 / | / 0 / 0 / 0 / 0 / |
| 0.5 / / / / 1.0 / | 0.5 / / / / 0.0 / | / 1 / 1 / 0 / 0 / | / 0 / 0 / 0 / 0 / |

ALL DETERMINATION: ERASE END UPON PASS

FIG. 43

SL/DL CIRCUIT LATCH DATA

| WRITE DATA | UPPER DATA I/O4 | LOWER DATA I/O0 | UPON SELECTION OF LEFT MAT | | | | UPON SELECTION OF RIGHT MAT | | | |
|---|---|---|---|---|---|---|---|---|---|---|
| | | | DLL | SL | DLR | | DLL | SL | DLR | |
| "01" | 0 | 1 | 1 | 0 | 1 | | 1 | 0 | 1 | |
| "00" | 0 | 0 | 1 | 1 | 0 | | 0 | 1 | 1 | |
| "10" | 1 | 0 | 0 | 1 | 1 | | 1 | 1 | 0 | |
| "11" | 1 | 1 | 1 | 1 | 1 | | 1 | 1 | 1 | |

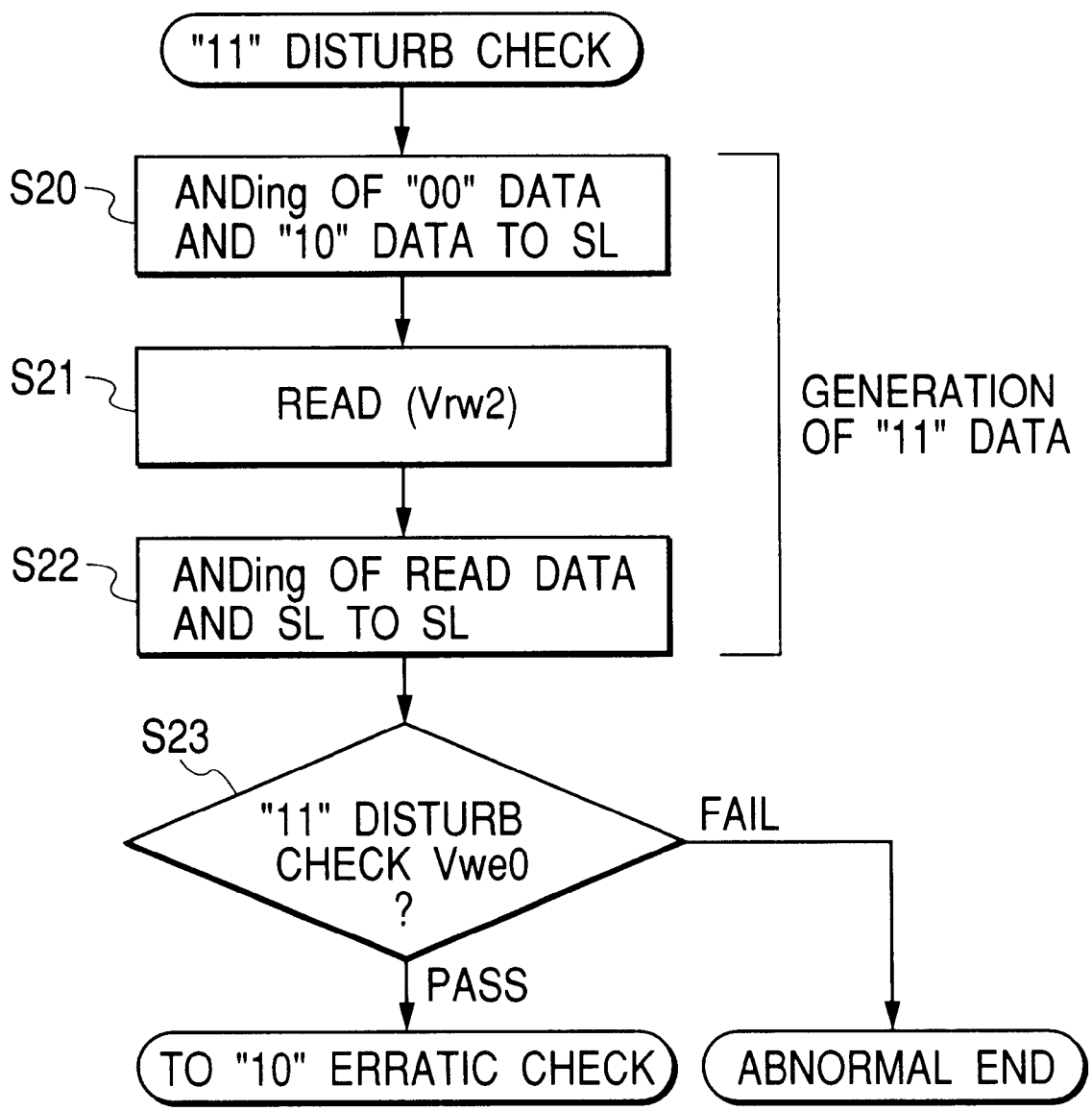

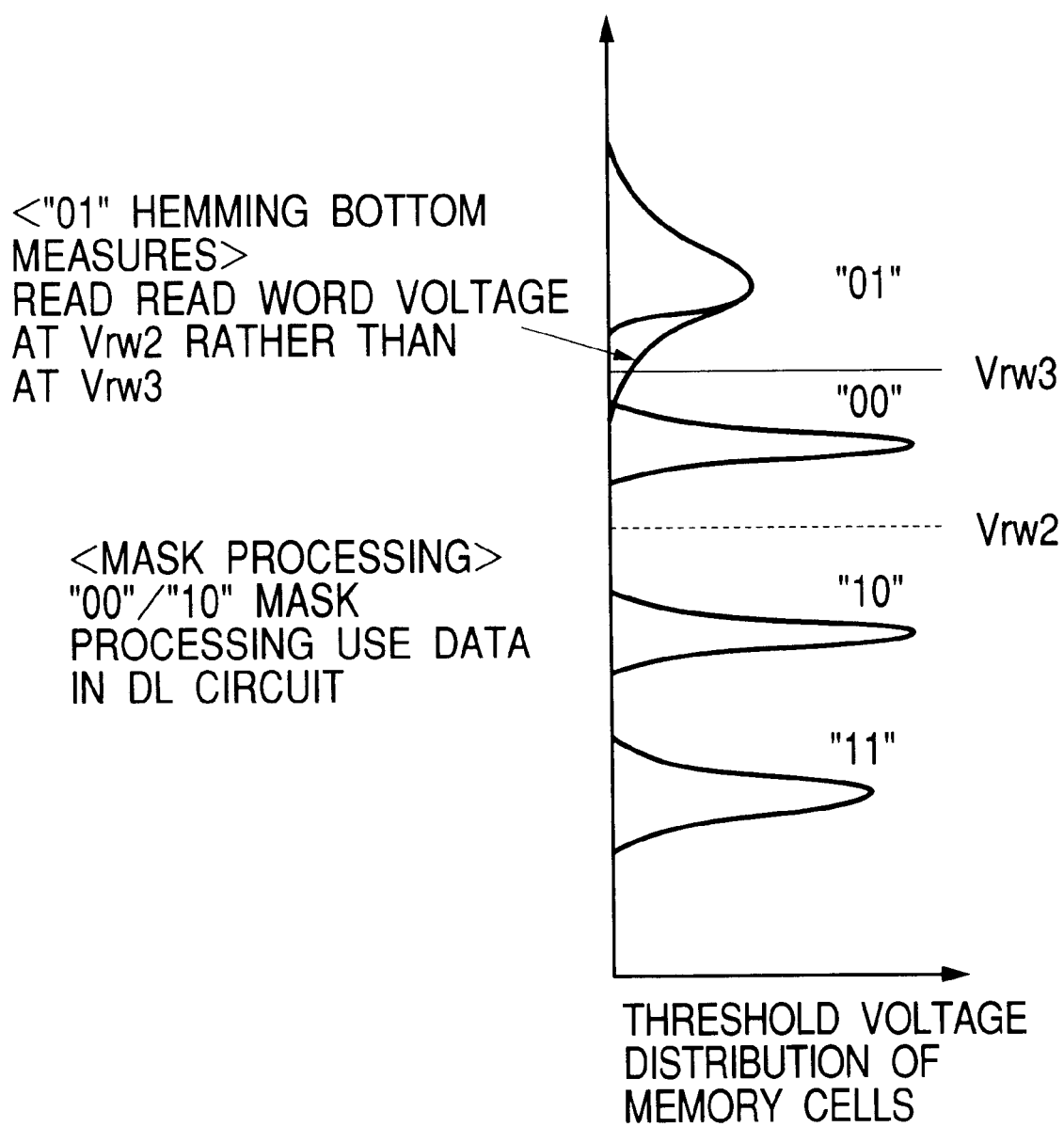

FIG. 48

(4) "11" DISTURB CHECK

| WRITE DATA | STEP 30 SL CLEAR BL(L)/(R) CLEAR | | | | | | STEP 31 BL(R) PRECHARGE BL(L) PRECHARGE | | | | | | STEP 32 DL(R) SELECT DISCHARGE | | | | | | STEP 33 SL SENSE | | | | | |
|---|---|---|---|---|---|---|---|---|---|---|---|---|---|---|---|---|---|---|---|---|---|---|---|---|
| | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| "01" | 0 | 0 | 0 | 0 | 0 | 1 | 0 | 0.5 | 0 | 0 | 1 | 1 | 0 | 0.5 | 0 | 0 | 0 | 1 | 0 | 1 | 1 | 0 | 0 | 1 |
| "00" | 1 | 0 | 0 | 0 | 0 | 1 | 1 | 0.5 | 0 | 0 | 1 | 1 | 1 | 0.5 | 0 | 0 | 0 | 1 | 1 | 1 | 1 | 0 | 0 | 1 |
| "10" | 0 | 0 | 0 | 0 | 0 | 0 | 0 | 0.5 | 0 | 0 | 1 | 0 | 0 | 0.5 | 0 | 0 | 1 | 0 | 0 | 0 | 0 | 1 | 1 | 0 |
| "11" | 0 | 0 | 0 | 0 | 0 | 1 | 0 | 0.5 | 0 | 0 | 1 | 1 | 0 | 0.5 | 0 | 0 | 0 | 1 | 0 | 1 | 1 | 0 | 0 | 1 |

| STEP 34 DL(L) SELECT DISCHARGE BL(R) DISCHARGE | | | | | | STEP 35 BL(R) PRECHARGE | | | | | | STEP 36 SL CLEAR SL SENSE | | | | | | STEP 37 BL(L)/(R) DISCHARGE | | | | | |
|---|---|---|---|---|---|---|---|---|---|---|---|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| 0 | 1 | 1 | 0 | 0 | 1 | 0 | 1 | 1 | 0 | 0.5 | 1 | 0 | 1 | 1 | 0 | 0 | 1 | 0 | 0 | 1 | 0 | 0 | 1 |
| 1 | 0 | 1 | 0 | 0 | 1 | 1 | 0 | 1 | 0 | 0.5 | 1 | 1 | 0 | 0 | 1 | 1 | 1 | 1 | 0 | 0 | 1 | 0 | 1 |
| 0 | 0 | 0 | 1 | 0 | 0 | 0 | 0 | 0 | 1 | 0.5 | 0 | 0 | 0 | 0 | 1 | 1 | 0 | 0 | 0 | 0 | 1 | 0 | 0 |
| 0 | 1 | 1 | 0 | 0 | 1 | 0 | 1 | 1 | 0 | 0.5 | 1 | 0 | 1 | 1 | 0 | 0 | 1 | 0 | 0 | 1 | 0 | 0 | 1 |

| STEP 38 BL(L)/(R) PRECHARGE | | | | | | STEP 39 MEMORY DISCHARGE (Vrw2) | | | | | | STEP 40 BL(R) SELECT PRECHARGE | | | | | | STEP 41 SL SENSE | | | | | |
|---|---|---|---|---|---|---|---|---|---|---|---|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| 0 | 0.5 | 1 | 0 | 1 | 1 | 0 | 0.5 | 1 | 0 | 1 | 1 | 0 | 0.5 | 1 | 0 | 1 | 1 | 0 | 0 | 1 | 1 | 1 | 1 |
| 1 | 0.5 | 0 | 1 | 1 | 1 | 1 | 0.5 | 0 | 1 | 1 | 1 | 1 | 0.5 | 0 | 1 | 1 | 1 | 1 | 0 | 0 | 1 | 1 | 1 |
| 0 | 0.5 | 0 | 1 | 1 | 0 | 0 | 0.5 | 0 | 1 | 0 | 0 | 0 | 0.5 | 0 | 1 | 1 | 0 | 0 | 0 | 0 | 1 | 1 | 0 |
| 0 | 0.5 | 1 | 0 | 1 | 1 | 0 | 0.5 | 1 | 0 | 0 | 1 | 0 | 0.5 | 1 | 0 | 0 | 1 | 0 | 1 | 1 | 0 | 0 | 1 |

| STEP 42 BL(L)/(R) DISCHARGE BL(L)/(R) PRECHARGE | | | | | | STEP 43 BL(R) SELECT DISCHARGE | | | | | | STEP 44 MEMORY DISCHARGE (Vwe0) | | | | | | STEP 45 SL SENSE ALL DETERMINATION | | | | | |
|---|---|---|---|---|---|---|---|---|---|---|---|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| 0 | 0.5 | 0 | 1 | 1 | 1 | 0 | 0.5 | 0 | 1 | 0 | 1 | 0 | 0.5 | 0 | 1 | 0 | 1 | 0 | 1 | 1 | 0 | 0 | 1 |
| 1 | 0.5 | 0 | 1 | 1 | 1 | 1 | 0.5 | 0 | 1 | 0 | 1 | 1 | 0.5 | 0 | 1 | 0 | 1 | 1 | 1 | 1 | 0 | 0 | 1 |
| 0 | 0.5 | 0 | 1 | 1 | 0 | 0 | 0.5 | 0 | 1 | 0 | 0 | 0 | 0.5 | 0 | 1 | 0 | 0 | 0 | 0 | 0 | 1 | 1 | 0 |
| 0 | 0.5 | 1 | 0 | 1 | 1 | 0 | 0.5 | 1 | 0 | 1 | 1 | 0 | 0.5 | 1 | 0 | 0 | 1 | 0 | 1 | 1 | 0 | 0 | 1 |

▲ IN THE CASE OF PASS

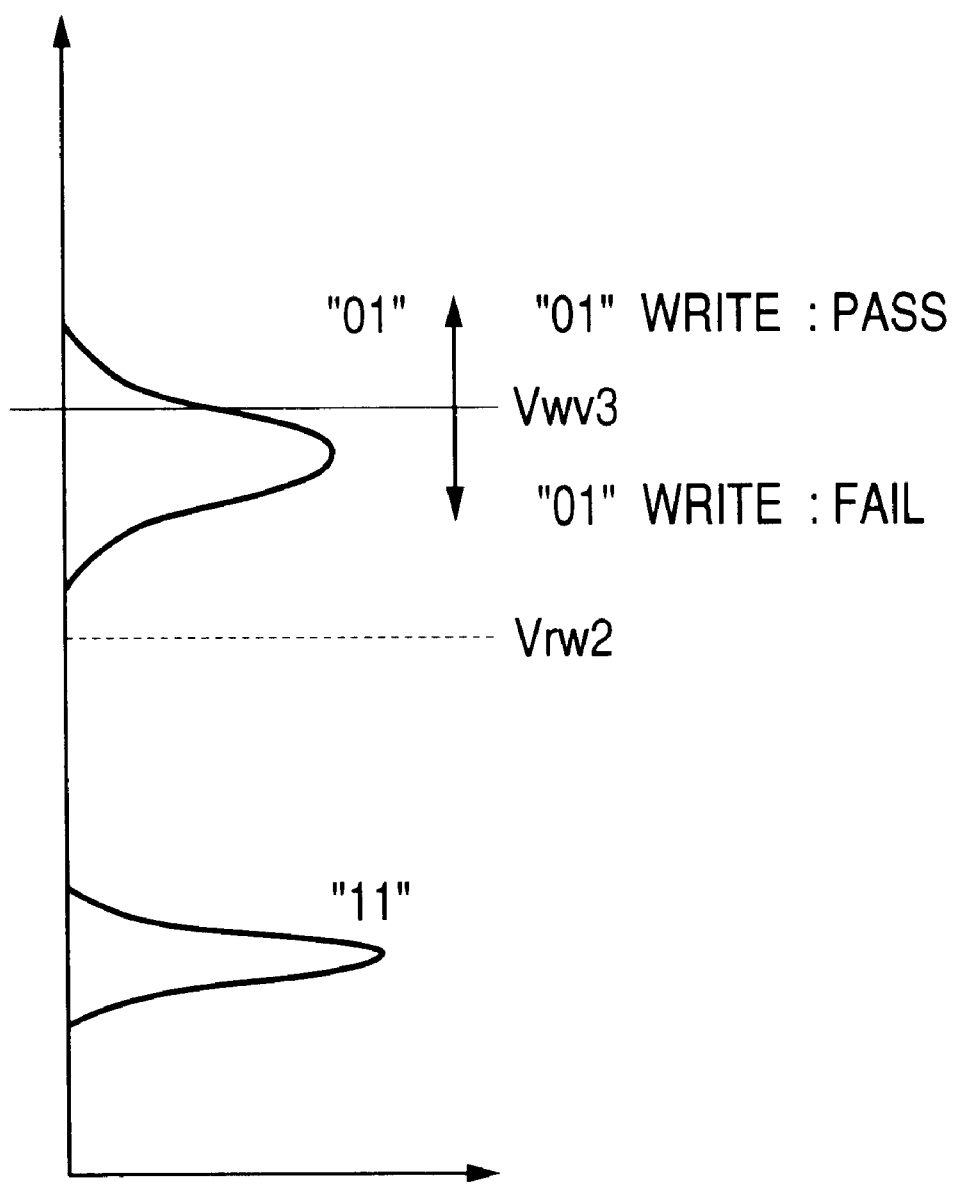

(PROGRAM RETRY)

FIG. 51

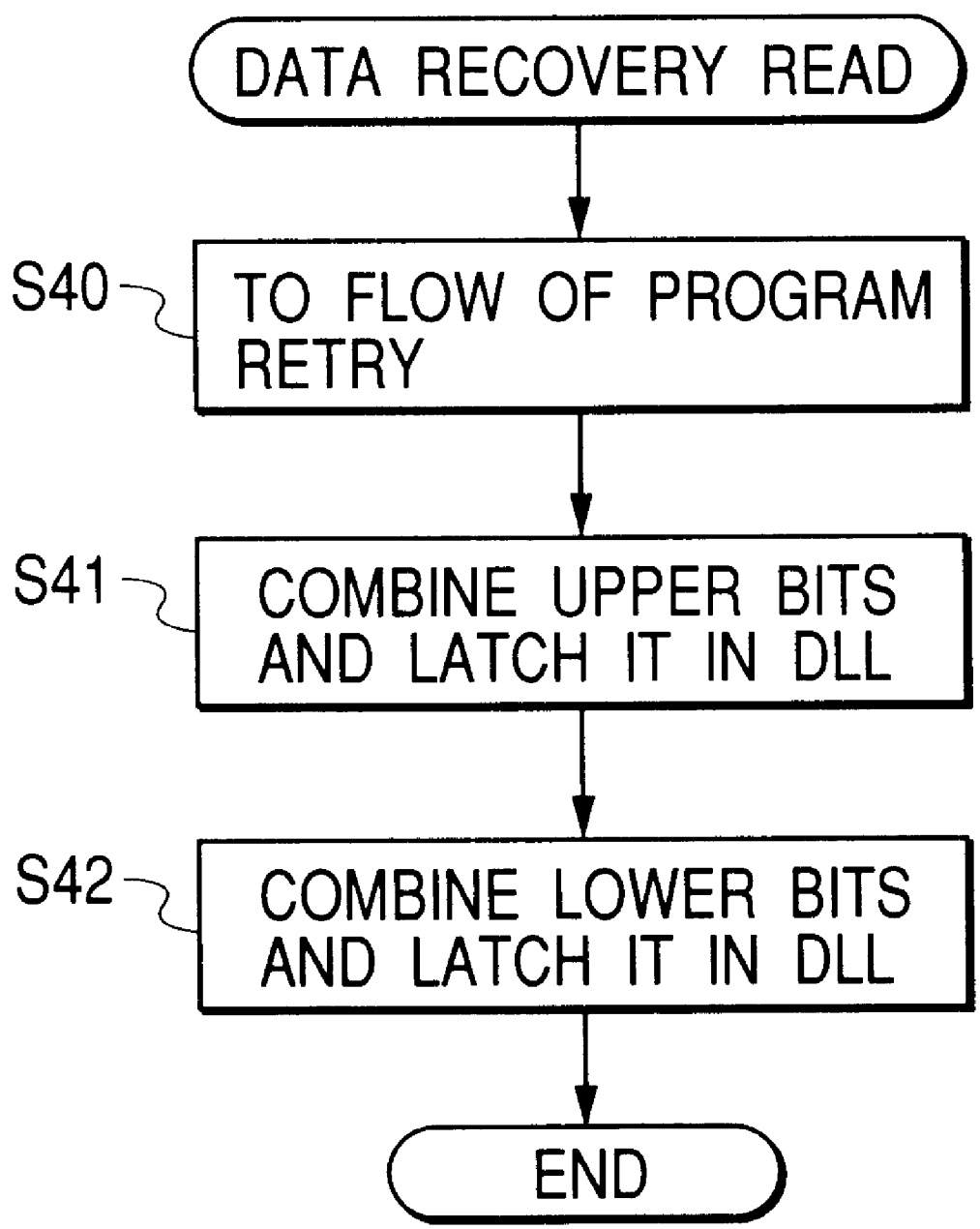

FIG. 54

(DATA RECOVERY READ)

DATA LATCH PROCESSING (COMBINATION OF UPPER BITS)

| WRITE DATA | STEP 0 INITIAL DATA | | | | | | STEP 1 BL(L) PRECHARGE | | | | | | STEP 2 BL(L) SELECT DISCHARGE DL(L) | | | | | | STEP 3 BL(L) SELECT DISCHARGE SL(L) | | | | | |
|---|---|---|---|---|---|---|---|---|---|---|---|---|---|---|---|---|---|---|---|---|---|---|---|---|
| | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| "01" | 0 | | 0 | | | 1 | 0 | 1.2 | 1 | 0 | | 1 | 0 | 1.2 | 1 | 0 | | 1 | 0 | | 1 | 0 | | 1 |
| "00" | 1 | | 1 | | | 1 | 1 | 1.2 | 0 | 1 | | 1 | 1 | 0 | 0 | 1 | | 1 | 1 | 0 | 0 | 1 | | 1 |
| "10" | 0 | | 1 | | | 0 | 0 | 1.2 | 0 | 1 | | 0 | 0 | 1.2 | 0 | 1 | | 0 | 0 | 1.2 | 0 | 1 | | 0 |
| "11" | 0 | | 1 | | | 1 | 0 | 1.2 | 0 | 1 | | 1 | 0 | 1.2 | 0 | 1 | | 1 | 0 | 1.2 | 0 | 1 | | 1 |

▲ AFTER COMPLETION OF PROGRAM RETRY DATA LATCH

| STEP 4 DL(L) CLEAR DL(L) SENSE | | | | | | STEP 5 BL(L) DISCHARGE | | | | | |
|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) |
| 0 | 0 | 1 | 0 | | 1 | 0 | 0 | 1 | 0 | | 1 |
| 0 | 0 | 0 | 1 | | 1 | 0 | 0 | 0 | 1 | | 1 |
| 1 | 2 | 0 | 1 | | 0 | 1 | 0 | 0 | 1 | | 0 |
| 1 | 2 | 0 | 1 | | 1 | 1 | 0 | 0 | 1 | | 1 |

▲ DETERMINATION OF UPPER BIT (COMBINATION OF LOWER BITS)

| STEP 6 BL(L) SELECT PRECHARGE DL(L) & SL(L) | | | | | | STEP 7 BL(R) PRECHARGE | | | | | | STEP 8 SL CLEAR SL SENSE | | | | | | STEP 9 BL(L)/(R) DISCHARGE | | | | | |
|---|---|---|---|---|---|---|---|---|---|---|---|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| 0 | 0.7 | 1 | 0 | | 1 | 0 | 0.7 | 1 | 0 | 0.4 | 1 | 0 | 0.7 | 0.7 | 0 | 0 | 1 | 0 | 0 | 1 | 0 | 0 | 1 |
| 0 | 0 | 0 | 1 | | 1 | 0 | 0 | 0 | 1 | 0.4 | 1 | 0 | 0 | 0 | 0.4 | 0.4 | 1 | 0 | 0 | 0 | 1 | 0 | 1 |
| 1 | 0.7 | 0 | 1 | | 0 | 1 | 0.7 | 0 | 1 | 0.4 | 0 | 1 | 0.7 | 0.7 | 0 | 0 | 0 | 1 | 0 | 1 | 0 | 0 | 0 |
| 1 | 0.7 | 0 | 1 | | 1 | 1 | 0.7 | 0 | 1 | 0.4 | 1 | 1 | 0.7 | 0.7 | 0 | 0 | 1 | 1 | 0 | 1 | 0 | 0 | 1 |

| STEP 10 BL(R) PRECHARGE | | | | | | STEP 11 BL(R) SELECT DISCHARGE DL(R) | | | | | | STEP 12 BL(R) SELECT PRECHARGE SL(R) | | | | | | STEP 13 DL(R) CLEAR DL(R) SENSE | | | | | |
|---|---|---|---|---|---|---|---|---|---|---|---|---|---|---|---|---|---|---|---|---|---|---|---|
| DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) | DL(L) | BL(L) | SL(L) | SL(R) | BL(R) | DL(R) |
| 0 | 0 | 1 | 0 | 1.2 | 1 | 0 | 0 | 1 | 0 | 0 | 1 | 0 | 0 | 1 | 0 | 0 | 1 | 0 | 0 | 1 | 0 | 0 | 0 |
| 0 | 0 | 0 | 1 | 1.2 | 1 | 0 | 0 | 0 | 1 | 0 | 1 | 0 | 0 | 0 | 1 | 1.2 | 1 | 0 | 0 | 0 | 1 | 1.2 | 1 |
| 1 | 0 | 1 | 0 | 1.2 | 0 | 1 | 0 | 1 | 0 | 1.2 | 0 | 1 | 0 | 1 | 0 | 1.2 | 0 | 1 | 0 | 1 | 0 | 1.2 | 0 |
| 1 | 0 | 1 | 0 | 1.2 | 1 | 1 | 0 | 1 | 0 | 0 | 1 | 1 | 0 | 1 | 0 | 0 | 1 | 1 | 0 | 1 | 0 | 0 | 0 |

▲ DETERMINATION OF LOWER BIT

SEMICONDUCTOR DEVICE AND DATA PROCESSING SYSTEM

BACKGROUND OF THE INVENTION

The present invention relates to a semiconductor device such as a flash memory capable of setting a threshold voltage corresponding to multi-value information of 2 bits or more to one electrically rewritable non-volatile memory cell, and further a data processing system using the semiconductor device and a memory card.

An electrically rewritable or programmable flash memory has memory cell transistors each having, for example, a floating gate (flotage gate), a control gate, a source and a drain. When electrons are injected into the floating gate of the memory cell transistor, the memory cell transistor rises in threshold voltage. On the other hand, when the electrons are extracted or drawn from the floating gate, the threshold voltage thereof is reduced. The memory cell transistor serves so as to store information corresponding to the magnitude or high and low levels of a threshold voltage relative to a word line voltage (voltage applied to control gate) for reading data. Although not restricted in particular, the state in which the threshold voltage of the memory cell transistor is low, is called an "erase state", and the state in which the threshold voltage thereof is high, is called a "write state".

If one state is capable of being selected from, for example, an erase state and first through third write states respectively different in threshold voltage from the erase state, then four-value information can be stored in one memory cell transistor.

The present applicant has previously filed a multi-valued flash memory wherein four-value information can be stored in one nonvolatile memory cell transistor (see Unexamined Patent Publication No. Sho 11(1999)-345494 (U.S. Pat. No. 6,078,519) and Unexamined Patent Publication No. Sho 11(1999)-232886 (U.S. Pat. No. 6,046,936)). According to this, assuming that an erase operation is performed before a write operation, the storage of four-value information can be performed by determining whether all the first through third write states are unselected or any write state is selected. A write operation therefor needs write control information for determining whether write voltage applying operations for individually obtaining the first through third write states should be selected. In order to hold such write control information, a sense latch connected to each bit line is used.

The sense latch comprises a static latch, for example. One ends of bit lines are respectively connected to a pair of differential input/output terminals of the sense latch. Data latches are connected to the other ends of the bit lines. The drain of the memory cell transistor is connected to its corresponding bit line. When writing is supposed in units of word lines to which control gates are commonly connected, a distinction between selection and non-selection of the application of a write voltage to each memory cell can be made by an increase or decrease in drain voltage. In this case, the sense latch latches therein data corresponding to the selection and unselection of the application of the write voltage. This latched data corresponds to the write control information. When, for example, the sense latch latches a logic value "0" therein, the corresponding bit line is brought to a ground voltage and hence the write voltage is applied to the corresponding memory cell. When the sense latch latches a logic value "1" therein, the bit line is brought to a source voltage so that the application of a write voltage to the corresponding memory cell is inhibited.

In order to produce such write control information, 2 bits of write data are latched in the corresponding pair of data latches every memory cells intended for writing in the preceding application. The held 2-bit write data indicate whether the corresponding one memory cell is allowed to hold an erase state or caused to select any of the first through third write states. Whether it means any state, is analyzed by a logic combining circuit on its corresponding bit line. This analyzing process is carried out in accordance with the application of a write voltage to the first through third write states and a verify process. Further, write control information for allowing the sense latch to select the write-voltage application in required timing is set (data latch processing). When the write-voltage application is selected according to the write control information latched in the sense latch, the write voltage is stepwise applied in parts plural times, and a verify operation for determining whether it has reached an intended threshold voltage, is carried out for each write-voltage application. In the verify operation, data reading is effected on each memory cell intended for writing at a word line select level corresponding to an intended threshold voltage. Until the intended threshold voltage is reached, the corresponding bit line is discharged for each read operation. When the intended threshold voltage is reached, the bit line is maintained at a precharge level upon the read operation. This state inversion inverts the data latched in the sense latch and subsequently to it, the application of the write voltage is regarded as unselected.

SUMMARY OF THE INVENTION

However, in order to set the write control information to the sense latch, operations such as precharge, discharge and internal transfer, etc. must be repeatedly effected on the write data of the latches by using the logic combining circuits on the bit line to analyze the write data. It has been clarified that time is required to no small extent for this purpose and a write operating time becomes long.

Therefore, the present inventors have discussed means that makes it unnecessary to generate write control information by the logic combining circuits on the bit line. Even in such a case, however, data latched in a sense latch is subjected to logic-value inversion according to the completion of writing upon a write verify operation. In short, write control information for the sense latch changes as a write/write verify operation proceeds. Thus, when the data initially latched in the sense latch is required to check whether an upper limit of a threshold voltage distribution subsequent to the formation of a memory threshold distribution with the formation of a write voltage for each memory cell is distinguishable from a threshold voltage distribution placed thereabove, it is necessary to take into consideration even the restoration of the initially latched data. This situation is similar even in the case where a write operation is retried in response to the generation of write abnormality and in the case of a recovery read for returning write data sent from outside to a host system in response to write abnormality.

An object of the present invention is to provide a semiconductor device capable of shortening a processing time required to set write control information to a sense latch to thereby achieve an improvement in the efficiency of a write operation.

Another object of the present invention is to provide a semiconductor device capable of, even if initially-latched write control information is lost in the course of a write/write verify operation, restoring it and assuring an upper-limit check for a threshold voltage distribution, write retry and recovery read.

A further object of the present invention is to provide a data processing system capable of improving the efficiency of data processing with access to each nonvolatile memory cell.

The above, other objects, and novel features of the present invention will become apparent from the description of the present specification and the accompanying drawings.

Summaries of typical ones of the inventions disclosed in the present application will be described in brief as follows
<<Input Decode of Write Data>>

A semiconductor device such as a multi-value flash memory, which allows one electrically erasable and programmable nonvolatile memory cell to store multi-valued information therein, includes a sense latch (SL) having a pair of input/output terminals, bit lines (G-BLR, G-BLL) provided in association with the respective input/output terminals of the sense latch, a plurality of nonvolatile memory cells (MC) selectively connected to the bit lines and capable of electrically performing erasure and writing, data latches (DLR, DLL) respectively connected to the bit lines, a first logic combining circuit (200) connected to the data latches and the sense latch, and a control circuit (18) connected to the sense latch, the data latches and the first logic combining circuit. The first logic combining circuit generates control data used to define to which threshold voltage state a threshold voltage state of one nonvolatile memory cell is set, every plural bits of write data and to supply the generated data to the corresponding sense latch and data latches respectively on a parallel basis. The control circuit is capable of performing program control so as to control the operations of the sense latch, the data latches and the first logic combining circuit to thereby bring each volatile memory cell to a predetermined threshold voltage state according to a logic value of the control data supplied from the first logic combining circuit to the sense latch and successively bring volatile memory cells to predetermined threshold voltage states according to logic values of control data supplied from the data latches to the sense latch.

Attention will be focused on a specific configuration wherein each of memory cells for performing four-value information storage is specialized. A semiconductor device such as a flash memory or a microcomputer in which a flash memory is on-chipped together with a CPU (Central Processing Unit), includes a first latch (SL) having a pair of input/output nodes, a first bit line (G-BLR) connected to one input/output node of the first latch and connected with a plurality of electrically rewritable nonvolatile memory cells MC), a second bit line (G-BLR) connected to the other input/output node of the first latch and connected with a plurality of electrically rewritable nonvolatile memory cells, a second latch (DLR) connected to the first bit line, a third latch (DLL) connected to the second bit line, a first logic combining circuit (200) connected to the first through third latches, a second logic combining circuit (30L, 31L) connected to the first bit line, a third logic combining circuit (30L, 31L) connected to the second bit line, and a control circuit (18) connected to the first through third latches and the first through third logic combining circuits. The first logic combining circuit generates control data used to define to which of first through third threshold voltage states (e.g., first through third write states) one nonvolatile memory cell is set with respect to a fourth threshold voltage state (e.g., erase state) and to supply the generated data to the corresponding first through third latches. The control circuit is capable of performing program control so as to control the operations of the first through third latches and the first through third logic combining circuits to thereby bring each volatile memory cell to a first threshold voltage state according to a logic value of the control data supplied from the first logic combining circuit to the first latch, bring each volatile memory cell to a second threshold voltage state according to a logic value of the control data supplied from the second latch to the first latch, and bring each volatile memory cell to a third threshold voltage state according to a logic value of the control data supplied from the third latch to the first latch.

Decoding the write data by means of the first logic combining circuit like a decoder upon data input in this way allows a reduction in processing time required to perform data latch processing which has heretofore been carried out by the data latches, sense latch and logic combining circuits on each bit line.

As a detailed aspect of the program control, the control circuit determines whether the threshold voltage state of the corresponding nonvolatile memory cell has reached an intended threshold voltage state through the use of the second and third logic combining circuits each time a voltage is applied for varying the threshold voltage of each nonvolatile memory cell in response to the predetermined logic value of the control data supplied to the first latch under the program control, and inverts the logic value of the control data of the first latch when the threshold voltage state thereof is found to have reached the intended threshold voltage state and subsequently suppresses a change in threshold voltage state with respect to the corresponding nonvolatile memory cell. As the program operation proceeds according to the write/verify operation, the respective control data initially latched in the first latch will gradually disappear.

<<Disturb/erratic-Check>>

The verify operation results in a check for the lower limit of the intended threshold voltage distribution. In order to check for the upper limit of the intended threshold voltage distribution, the control circuit is capable of performing disturb check control for determining under the program control whether the threshold voltage state of the nonvolatile memory cell to be maintained at the fourth threshold voltage state is distinguishable from an adjacent threshold voltage state (third threshold voltage state) higher than that in threshold voltage, first erratic check control for determining under the program control whether a threshold voltage state of a nonvolatile memory cell, which is to be changed to the adjacent threshold voltage state (third threshold voltage state), is distinguishable from a further adjacent threshold voltage state (second threshold voltage state) higher than that in threshold voltage, and second erratic check control for determining under the program control whether a threshold voltage state of a nonvolatile memory cell, which is to be changed to the further adjacent threshold voltage state (second threshold voltage state), is distinguishable from a still further adjacent threshold voltage state (first threshold voltage state) higher than that in threshold voltage.

For example, the disturb check control is a process for allowing the control circuit to determine through the use of the second and third logic combining circuits whether each memory cell should be maintained at the fourth threshold voltage state, based on the control data held in the second and third latches and data read from the corresponding memory cell, and for allowing the control circuit to set control data having a predetermined logic value prior to the logic value inversion to the first latch only with respect to the memory cell to be held in the fourth threshold voltage state thereby to determine whether the threshold voltage state of the memory cell is distinguishable from the adjacent threshold voltage state higher than that in threshold voltage.

For example, the first erratic check control is a process for allowing the control circuit to transfer the control data held in a predetermined one of the second latch and the third latch to the first latch through the use of the second and third logic combining circuits thereby to determine whether the threshold voltage state of the memory cell is distinguishable from the further adjacent threshold voltage state higher than that in threshold voltage. For example, the second erratic check control is a process for allowing the control circuit to transfer the control data held in the predetermined other of the second latch and the third latch to the first latch through the use of the second and third logic combining circuits thereby to determine whether the threshold voltage state of the memory cell is distinguishable from the further adjacent threshold voltage state higher than that in threshold voltage.

<<Program Retry>>

Upon the disturb check control, the first erratic check control or the second erratic check control, the control circuit may perform a program try as handling for the detection of abnormality. For example, when a state undistinguishable from a predetermined threshold voltage state is detected upon the disturb check control, the first erratic check control or the second erratic check control, the control circuit restores the control data sent from the first logic combining circuit to the first latch related to a memory cell, based on the control data held in the second and third latches and data read from the memory cell through the use of the second and third logic combining circuits, thereby allowing the resumption of the program process.

When the program process is resumed, each nonvolatile memory cell intended for the program process is the same as the immediately preceding program process. In short, a write retry is carried out inside the semiconductor device.

When the program process is resumed, each nonvolatile memory cell intended for the program process is newly specified. In short, it is designated by a new write sector address or the like supplied together with a retry command sent from outside a semiconductor device such as a host device.

<<Date Recovery>>

Upon the disturb check control, the first erratic check control or the second erratic check control, the control circuit may perform a data recovery as handling for the detection of abnormality. For example, when a state undistinguishable from a predetermined threshold voltage state is detected upon the disturb check control, the first erratic check control or the second erratic check control, the control circuit restores the control data sent from the first logic combining circuit to the first latch related to a memory cell, based on the control data held in the second and third latches and data read from the memory cell through the use of the second and third logic combining circuits, and restores write data represented in 2-bit units, based on the restored latched data of the first latch circuit and the latched data of the second and third latches, thereby allowing the output of the restored write data to the outside through the second and third latches.

<<Data Processing System>>

A data processing system is configured so as to include the semiconductor device, a memory controller which access-controls the semiconductor device, and a processor which controls the memory controller. A memory card comprises a card substrate including the semiconductor device, a memory controller which access-controls the semiconductor device, and an external interface circuit connected to the memory controller, all of which are packaged thereon. The present data processing system is capable of improving the efficiency of data processing with access to each nonvolatile memory cell.

BRIEF DESCRIPTION OF THE DRAWINGS

FIG. 5 is an explanatory view depicting one example of the correspondence between the contents of respective bits of status registers and input/output terminals I/O0 through I/O7;

FIG. 12 is an explanatory view collectively showing various voltage conditions set every operating modes of the flash memory;

FIG. 19 is a flowchart illustrating one example of an erase operation;

FIG. 21 is an explanatory view logically showing one example of the contents of operation of a data latch process included in the write operation or the like;

FIG. 22 is an explanatory view illustrating logic values of results of operations effected on logic values of data bits A and B where the arithmetic logic shown in FIG. 21 is adopted;

FIG. 24 is an explanatory view illustrating the contents of write data for lower and upper bits obtained by logic combining processes included in an additional write operation, in the form of logical expressions;

FIG. 26 is an explanatory view showing a read operation of the flash memory in detail;

FIG. 27 is an explanatory view depicting a "01" write operation in detail;

FIG. 28 is an explanatory view showing a "0" write operation in detail;

FIG. 29 is an explanatory view illustrating a "10" write operation in detail;

FIG. 30 is an explanatory view showing a "11" word disturb detecting process in detail;

FIG. 31 is an explanatory view depicting a "10" erratic detecting process in detail;

FIG. 32 is an explanatory view showing a "00" erratic detecting process in detail;

FIG. 33 is an explanatory view illustrating an additional write lower-bit combining process in detail;

FIG. 35 is an explanatory view showing the details of an erase operation;

FIG. 43 is an explanatory view illustrating the logic of generation of control data by a decoder circuit;

FIG. 46 is a flowchart illustrating an operating procedure for performing a 11 disturb check;

FIG. 47 is a diagram for describing a word line voltage at a read operation in Step S21 of FIG. 46;

FIG. 48 is an explanatory view illustrating the details of operations at the 11 disturb check according to the flowchart of FIG. 46;

FIG. 49 is a threshold voltage distribution explanatory view of memory cells, which shows the state in which a "01" write completion memory cell and a "01" write non-completion memory cell exist in mixed form at an abnormal end during "01" writing;

FIG. 51 is an explanatory view showing the former half of the data restoration processing procedure for the program retry according to the flowchart of FIG. 50;

FIG. 53 is a flowchart illustrating, as an example, a procedure for processing a data recovery read operation;

FIG. 54 is an explanatory view illustrating, as an example, the details of a write data restoring process.

DETAILED DESCRIPTION OF THE INVENTION

[Embodiment 1]

A description will first be made of a flash memory (Unexamined Patent Publication No. Hei 11 (1999)-345494) to which a technology for making it easy to understand the present invention, which latches write control information in a sense latch according to data latch processing using a logic combination circuit on each bit line, is applied.

<<Overall Configuration of Flash Memory>>

Figure 2:
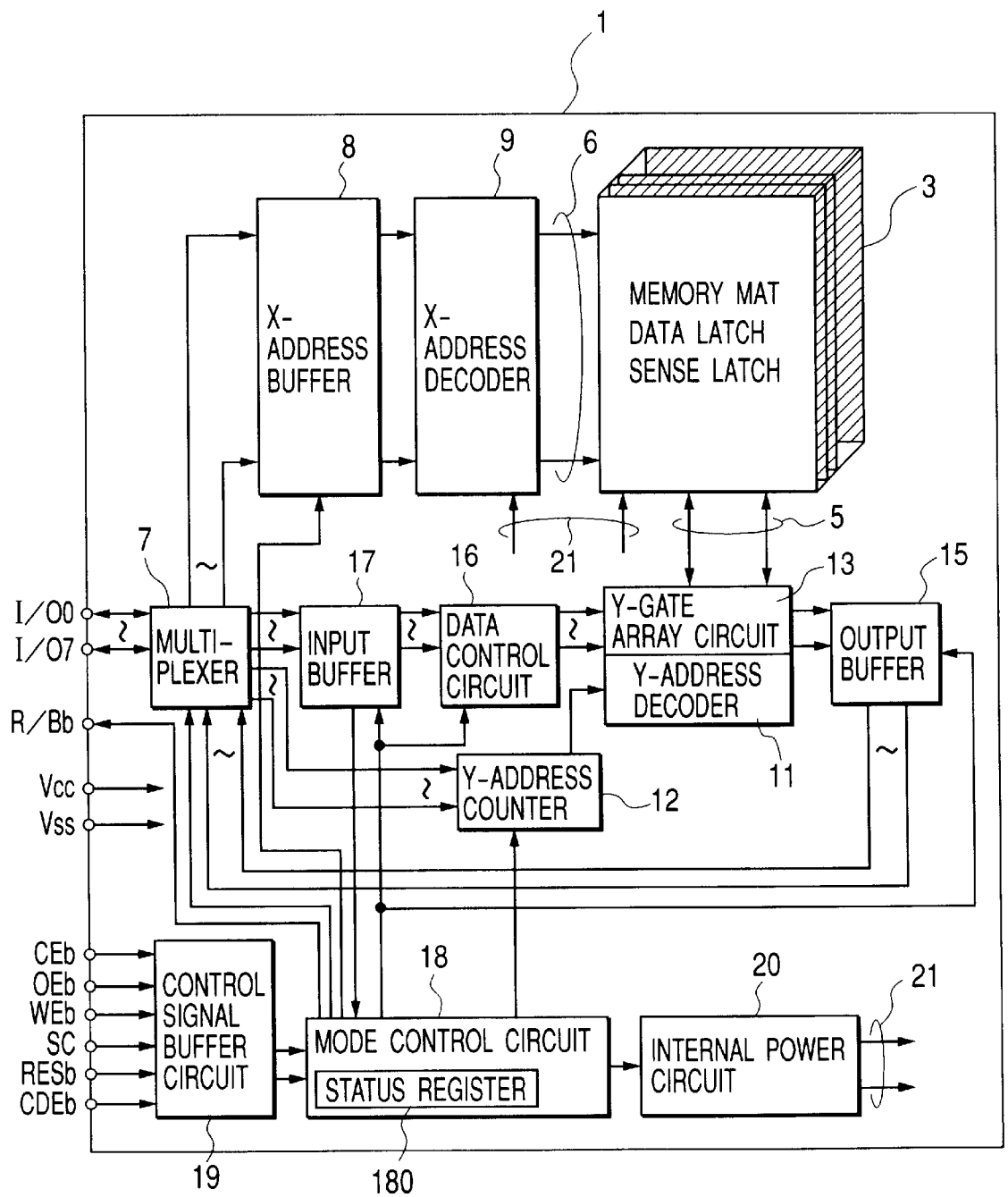
FIG. 2 is a block diagram illustrating an overall configuration of the four-value flash memory according to the prior art of the present invention.

An overall circuit block of a flash memory 1 is shown in FIG. 2. The flash memory 1 shown in the same drawing is configured as a four-value flash memory which stores 2-bit information in one memory cell.

Figures 3, 4:
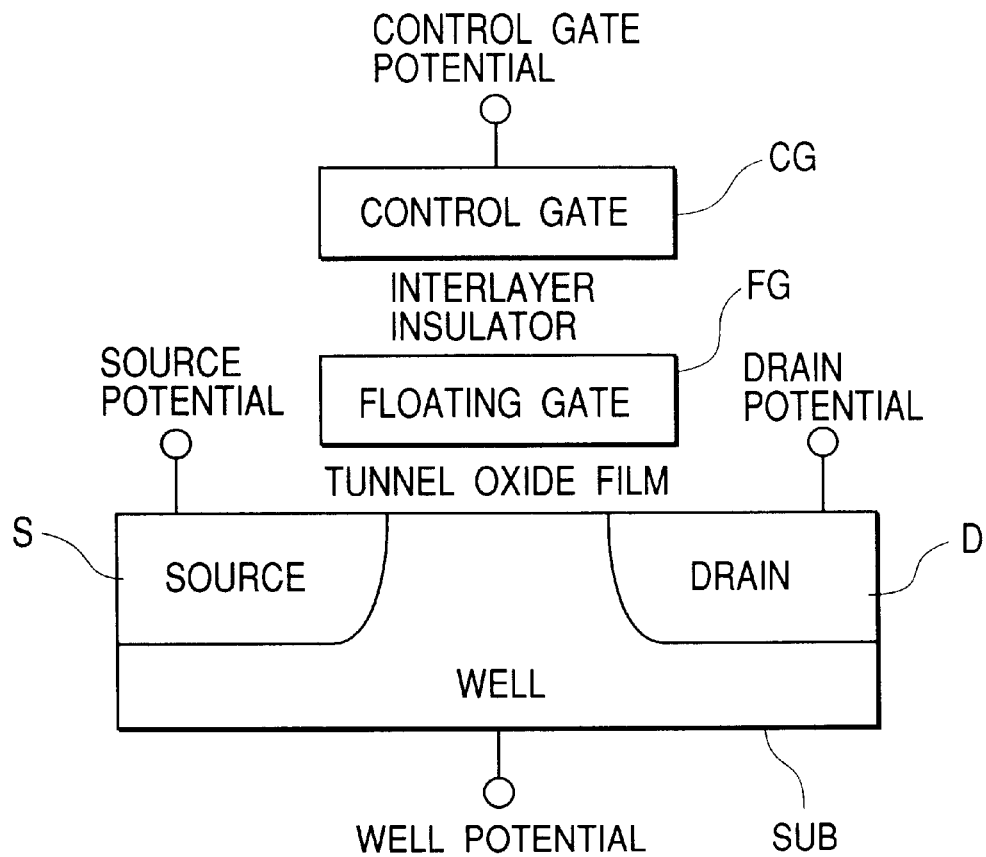
FIG. 3 is a vertical cross-sectional view schematically illustrating a device structure of a memory cell transistor for the flash memory.
FIG. 4 is an explanatory view showing one example illustrative of each command for the flash memory.

In the same drawing, each of memory arrays 3 has a memory mat, a data latch and a sense latch. The memory mat has a large number of electrically erasable and programmable nonvolatile memory cell transistors. The memory cell transistor (also described as "flash memory cell") comprises a source S and a drain D formed within a semiconductor substrate or a well SUB, a floating gate FG formed in a channel region between the source S and the drain D with a tunnel oxide film interposed therebetween, and a control gate CG laminated on the floating gate FG with an interlayer insulating film interposed therebetween, as illustrated in FIG. 3 by way of example. The control gate CG is connected to its corresponding word line 6, the drain D is connected to its corresponding bit line 5, and the source S is electrically connected to its corresponding unillustrated source line.

External input/output terminals I/O0 through I/O7 of the flash memory 1 share the use of address input terminals, data input terminals, data output terminals and command input terminals. X address signals inputted from the external output terminals I/O0 through I/O7 are supplied to an X-address buffer 8 via a multiplexer 7. The X-address decoder 9 decodes an internal complementary address signal outputted from the X-address buffer 8 to drive its corresponding word line.

Sense latches (SL) to be described later are provided on the one-end sides of the bit lines 5 respectively, and data latches (DLL and DLR) to be described later are similarly provided at their other ends respectively. The corresponding bit line 5 is selected by a Y-gate array circuit 13, based on a select signal outputted from a Y-address decoder 11. Y-address signals inputted from the external input/output terminals I/O0 through I/O7 are preset to a Y-address counter 12, after which the address signals incremented sequentially with the preset values as starting points are supplied to the Y-address decoder 11.

The corresponding bit line selected by the Y-gate array circuit 13 is made conductive to an input terminal of an output buffer 15 upon a data output operation. Upon a data input operation, it is caused to conduct into an output terminal of a data control circuit 16 via an input buffer 17. The multiplexer 7 controls electrical connections among the output buffer 15, the input buffer 17 and the input/output terminals I/O0 through I/O7. Commands supplied from the input/output terminals I/O0 through I/O7 are supplied to a mode control circuit 18 through the multiplexer 7 and the input buffer 17.

A control signal buffer circuit 19 is supplied with a chip enable signal CEb, an output enable signal OEb, a write enable signal WEb, a serial clock signal SC, a reset signal RESb and a command enable signal CDEb as access control signals. The mode control circuit 18 controls the function of interfacing signals with the outside according to the states of these signals, etc., and controls an internal operation according to each input command. In the case of the input of commands to the input/output terminals I/O0 through I/O7 or the input of data thereto, the signal CDEb is asserted. In the case of the command input, the signal WEb is further asserted and the signal WEb is negated in the case of the data input. In the case of the input of addresses thereto, the signal CDEb is negated and the signal WEb is asserted. Thus, the mode control circuit 18 is capable of drawing distinctions among commands, data and addresses inputted from the external input/output terminals I/O0 through I/O7 in multi-plexed form. The mode control circuit 18 is capable of asserting a ready/busy signal R/Bb and notifying its state to the outside.

An internal power circuit (internal voltage generator) 20 generates operating power supplies 21 set as various internal voltages for write, erase, verify and read, etc. and supplies them to the X-address decoder 9 and the memory cell array 3, etc.

The mode control circuit 18 wholly controls the flash memory 1 according to input commands. The operation of the flash memory 1 is basically determined according to commands. As the commands for the flash memory 1, may be mentioned, read, erase, write and additional write commands illustrated in FIG. 4 by way of example. In the same drawings, each command code is represented in hexadecimal rotation, and symbols H indicate the hexadecimal numerals.

The flash memory 1 has a status register 180 to indicate its internal state. The contents thereof can be read from the input/output terminals I/O0 through I/O7 according to the assertion of the signal OEb. The correspondence between the contents of respective bits for the status register 180 and the input/output terminals I/O0 through I/O7 is illustrated in FIG. 5 by way of example.

Figure 6:
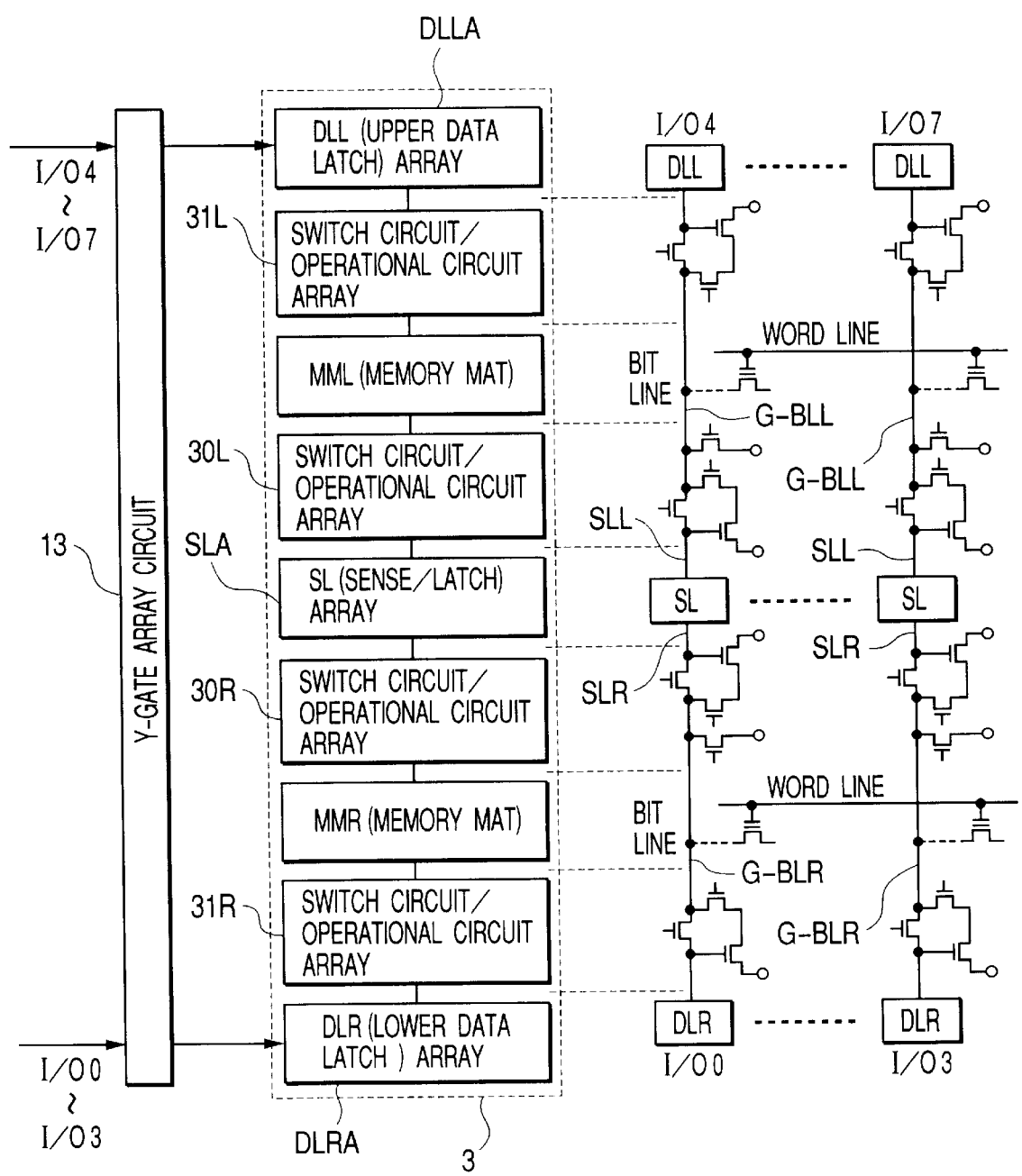
FIG. 6 is an explanatory view showing one example of the relationship of connections among data latches, bit lines and sense latches included in a memory array of the four-value flash memory.
Figures 7, 8:
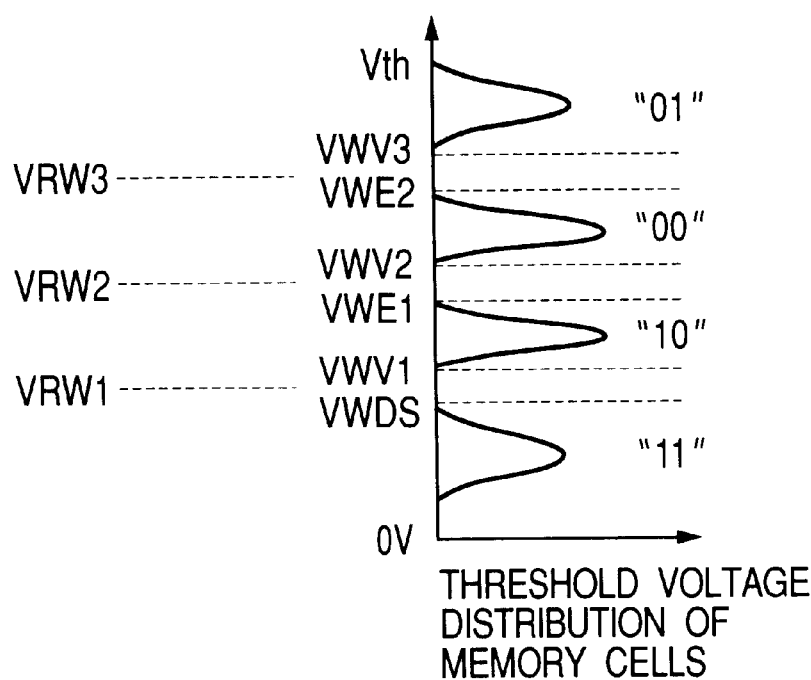
FIG. 7 is an explanatory view illustrating one example of the relationship of correspondence between data latches and input/output terminals I/O4 and I/O0.
FIG. 8 is an explanatory view showing the relationship between four-value data and threshold voltages of memory cell transistors in the form of a threshold-voltage distribution map.

FIG. 6 shows the relationship between data latches and a sense latch included in each of the memory arrays 3. An array SLA for a sense latch SL is placed in the center of the memory array 3, and a switch circuit/operational circuit array 30L, a memory mat MML, a switch circuit/operational circuit array 31L and an array DLLA for an upper data latch DLL are respectively placed on one input/output node SLL side of the sense latch SL. Similarly, a switch circuit/operational circuit array 30R, a memory mat MMR, a switch circuit/operational circuit array 31R, and an array DLRA for a lower data latch DLR are disposed even on the other input/output node SLR side. Further, if attention is focused on a pair of bit lines and its configuration is grasped as shown in FIG. 6, then data latches DLL and DLR are provided at a pair of data input/output nodes SLL and SLR of each static latch type sense latch SL through bit lines G-BLL and G-BLR. The data latches DLL and DLR are respectively capable of latching write data bits supplied via the Y-gate array circuit 13. According to the present example, since the flash memory 1 has the 8-bit input/output terminals I/O0 through I/O7, it can set write data to the data latches DLL and DLR for four pairs of bit lines according to one input of write data. Forms or modes of data sets are rendered constant as typified by the correlation between the data latches DDL and DLR and the input/output terminals I/O4 and I/O0 set in pair therewith as shown in FIG. 7. Since write units are set as word-line units in the description made herein, write data are set to their corresponding data latches DLL and DLR related to bit lines for all the memory cells whose selected terminals are connected to one word line, and thereafter a write operation based on the application of a write voltage is carried out. The input/output terminals I/O5 and I/O1, I/O6 and I/O2, and I/O7 and I/O3 are paired in a manner similar to the I/O4 and I/O0.

In a multi-value information storage technology intended to be implemented by the flash memory 1 shown in FIG. 2, the state of storage of information in one memory cell is defined as one state selected from an erase state ("11") defined as a fourth threshold voltage state, a first write state ("10") defined as a first threshold voltage state, a second write state ("00") defined as a second threshold voltage state, and a third write state ("01") defined as a third threshold voltage state. The information storage states corresponding to the four types in all are defined as states determined by 2-bit data. Namely, one memory cell stores the 2-bit data therein. The relationship between the four-value data and the threshold voltages is represented as indicated by a threshold voltage distribution map illustrated in FIG. 8.

In order to obtain such a threshold distribution as shown in FIG. 8, write verify voltages respectively applied to word lines upon a post-erasure write operation are set to three types of voltages different from one another. These three types of voltages are successively switched to perform write operations three times in parts. In FIG. 8, VWV1, VWV2 and VWV3 respectively correspond to write verify voltages used upon obtaining the first write state, second write state and third write state.

Figure 9:
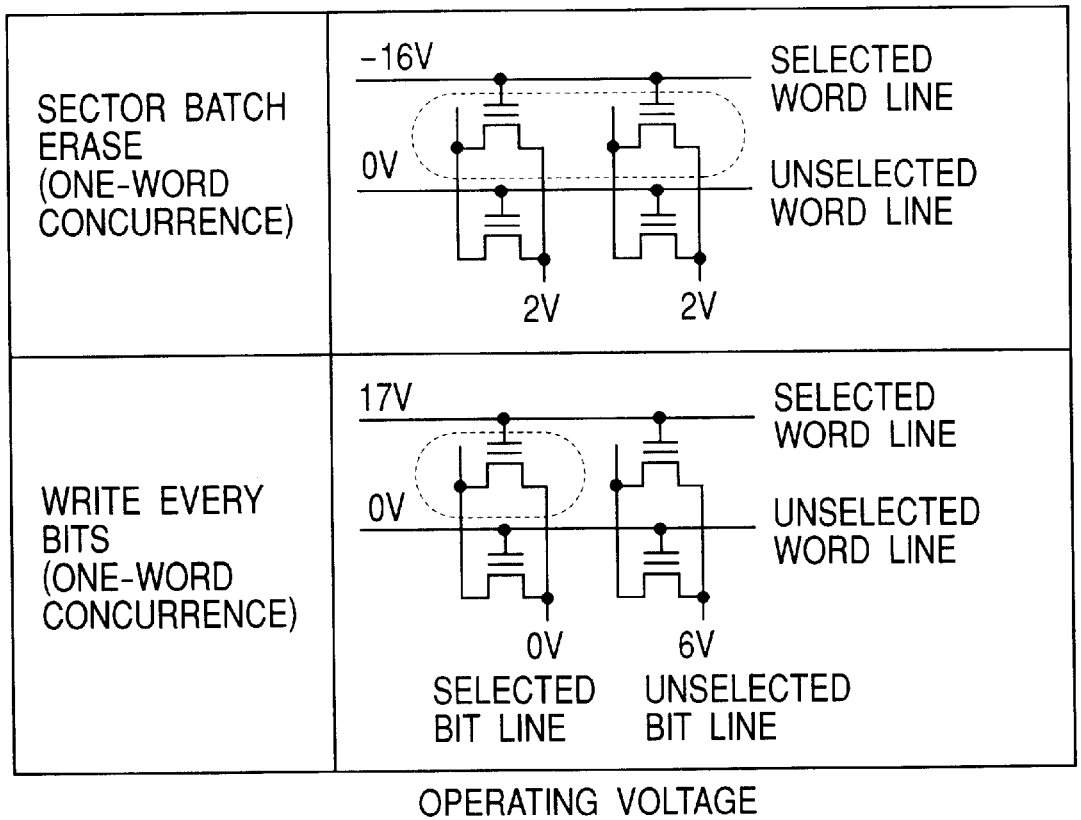
FIG. 9 is an explanatory view showing one example of voltage conditions for sector batch erasure and writing.

One example illustrative of the states of application of voltages to their corresponding word and bit lines upon their individual write operations set in parts three times is illustrated in FIG. 9. 0V is applied to the bit line selected for writing and 6V are applied to the unselected bit line. Although not restricted in particular, the selected word line is set to 17V, for example. As the write high-voltage application time increases, the threshold voltage of each memory cell rises. Control on the three types of write voltages can be carried out by such time control in a high-voltage state and control on the level of a high voltage applied to the corresponding word line.

Whether either 0V or 6V is applied to the corresponding bit line, is determined by the logic value of write control information latched in the corresponding sense latch SL. On the write-operation selection memory mat side, the sense latch SL is controlled so as to take write non-selection when data latched therein is given as a logic value "1" and take write selection when it is given as a logic value "0". The details thereof will be described later. Incidentally, upon sector batch erase as shown in FIG. 9, the selected word line is brought to −16V, the non-selected word line is brought to 0V, and the selected bit line is brought to 2V, respectively.

Figure 10:
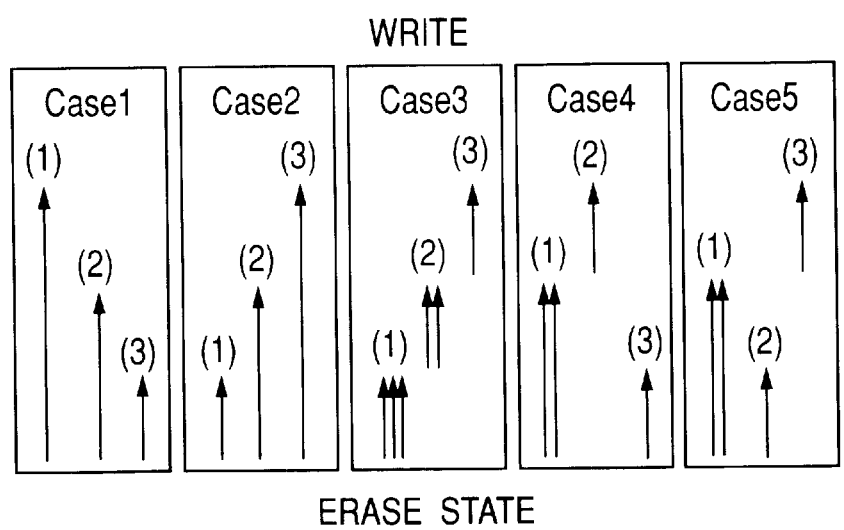
FIG. 10 is an explanatory view illustratively showing various write modes employed in a four-value writing process.

The operation of latching the write control information in the sense latch SL is controlled for each of the write operations set in parts three times. The mode control circuit 18 performs such write control and at this time perform operations or computations using the write data bits held in the data latches DLL and DLR every write operations to thereby generate write control information to be latched in the sense latch SL and allows the sense latch SL to latch the same therein. Assuming that write data latched in data latches DLL and DLR are respectively "01" as shown in FIG. 7 by way of example, a "01" state corresponds to the third write state as illustrated in FIG. 8 by way of example. When such a write procedure that the write operations set in parts three times, subsequent to the erase state produce write states in order of low threshold voltages as represented by a second case (Case 2) of FIG. 10, is adopted, a result (write control information) computed by using the write data ("01") of the data latches DLL and DLR upon a write operation for obtaining the first write state in the first time (1) is brought to a logic value "1", a result computed by using the write data ("01") of the data latches DLL and DLR upon a write operation for obtaining the second write state in the second time (2) is brought to a logic "1", and a result computed by using the write data ("01") of the data latches DLL and DLR upon a write operation for obtaining the third write state in the third time (3) is brought to a logic value "0". Such computations are carried out while the switch circuit/operational circuit arrays (31L, 30L or 31R, 30R) are being operated. Thus, a write voltage is applied only upon the third (3) writing, and the third write state ("01") of the four values is realized with respect to the corresponding memory cell.

Even if the write operations are carried three times in parts in this way, the write data firstly latched in the data latches DLL and DLR are held as they are without causing data corruption. This is because a control sequence that the switch circuit/operational circuit arrays (31L, 30L and 31R, 30R) respectively compute 2-bit write data latched in the data latches DLL and DLR every write operations and set data indicative of the results of computations to their corresponding sense latches SL every time, is adopted.

Incidentally, the order of varying the threshold voltages upon the write operation, and the like are not limited to the second case (Case 2) shown in FIG. 10. The threshold voltages may be set from those high in threshold voltage as in a first case (Case 1). Alternatively, threshold voltages obtained in one write operation with respect to any write state may be set identical in the rate of change in threshold voltage as in a third case (Case 3). As an alternative to it, the threshold voltages may be controlled as in a fourth case (Case 4) or a fifth case (Case 5). Namely, the threshold voltage of each of memory cells to be brought to data "00" through "01" is changed to a threshold voltage corresponding to "00" upon a first (1) writing in the Case 4. Next, the threshold voltage of the corresponding memory cell to be set to the data "01", of the memory cells each set to the threshold voltage corresponding to the data "00" upon the first (1) writing, is changed to a threshold voltage corresponding to the data "01" upon the second (2) writing. Upon the third (3) writing, the threshold voltage of a memory cell to be set to data "10" is changed to a threshold voltage corresponding to the data "10". Upon a first (1) writing in the Case 5, the threshold voltage of each of memory cells to be set to data "00" through "01" is changed to a threshold voltage corresponding to "00" in a manner similar to the Case 4. Next, the threshold voltage of the corresponding memory cell to be set to data "10" is changed to a threshold voltage corresponding to data "10" in a second (2) writing. Thereafter, the threshold voltage of the corresponding memory cell to be set to data "01", of the memory cells each set to the threshold voltage corresponding to the data "00" upon the first (1) writing, is changed to a threshold voltage corresponding to data "01" upon a third (3) writing.

Upon a data read operation, voltages defined as word-line selection levels, which are applied to their corresponding word lines, are set to three types. Further, three read operations are carried out while the three types of word-line selection levels are successively being changed, thereby latching (latch-sensing) binary (one bit) data read from memory cells upon the individual read operations in their corresponding sense latches SL. Each time the data are latched, an arithmetic operation for reflecting the contents thereof on their corresponding data latches DLL and DLR as 2-bit information is executed. The 2 bits obtained at the data latches DLL and DLR according to the results of three sense latches are set as read data corresponding to the four-value information held in the corresponding memory cell.

Figure 11:
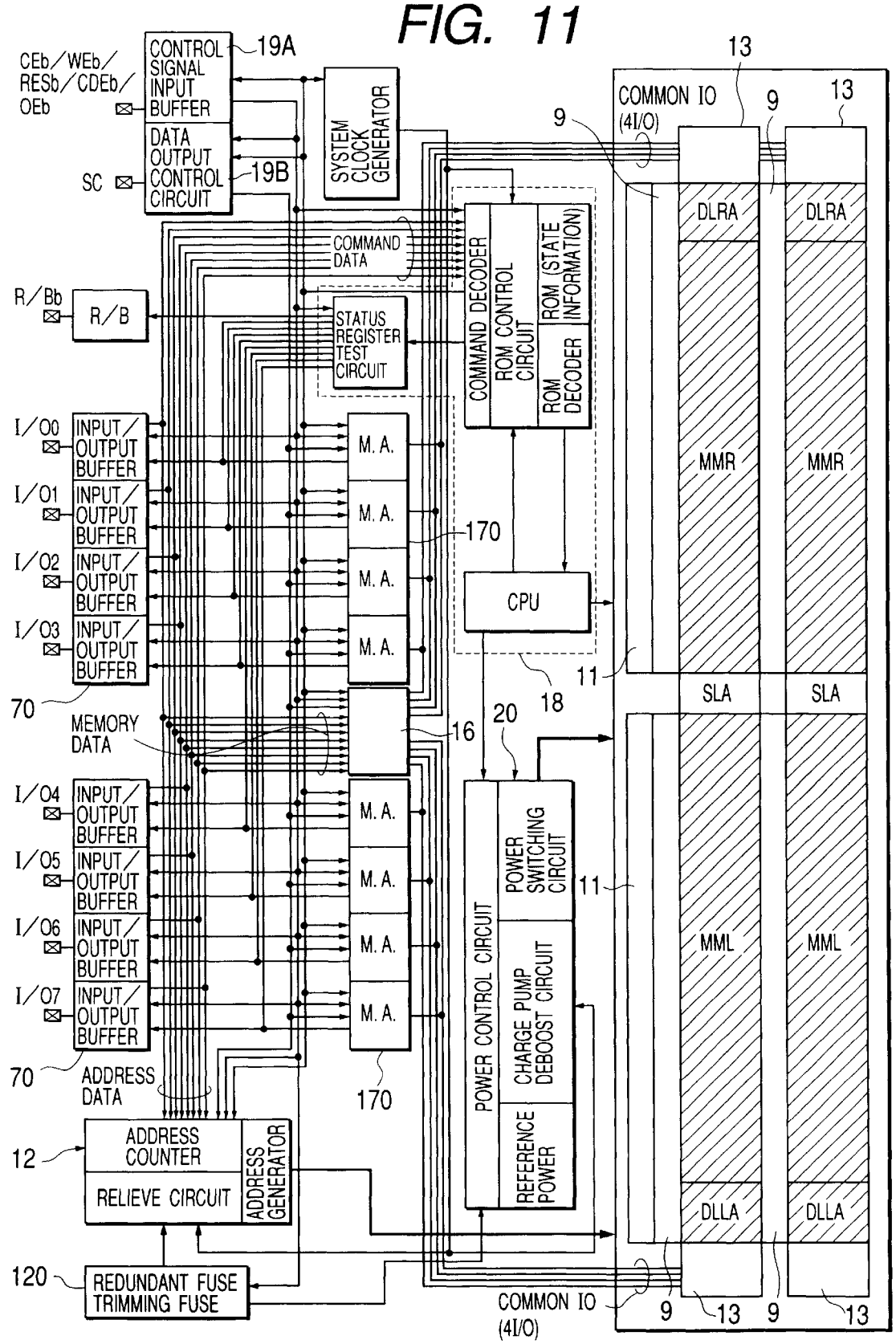
FIG. 11 is a block diagram depicting a configuration of the four-value flash memory shown in FIG. 1 from its layout viewpoint.

A block diagram illustrating the flash memory of FIG. 2 from a layout viewpoint is shown in FIG. 11. In FIG. 11, the mode control circuit 18 comprises a command decoder, a ROM having stored state information therein, a decoder for the ROM, a ROM control system circuit, a CPU and a status register/test system circuit. A redundancy relief control system circuit is also included in a Y-address counter 12. The multiplexer 7 and input buffer 17 shown in FIG. 2 are implemented by input buffers 70, data signal wirings and main amplifiers 170 in FIG. 11. The control signal buffer circuit 19 shown in FIG. 2 comprises a control signal input buffer 19A and a data input/output control circuit 19B. Each memory array 3 is provided with two pairs of memory mats MMR and MML on both sides of sense latch arrays SLA with the sense latch arrays SLA interposed therebetween.

<<Details of Memory Array>>

Figure 1:
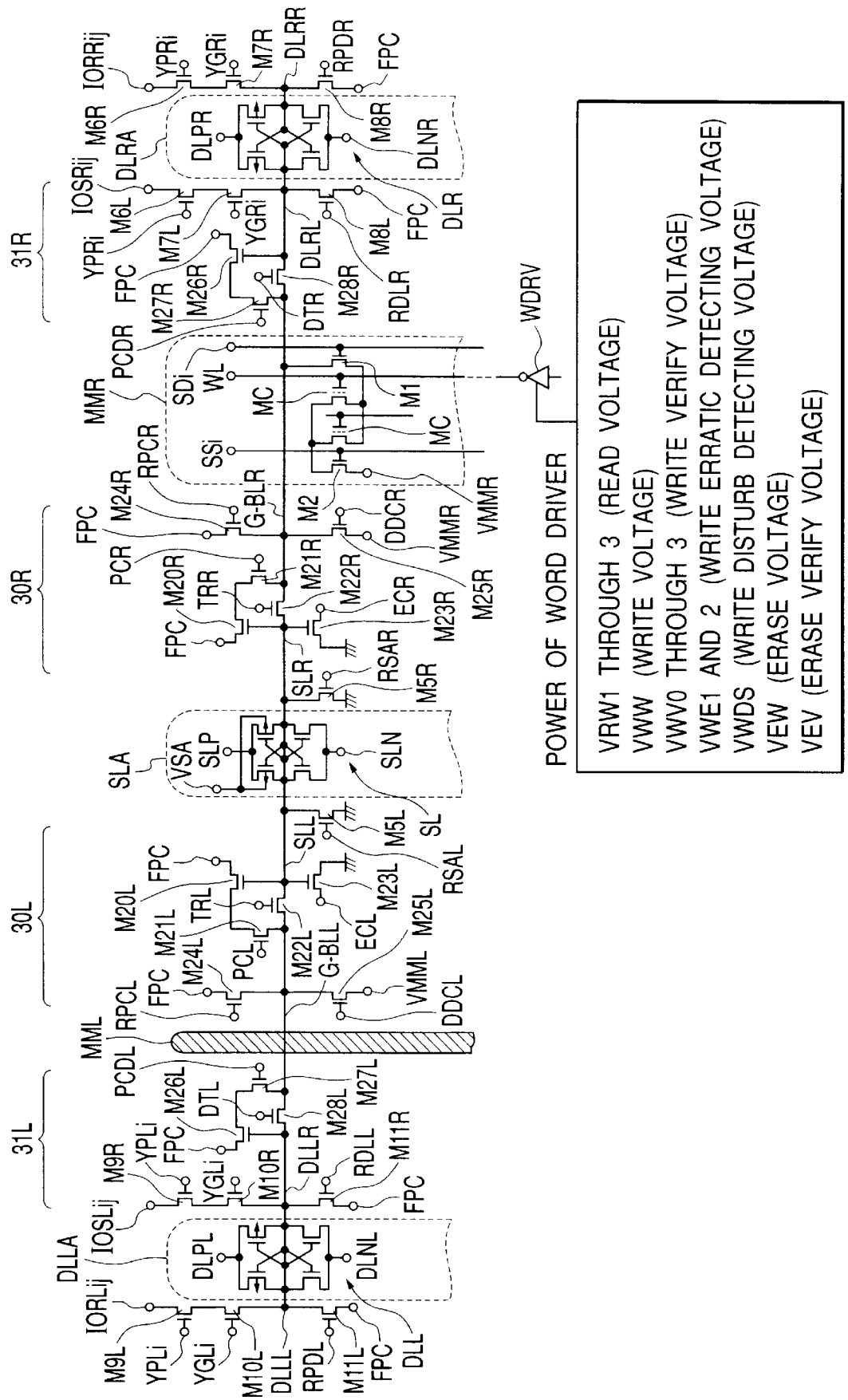
FIG. 1 is a circuit diagram showing a circuit configuration around a bit line, of a four-value flash memory according to a prior art of the present invention.

The details of the memory array will next be described. One example of a circuit configuration wherein sense latches and data latches employed in the flash memory are principally provided, is illustrated in FIG. 1. A configuration around a right-and-left pair of bit lines G-BLL and G-BLR of one sense latch SL is typically shown in FIG. 1. As is apparent from FIG. 1, the configuration around the right-and-left pair of bit lines G-BLL and G-BLR is formed as a mirror symmetric structure with the sense latch SL as the center.

The memory mats MML and MMR respectively have a plurality of electrically rewritable or programmable memory cells MC (several memory cells are typically illustrated). One memory cell MC comprises one transistor (memory cell transistor) having a control gate, a floating gate, a source and a drain and capable of electrically performing rewriting as shown in FIG. 3. A layout structure of the memory cell is formed as a so-called AND type although not restricted in particular. As illustrated on the memory mat MMR side by way of example, a plurality of the memory cell transistors are disposed in parallel through their corresponding diffusion layers (semiconductor regions) constituting sources and drains common thereto in the AND type configuration. Further, the diffusion layer constituting the drain is connected to its corresponding bit line G-BLR through a selected transistor M1, whereas the diffusion layer constituting the source is connected to its corresponding common source line VMMR through a selected transistor M2. SSi indicates a switch control signal for the selected transistor M2, and SDi indicates a switch control signal for the selected transistor M1. WL indicates a word line connected to the control gate of the corresponding memory cell MC. Each of the memory mats MML is also configured in the same manner as described above. Incidentally, P channel type MOS transistors in the drawings attached to the present specification are illustrated as distinguished from N channel type MOS transistors with arrows affixed to their base gates.

The sense latch SL comprises a static latch made up of a pair of CMOS inverters, i.e., a circuit wherein an input terminal of one CMOS inverter is mutually connected to an output terminal of the other CMOS inverter. SLR and SLL indicate a pair of input/output nodes of the sense latch SL. SLP and SLN indicate operating power supplies for the sense latch SL. MOS transistors M5L and M5R respectively selectively discharge (clear) the input/output nodes SLL and SLR.

The data latch DLR comprises a static latch made up of a pair of CMOS inverters, i.e., a circuit wherein an input terminal of one CMOS inverter is mutually connected to an output terminal of the other CMOS inverter. DLRR and DLRL indicate a pair of input/output nodes of the data latch DLR. DLPR and DLNR respectively indicate operating power supplies for the data latch DLR. A series circuit comprising MOS transistors M6L and M7L, and a series circuit comprising MOS transistors M6R and M7R constitute a column switch circuit which performs the input/output of data to and from the data latch DLR in complementary signal form. MOS transistors M8L and M8R respectively correspond to transistors which selectively charge the input/output nodes DLRL and DLRR.

The data latch DLL comprises a static latch made up of a pair of CMOS inverters, i.e., a circuit wherein an input terminal of one CMOS inverter is mutually connected to an output terminal of the other CMOS inverter. DLLR and DLLL indicate a pair of input/output nodes of the data latch DLL. DLPL and DLNL respectively indicate operating voltages or power supplies for the data latch DLL. A series circuit comprising MOS transistors M9L and M10L, and a series circuit comprising MOS transistors M9R and M10R constitute a column switch circuit which performs the input/output of data to and from the data latch DLL in complementary signal form. MOS transistors M11L and M11R respectively correspond to transistors which selectively charge the input/output nodes DLLL and DLLR.

The switch circuit/operational circuit array 30R has a circuit made up of MOS transistors M20R through M25R provided for each bit line G-BLR. The transistor M20R receives a voltage level applied to the input/output node SLR of the sense latch SL at its gate. When the voltage level is of a high level, the transistor M20R supplies a voltage FPC to the bit line G-BLR through the MOS transistor M21R. In this case, the voltage level supplied to the bit line G-BLR is determined by conductance control of the MOS transistor M21R operated based on a voltage level of a control signal PCR. The transistor M22R constitutes a transfer gate for selectively bringing the input/output node SLR and the bit line G-BLR into conduction. The MOS transistor M23R is used for all termination (also described as ALL determination). The MOS transistors M24 and M25R are used for precharge and discharge of the bit line G-BLR. The switch circuit/operational circuit array 30L also has a circuit which comprises MOS transistors M20L through M25L provided for each bit line G-BLL in a manner similar to the above. Incidentally, gate control signals applied to the MOS transistors M20L and M21L, and M24L and M25L are different from those for the MOS transistors M20R, M21R, M24R and M25R. The MOS transistors M22L and M22R are controlled so as to operate simultaneously at all times.

The switch circuit/operational circuit array 31R has a circuit made up of MOS transistors M26R through M28R provided for each bit line G-BLR. The transistor M26R receives a voltage level applied to the input/output node DLRL of the data latch DLR at its gate. When the voltage level is of a high level, the transistor M26R supplies a voltage FPC to the bit line G-BLR through the MOS transistor M27R. In this case, the voltage level supplied to the bit line G-BLR is determined by conductance control of the MOS transistor M27R operated based on a voltage level of a control signal PCDR. The transistor M28R constitutes a transfer gate for selectively bringing the input/output node DLRL and the bit line G-BLR into conduction. The switch circuit/operational circuit array 31L has also a circuit which comprises MOS transistors M26L through M28L configured in the same manner as described above for each bit line G-BLL. Incidentally, gate control signals applied to the MOS transistors M27L and M28L are different from those for the MOS transistors M27R and M28R.

One word driver WDRV is typically illustrated in FIG. 1. An operating voltage or power supply for the word driver WDRV, i.e., a word-line drive voltage is determined according to the contents of the operation of the flash memory 1 and selected from read voltages VRW1 through VWR3, a write voltage VWW, write verify voltages VWV0 through VWV3, write erratic detecting voltages VWE1 and VWE2, a write disturb detecting voltage VWDS, an erase voltage VEW, and an erase verify voltage VEV.

In the configuration shown in FIG. 1, basic circuit operations for reading and writing are as follows. When it is desired to effect reading on each of the memory cells MC included in the memory mat MMR in FIG. 1, for example, a signal RPCR on the selected memory mat (MMR) side is set to 1V+Vth, and a signal RPCL on the unselected memory mat (MML) side is set to 0.5V+Vth, whereby bit lines on the selected memory mat side are collectively precharged to 1V, and bit lines on the non-selected memory mat side are precharged to 0.5V. Of course, if the selected memory mat is given as MML and the unselected memory mat is given as MMR, then the signal RPCR is set to 0.5V+Vth and the signal RPCL is set to 1V+Vth. Vth indicate the threshold voltages of the MOS transistors M24R and M24L. The above voltage 0.5V as the precharge level for the corresponding bit line on the non-selected memory mat side is used as a reference level in the sense latch SL. After a word-line selecting operation, the transfer MOS transistors M22L and M22R are turned on, and at this time, the sense latch SL senses whether the level of the bit line G-BLR is higher or lower than 0.5V, and latches therein data read from the corresponding memory cell MC. To which value of four-value stored information the data latched in the sense latch SL corresponds, is determined according to a relationship with a read word-line selection level at this time. While the details of its determining process will be described later, the switch circuit/operational circuit arrays 30R, 30L, 31R and 31L are used therefor. 2-bit data corresponding to the result of determination are latched in the two data latches DLL and DLR provided two as viewed from the right and left of the sense latch SL.

When a power supply or source SLP for the sense latch SL is set to a write inhibiting voltage, e.g., 6V and the input/ output node of the sense latch SL is set to "1" after the write control information is latched in the sense latch SL upon writing, the write inhibiting voltage of 6V is applied to its corresponding bit line on the input/output node side. When the input/output node of the sense latch SL is set to "0", the corresponding bit line on the input/output node side holds 0V. A high electric field necessary for writing is formed in the corresponding memory cell having a drain voltage of 0V with respect to a high voltage applied to a control gate thereof, whereby the writing is effected on the memory cell. Thus, the logic value of the write control information latched in the sense latch SL determines whether a write voltage should actually be applied. The logic value is determined based on the write data latched in the right-and-left data latches DLL and DLR, and according to whether the present write operation corresponds to a write operation corresponding to any of the first through third write states. Its determination logic will be described later.

A verify operation immediately after the application of each of the write voltages for the first writing through the third writing is carried out according to an all determining operation relative to a sector intended for writing. For example, after the application of the write voltage, the signal RPCR on the selected memory mat MMR side is controlled to 1V+Vth, for example to precharge the bit line G-BLR to 1V. Further, the gate voltage RPCL of the MOS transistor M24L is controlled to 0.5V+Vth on the non-selected memory mat MML side to precharge the bit line G-BLL to 0.5V. Vth means the threshold voltages of the MOS transistors M24R and M24L. In this state, the intended verify voltages VWV1, VWV2 or VWV3 is supplied to the corresponding word line. If there are memory cells (including a memory cell having no reached a required threshold voltage) each having a threshold voltage less than the verify voltage applied to the word line, then the corresponding bit line is discharged. Thereafter, the word-line selecting operation is completed, and the write non-selected bit line on the selected memory mat side is precharged to 1V, based on the data latched in the sense latch SL. Namely, the input/output node of the sense latch SL for the write unselected bit line on the selected memory mat side is brought to the logic value "1". When the transistor 20R is turned on based on the latched data corresponding to the logic value "1" of the sense latch SL to control PCR to 1V+Vth, for example, the write unselected bit line can be precharged to 1V (mask used under unselection precharge processing). If all of memory cells brought to write selection are in a required threshold-voltage state at this time, then all the bit lines of the selected memory mat take a precharge state. The transistors M23L and M23R for all determination determine whether all the bit lines of the memory mat on the operation selection side are placed in the precharge state. The MOS transistors M23L and M23R for all determination have gates connected to the corresponding bit line and sources connected to a ground potential. The configuration related to the bit lines G-BLL and G-BLR with one sense latch SL typically illustrated in FIG. 1 as the center actually exists in large numbers. All of the drains of the transistors M23L on the left side of FIG. 1 are commonly connected to a terminal ECL with the sense latch SL interposed therebetween. A current corresponding to the state (level) of each left bit line typified by the bit line G-BLL flows into the terminal ECL. Similarly, all of the drains of the right transistors M23R of FIG. 1 are commonly connected to a terminal ECR with the sense latch SL interposed therebetween. A current corresponding to the state (level) of each right bit line typified by the bit line G-BLR flows into the ECR. Although not illustrated in particular, there is provided a current sense type amplifier for detecting whether all the bit lines G-BLL (G-BLR) on the left (right) side of the sense latch circuit SL are brought to a precharge state, based on a change in the terminal ECL (ECR). The present amplifier detects that all the memory cells intended for erase verify or write verify have been brought to a predetermined threshold voltage, i.e., it performs all determination.

Figure 41:
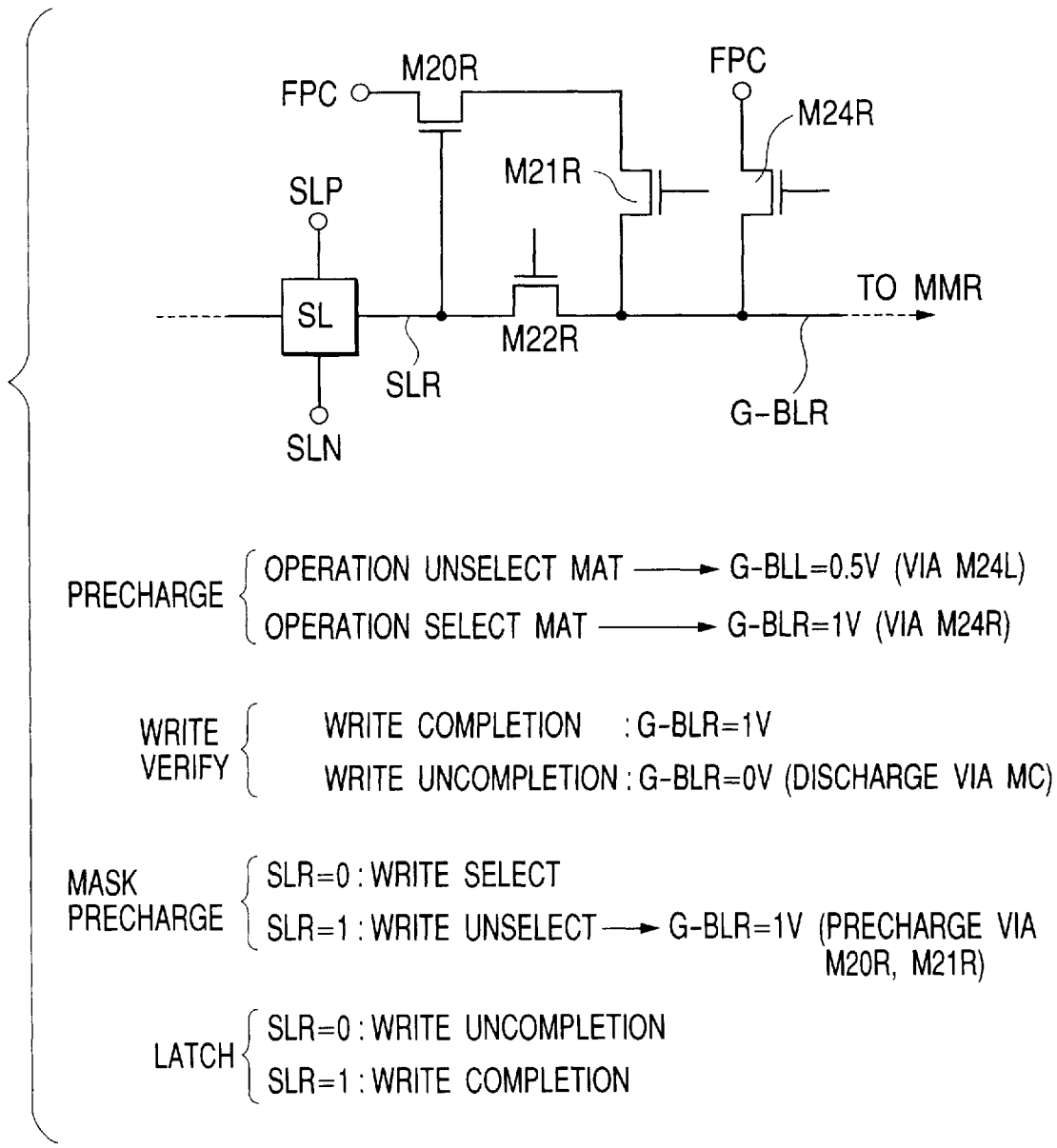
FIG. 41 is an explanatory view collectively showing the relationship between latched data of a sense latch at the time of write and write verify and operations based thereon.

The relationship between data (value at data input/output node on the selected mat side) latched in a sense latch SL at write and write verify and operations thereof based on the latched data will now be described in summary. Assuming that the memory mat on the selection side is represented as MMR as shown in FIG. 41, a write operation is selected according to a node SLR=0 of the sense latch SL and unselected according to SLR=1. A write inhibition or blocking voltage of 6V is supplied to a write-unselected bit line G-BLR. While the threshold voltage of a write-selected memory cell is being lower than a verify voltage, a bit line for the corresponding memory cell is discharged through the memory cell upon the write verify operation (G-BLR=0). If write completion is reached, then the corresponding bit line maintains a level precharged by a MOS transistor M24R (G-BLR=1). A bit line for a write-unselected memory cell on the write-operation selected memory mat side is forcedly precharged to latch data "1" of the sense latch SL upon all determining operation at the write verify. Namely, the write-unselected bit line G-BLR is precharged through transistors M20R and M21R in response to the input/output node SLR=1 of the sense latch SL after the completion of a word line selecting operation (mask used under non-selection precharge) Thus, when the threshold voltages of all the memory cells intended for writing are set greater than a verify voltage, all the bit lines for a sector (corresponding to a storage area which comprises a predetermined number of memory cells whose control gates are connected to one word line defined as a write unit) maintain a precharge state.

Read, write, additional write, and erase operations of the flash memory 1 having the above-described configuration will respectively be described below in detail.

<<Read Operation>>

Figure 13:
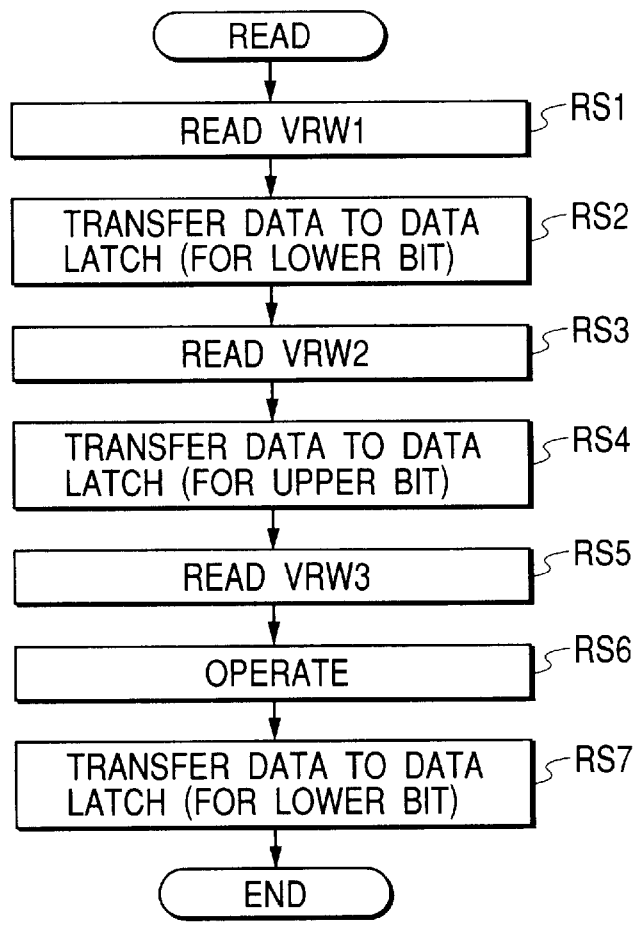
FIG. 13 is a flowchart illustrating one example of a read operation of the four-value flash memory.
Figure 14:
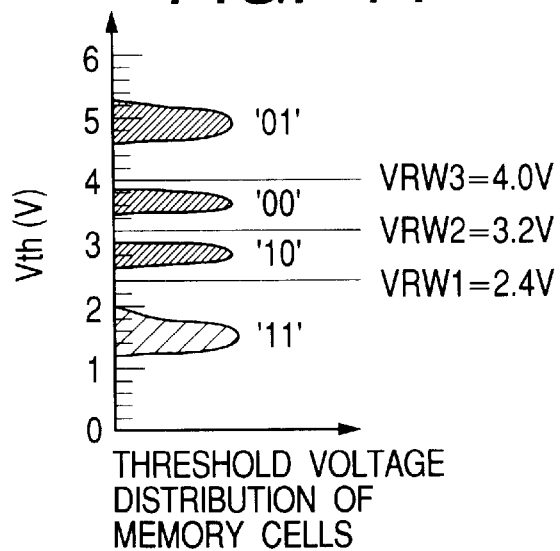
FIG. 14 is an explanatory view showing the relationship of a read word-line voltage to a threshold voltage distribution of a flash memory cell transistor.

A flowchart for describing read operations is shown in FIG. 13. The relationship between respective threshold voltages of nonvolatile memory cells and read word line voltages VRW1 through VRW3 is illustrated in FIG. 14 by way of example. When the flash memory 1 accepts a read command, it effects a read operation using the read word line voltage VRW1 on a sector address specified by the corresponding command (RS1). The read data is latched in the corresponding sense latch SL and the latched data is supplied to its corresponding data latch DLR (RS2). Next, the flash memory 1 effects a read operation using the read word line voltage VRW2 on the same sector address as described above, and the read data is latched in the corresponding sense latch SL (RS3). The latched data is next supplied to its corresponding data latch DLL (RS4). Further, the flash memory 1 effects a read operation using the read word line voltage VRW3 on the same sector address as described above (RS5). The flash memory 1 performs an arithmetic operation for determining, using the read data and the data already latched in the data latch DLR, whether the state of the threshold voltage of the corresponding memory cell corresponds to an erase state or any of first through third write states (RS6), and reflects the result of operation on the data latch DLR (RS7). Thus, the four-value information stored in the corresponding memory cell are held in the two data latches DLR and DLL.

Figure 26:
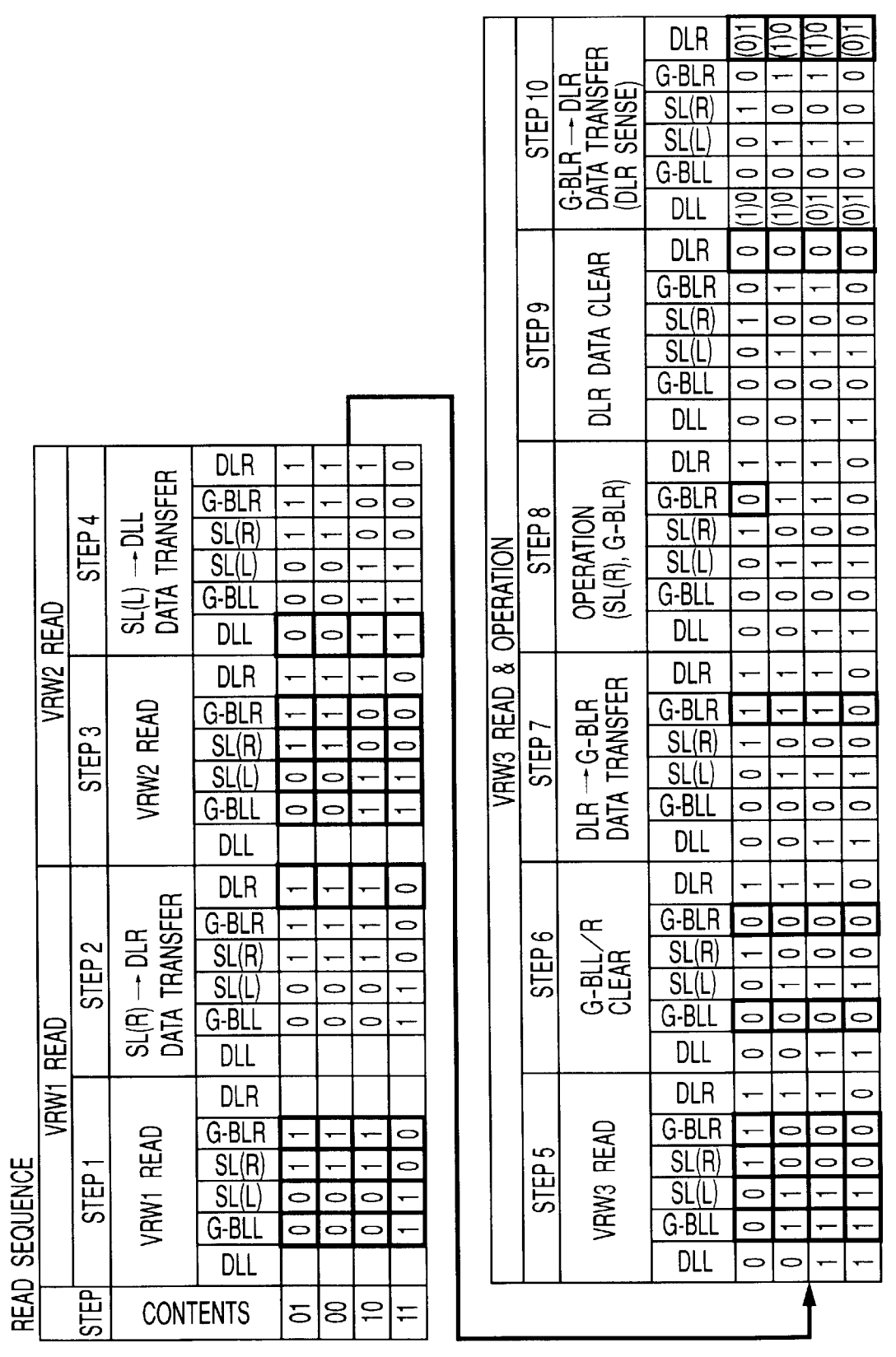

FIG. 26 shows a detailed one example of the read operation procedure in association with the states of sense latches, bit lines and data latches. As to the contents shown in the same drawing, a memory mat for operation and selection will be defined as the memory mat MMR provided on the right side of FIG. 1. Numerals represented so as to correspond to signals or nodes indicated every Steps indicate that numerals with decimal points means voltages and numerals free of the decimal points means logic values (high level: "1" and low level: "0"). When one value is represented in each of the columns of the data latches DLL and DLR, the value indicates a value at a node on the bit line side. There may be a case where both values at the left and right nodes are represented in the columns of the data latches DLL and DLR. In this case, numerals free of parentheses are defined as logic values at noted nodes. In FIG. 26, SL(R) indicates an input/output node SLR of each sense latch SL, and SL(L) indicates an input/output node SLL thereof.

If VRW1 read is carried out in Step 1 of FIG. 26, it is then possible to distinguish between a memory cell held in an erase state ("11") and memory cells held in states other than the erase state, and the read data of the corresponding 1 bit is transferred to its corresponding data latch DLR (Step 2). When VRW2 read is performed in Step 3, a distinction can be made between memory cells held in the erase state ("11") and a first write state ("10") and memory cells held in states other than those, and the read data of the corresponding 1 bit is transferred to its corresponding data latch DLL (Step 4). It is apparent from FIG. 14 that data latched in each data latch DLL becomes an upper bit of 2-bit read data. A logic value of a lower bit cannot be determined unless VRW3 read is carried out. To this end, the VRW3 read is performed in Step 5 to thereby make a distinction between a memory cell held in a third write state ("01") and memory cells held in states other than it. Further, bit lines are cleared to "0" by use of transistors M25R and M25L while the read data of the corresponding 1 bit remains latched in its corresponding sense latch SL (Step 6). In order to perform an arithmetic operation for determining the logic value of the lower bit of the 2-bit read data, data of a data latch DLR is transferred to its corresponding bit line (Step 7). A transistor M20R is switch-controlled by the data latched in the sense latch SL to thereby discharge a bit line for a sense latch SL having latched a logic value "1" therein to a logic value "0" (Step 8). This processing is defined as XORing of the upper bit and the result of VRW3 read. Thus, the lower bit of the 2-bit read data is determined on the corresponding bit line. An input node of a data latch DLR is cleared by means of M8R and M8L, and data on a bit line G-BLR is transferred to the data latch DLR through a transistor M28R (Step 10). 2-bit read data latched in data latches DLR and DLL are outputted to the outside through predetermined terminals of the external terminals I/O0 through I/O7.

<<Write Operation>>

Figure 15:
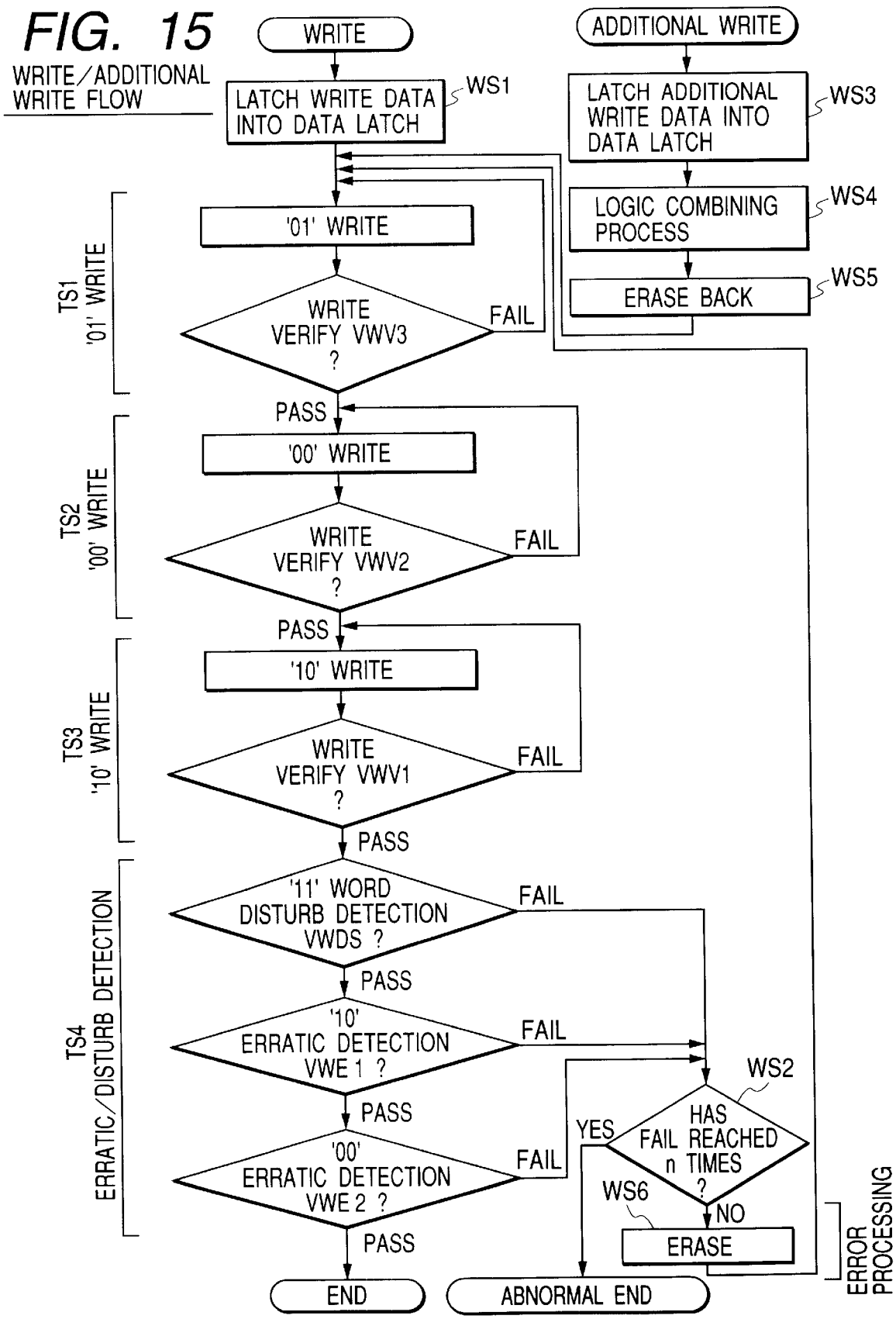
FIG. 15 is a flowchart depicting one example illustrative of a write operation and an additional write operation of the four-value flash memory.

A flowchart for the write operation is shown in FIG. 15. The write operation is defined as writing (sector writing) with a word line as one unit. When the flash memory receives a write command therein, it captures or takes in the next input as a sector address and takes in an input subsequent to the capturing of the sector address as write data (WS1). The captured sector address is an X address and one word line to which a write high voltage is applied, is selected thereby. The capturing of the write data is effected on data latches DLL and DLR in byte units while progressively incrementing a Y-address counter 12 from its initial value. As shown in FIG. 6, for example, the write data are latched in the data latch arrays DLLA and DLRA assigned to the pair of memory mats MML and MMR related to one sense latch array SLA. Assuming that, for example, control gates of n memory cells are connected to one word line, n-bit write data are respectively latched into the data latch arrays DLLA and DLRA.

Figure 18A:
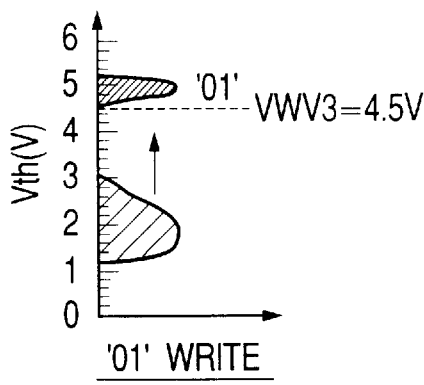
FIGS. 18A to 18F are explanatory views showing respective states of "00" write, "10" write, "01" write, erratic disturb detection, pre-additional write, and erasure back in the form of a threshold voltage distribution of the flash memory cell transistor.
Figure 18B:
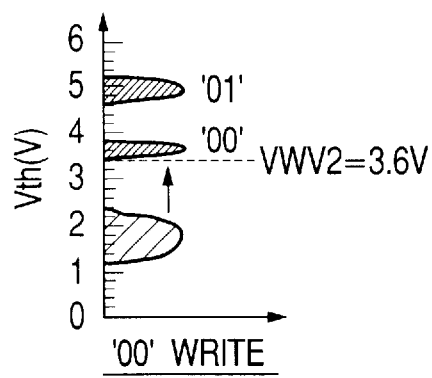
Figure 18C:
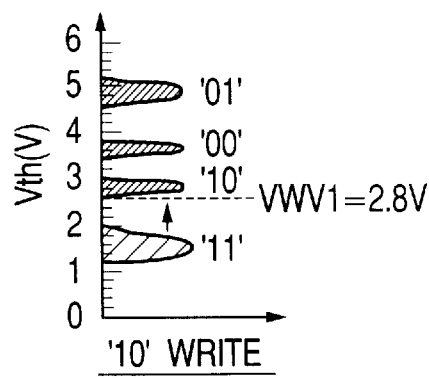
Figure 18D:
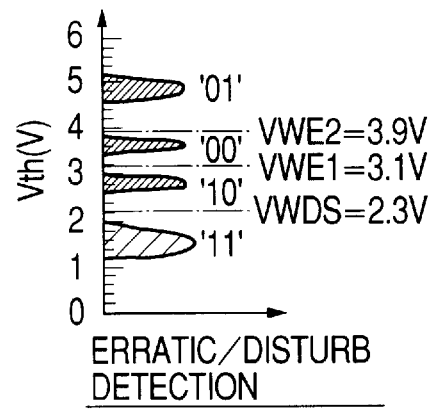

After the latching of the write data, a "01" write process TS1, a "00" write process TS2, a "01" write process TS3, and an erratic/disturb detecting process TS4 are carried out. One examples of the relationships between threshold-voltage distributions obtained by the "01" write process TS1, the "00" write process TS2 and the "10" write process TS3 and verify voltages used therefor are respectively shown in FIGS. 18(A) through 18(C). One example of the relationship between a threshold-voltage distribution obtained by the erratic/disturb detecting process TS4 and verify voltages therefor is illustrated in FIG. 18(D).

The "01" write process is a process for setting the threshold voltage of the corresponding memory cell MC to a third write state ("01") with respect to an erase state ("11") corresponding to one state of four values. VWV3 is used as a write verify voltage.

Figure 16:
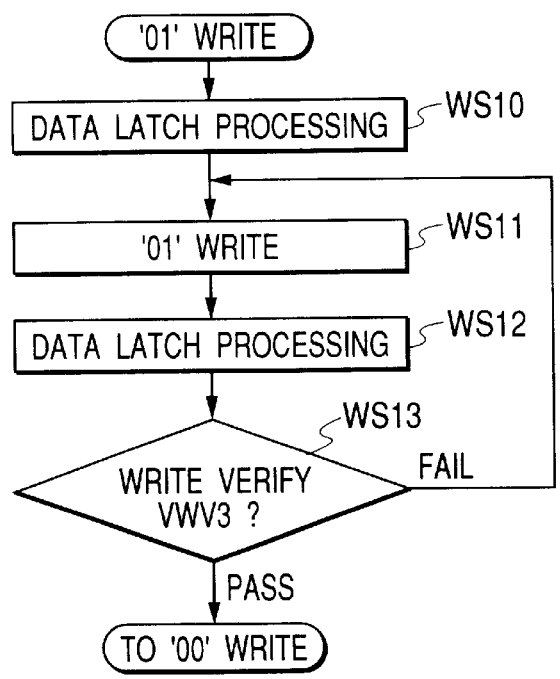
FIG. 16 is a flowchart showing one detailed example of "01" write processing included in the write operation.

The "01" write process includes data latch processing WS10, "01" write processing WS11, data latch processing WS12, and write verify processing WS13 as its details are illustrated in FIG. 16 by way of example. The data latch processing WS10 is a process for, when "01" data corresponding to 2 bits are latched in the corresponding data latches DLL and DLR, latching control data for a logic value for enabling write voltage application in response to it into the corresponding sense latch SL. The "01" write processing WS11 applies a write voltage corresponding to the "01" data to a memory cell for a bit line corresponding to a sense latch SL in which control data having a logic value of an enable level is latched. When the input/output node of the sense latch SL on the write-selected memory mat side is set to the logic value "0" as described above, a write voltage is applied to the corresponding memory cell for the bit line connected to the node. The data latch processing WS12 is a process for performing determination made to the "01" write by the verify processing WS13 every time with the 2-bit write data of the data latches DLL and DLR as references. The verify processing WS13 is carried out according to the aforementioned all determination.

The "00" write process TS2 is a process for setting the threshold voltage of the corresponding memory cell MC to a second write state ("00") with respect to the erase state ("11") corresponding to one state of the four values. VWV2 is used as a write verify voltage. The "00" write process TS2 is substantially identical to FIG. 16 but is different therefrom in that upon data latch processing, control data for a logic value for providing write enable in response to the "00" data of 2 bits latched in the data latches DLL and DLR is latched in the corresponding sense latch SL and VWV2 is used as a write verify voltage.

The "10" write process TS3 is a process for setting the threshold voltage of the corresponding memory cell MC to a first write state ("10") with respect to the erase state ("11") corresponding to one state of the four values. VWV1 is used as a write verify voltage. The "10" write process TS3 is substantially identical to FIG. 16 but is different therefrom in that upon data latch processing, control data for a logic value for providing write enable in response to the "10" data of 2 bits latched in the data latches DLL and DLR is latched in the corresponding sense latch SL and VWV1 is used as the write verify voltage. The write verify voltage is set so as to take VWV3>VWV2>VWV1 as is apparent from the examples of FIG. 18.

The erratic/disturb detecting process TS4 includes "11" word disturb detecting processing for detecting whether the threshold voltage of a memory cell in the erase state exceeds VWDS, "10" erratic detecting processing for detecting whether the threshold voltage of a memory cell transistor subjected to the "10" write process exceeds VWE1, and "00" erratic detecting VWE2 processing for detecting whether the threshold voltage of a memory cell transistor subjected to the "00" write process exceeds VWE2, as shown even in FIG. 18(D). The term word disturb means that even the write-unselected memory cell is subjected to a certain degree of high electric field in terms of the nature that a write high voltage is applied in word-line units, thereby undesirably increasing a threshold voltage. The "11" word disturb detecting processing detects it. The term erratic indicates a state in which the threshold voltage is undesirably rendered high according to electronic evidential probability. It is detected according to the erratic detecting processing.

If a series of processing results obtained up to the erratic/disturb detecting process TS4 are normal, then a pass flag is set to the status register 180 and hence a series of write processes are finished. If the result of detection by the erratic/disturb detecting process TS4 is found to be fail, it is then determined whether the number of fails has reached a predetermined number of times (WS2). If the number of fails is found not to have reached it, then the write sector is erased (WS6) and the routine procedure is redone again from the "01" writing. The number of times that it is redone, is held in unillustrated counter means. It is determined based on a value counted by the counter means whether the number of fails has reached a predetermined value. When the number of times that an error occurs, has reached a predetermined value, a fail flag is set to the status register 180 and hence a series of write processes are terminated as abnormal.

When re-erasure is done and writing is repeated again, it is not necessary to bring the write data for the write sector from outside again as is apparent from FIG. 15. This is because the write data corresponding to one sector, temporarily latched in the data latches DLL and DLR in Step WS1 are not damaged even if the processes TS1 through TS4 are carried out, and remain in the data latches DLL and DLR as they are.

This depends on the latch operation control form on the write control information with respect to each sense latch SL. Namely, the write control information to be latched by the sense latch SL is generated by performing an arithmetic operation using write data bits held in their corresponding data latches DLL and DLR every write operations, which in turn is latched in the corresponding sense latch SL. Assuming that the write data latched in the data latches DLL and DLR are respectively "01" as shown in FIG. 7 by way of example, the "01" state corresponds to the third write state as illustrated in FIG. 8 by way of example. When the write operations set in parts three times, subsequent to the erase state are carried out in the second case (Case 2) of FIG. 10, a result computed by using the write data ("01") of the data latches DLL and DLR upon a write operation for bringing the first write state in the first time is brought to a logic value "1", a result computed by using the write data ("01") of the data latches DLL and DLR upon a write operation for obtaining the second write state in the second time is brought to a logic "1", and a result computed by using the write data ("01") of the data latches DLL and DLR upon a write operation for obtaining the third write state in the third time is brought to a logic value "0". Such computations are carried out while the switch circuit/operational circuit arrays 30L, 30R, 31L and 31R are being operated. Thus, a writing high electric field is applied between a drain and a control gate of each memory cell transistor only upon the third writing, and hence the third write state ("01") of the four values is realized with respect to the corresponding memory cell.

When the write operations are carried three times in parts in this way, the write data firstly latched in the data latches DLL and DLR are not corrupted and hence held as they are. This is because a control sequence that the 2-bit write data latched in the data latches DLL and DLR are used for computation every write operations and set to the corresponding sense latch SL every time, is adopted. In a manner similar to the above even in the case of the erratic/disturb detecting process, a control sequence that a result computed by using the 2-bit write data latched in the corresponding data latches DLL and DLR is set to the corresponding sense latch SL each time, is adopted. Thus, even at this time, the write data firstly latched in the data latches DLL and DLR are held as they are without their corruption.

The process (data latch processing) for allowing the result of computation or operation using the 2-bit write data latched in the data latches DLL and DLR differ in its computing technique or method from the relationship with the present processes in TS1 through TS4.

FIG. 21 logically shows one example of the contents of computation based on the data latch processing. The contents of computation or operation in FIG. 21 is one related to sense latch data (data at input/output node of sense latch SL on the operation selected memory mat side) on the operation selected memory mat side. This computing method shows the operation of setting a bit-line precharge voltage to three levels of 0V, 0.5V and 1.0V and latching the intended data in the corresponding sense latch SL according to a plural number of sense operations done by the sense latch SL.

In FIG. 21, A and B indicate 2-bit write data corresponding to one sense latch SL. A indicates an upper data bit latched in a data latch DLL, and B indicates a lower data bit latched in a data latch DLR, respectively. According to FIG. 21, the ORing of the data bit A and inverted data of the data bit B is obtained as "01" write data in the case of "01" write data latch processing, the ORing of the data bits A and B is obtained as "00" write data in the case of "00" write data latch processing, the ORing of inverted data of the data bit A and the data bit B is obtained as "10" write data in the case of "10" write data latch processing, the negative ORing of the data bits A and B is obtained as "00" erratic detection data in the case of "00" erratic detection data latch processing, the ANDing of the data bit A and inverted data of the data bit B is obtained as "01" erratic detection data in the case of "10" erratic detection data latch processing, and the ANDing of the data bits A and B is obtained as "11" disturb detection data in the case of "11" erratic detection data latch processing, respectively.

When the arithmetic logic shown in FIG. 21 is adopted, logic values obtained from operational results on the logic values of the data bits A and B are represented as shown in FIG. 22. As described above, the logic value "0" (low level) of each sense latch data means write field application (write selection).

Figure 27:
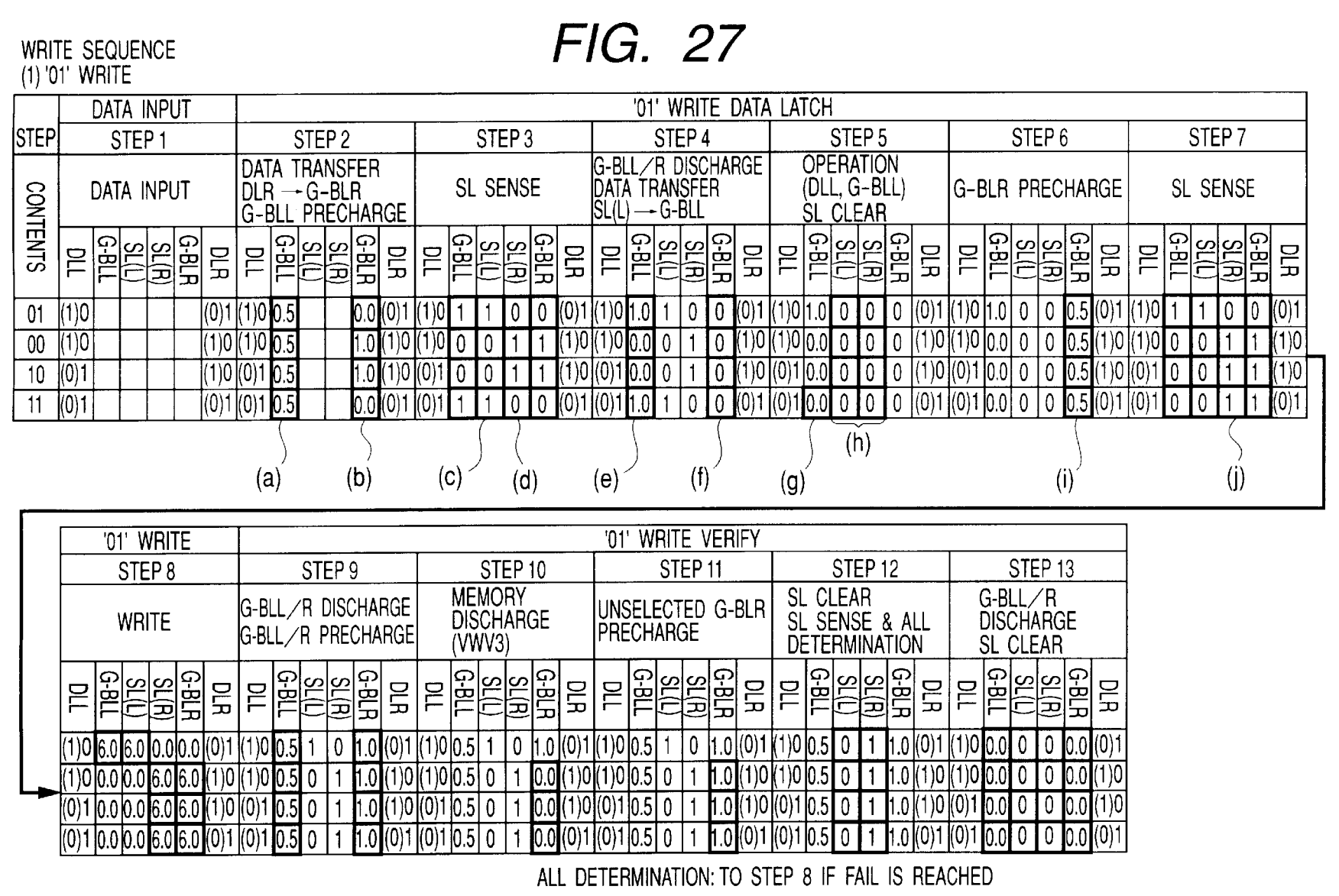

A further detailed operation flowchart of the "01" write process is shown in FIG. 27. An expressive form shown in the same drawing is identical to that in FIG. 26. 2-bit write data are first latched in their corresponding data latches DLL and DLR (Step 1). The latched data are illustrated in the form of four types of "01", "00", "10" and "11". Next, data of a data latch DLR is transferred to its corresponding bit line G-BLR on the write selected memory mat side. All the bit lines on the write nonselected memory mat side are precharged to 0.5V (Step 2). The data transfer is carried out according to selective precharge based on M26R and M27R after the discharge of each bit line by M25R. This will be described in further detail. Each bit line G-BLL on the non-selected memory mat side is precharged to 0.5V through a transistor M24L (a). According to the data latched in the data latches DLR, their corresponding bit lines G-BLR are precharged to either 0.0V or 1.0V by use of M26R and M27R (b).

In Step 3, the corresponding sense latch SL is activated so as to perform a sense latch operation in accordance with each of the results of the above (a) and (b). Consequently, the right and left input/output nodes SL(L) and SL(R) of the sense latches SL are respectively brought to states of (c) and (d) shown in the drawing.

In Step 4, the voltage of each bit line G-BLL takes each voltage shown in (e) in the drawing in accordance with the result of the (c), and the other bit lines G-BLR are cleared to a logic value "0".

In Step 5, a transistor M26L is turned on by latch data corresponding to a logic value "1" of each data latch DLL to discharge a bit line G-BLL corresponding to each data latch DLL having latched the logic value "1" therein to 0V through each of transistors M27L and M26L (g). A voltage FPC at this time is brought to a ground voltage. Both input/output nodes SL(L) and SL(R) of the corresponding sense latch SL are cleared to a logic value "0" through transistors M5L and M5R.

In Step 6, each bit line G-BLR on the selected memory mat side is precharged to 0.5V (i). When transistors M22R and M22L are turned on to allow the corresponding sense latch SL to perform a sense operation in Step 7, an input/output node SL(R) on the selected memory mat side, of the sense latch SL serves so as to latch a logic value "0" only when "01" are latched in the corresponding data latches DLL and DLR.

In Step 8, a source or power SLP is set to 6.0V used as a write inhibiting or blocking voltage. When latch data at an input/output node SLR on the operation selected memory mat side, of a sense latch SL is of a logic "1", the source SLP of 6V is supplied to its corresponding bit line G-BLR through the corresponding transistor M22R. When the latch data at the input/output node SLR is of a logic value "0", the level on the bit line G-BLR connected to the input/output node SLR is maintained at 0V. In a memory cell transistor whose drain is connected to the bit line maintained at 0V, a write voltage is applied between the drain and control gate thereof. At this time, a high electric field necessary for writing is not produced in each bit line to which the write blocking voltage 6.0V is applied.

After the application of the write voltage, all the bit lines G-BLR on the operation selected memory mat side are precharged to 1.0V, and all the bit lines G-BLL on the operation non-selected memory mat side are discharged to 0.5V, as indicated in Step 9. At this time, data of logic values latched according to the data latch processing at writing are held in their corresponding sense latches SL. While the data latch processing WS12 is interposed even before the verify processing WD13 in the description of FIG. 16, this does not necessarily means that data latch processing is carried out anew independently of the data latch processing WS10 prior to the application of the write voltage. The data latch processing WS12 can be substituted with the data latch processing WS10 set for each write-voltage application. The processing shown in FIG. 27 is set in this way.

In Step 10, the operation of selecting each memory cell according to a verify voltage VWV3 is carried out. When the threshold voltage of the corresponding memory cell is found not to have reached greater than the verify voltage VWV3, each bit line G-BLR for the memory cell is discharged to 0.0V. Thereafter, a bit line G-BLR for a write non-selected memory cell is precharged to 1.0V on the operation selected memory mat side in Step 11. Namely, an input/output node of a sense latch SL corresponding to the write non-selected memory cell is set to a logic value "1". A transistor M20R, which receives the logic value "1" at its gate, is turned on so that an operating source or power FPC supplies 1.0V to the corresponding bit line G-BLR. Thus, if the threshold voltage of each memory cell intended for writing has reached a target voltage, then all the bit lines G-BLR for an operation selected memory mat are brought to the logic "1". In Step 12, an input/output node of each sense latch SL is cleared and thereafter the sense latch SL is allowed to latch the state of each bit line, whereby the all determination is carried out. After the all determination, the input/output nodes for both the bit lines G-BLR and G-BLL and the sense latch SL are cleared to a ground potential (Step 13).

Figure 28:
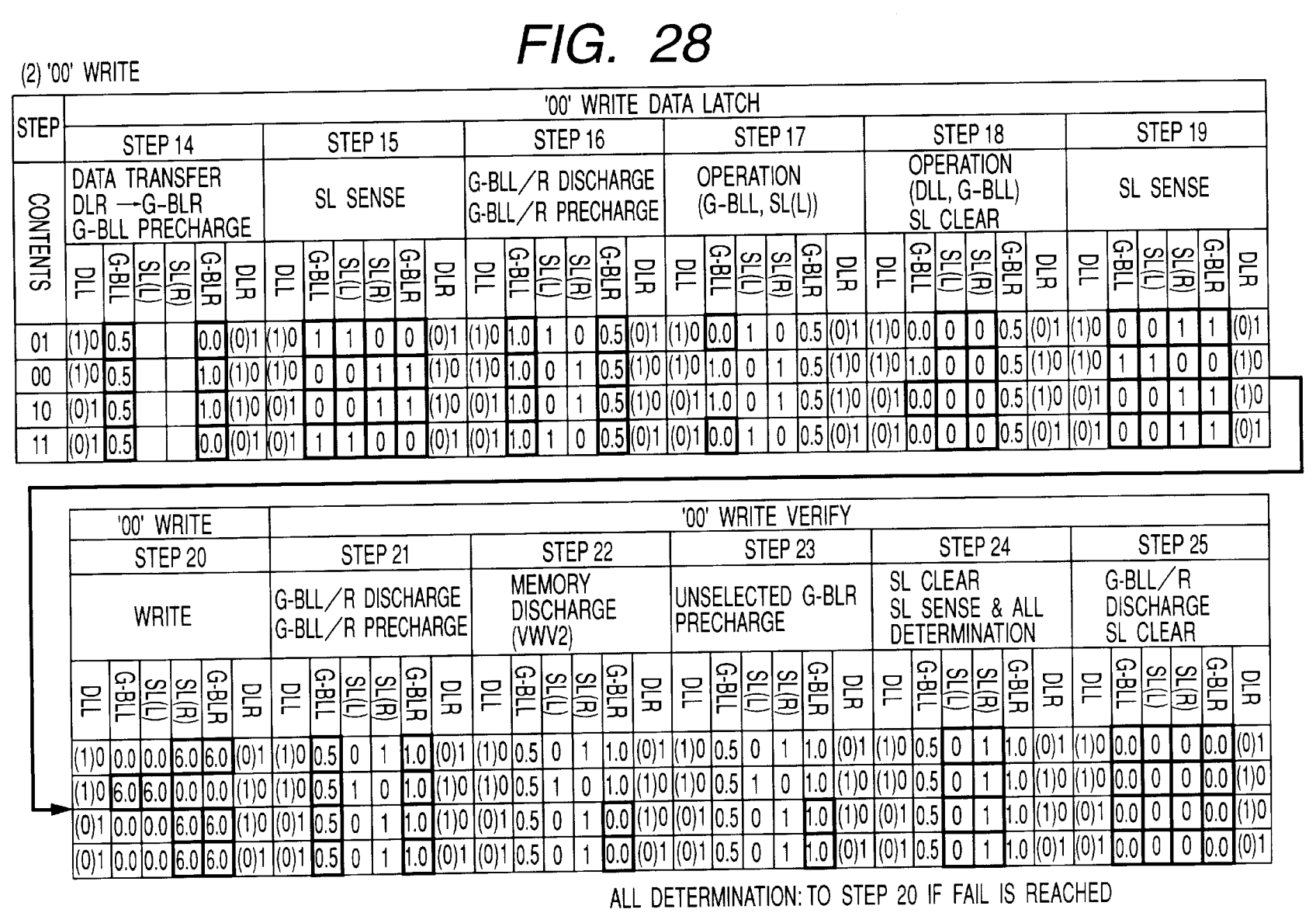
Figure 29:
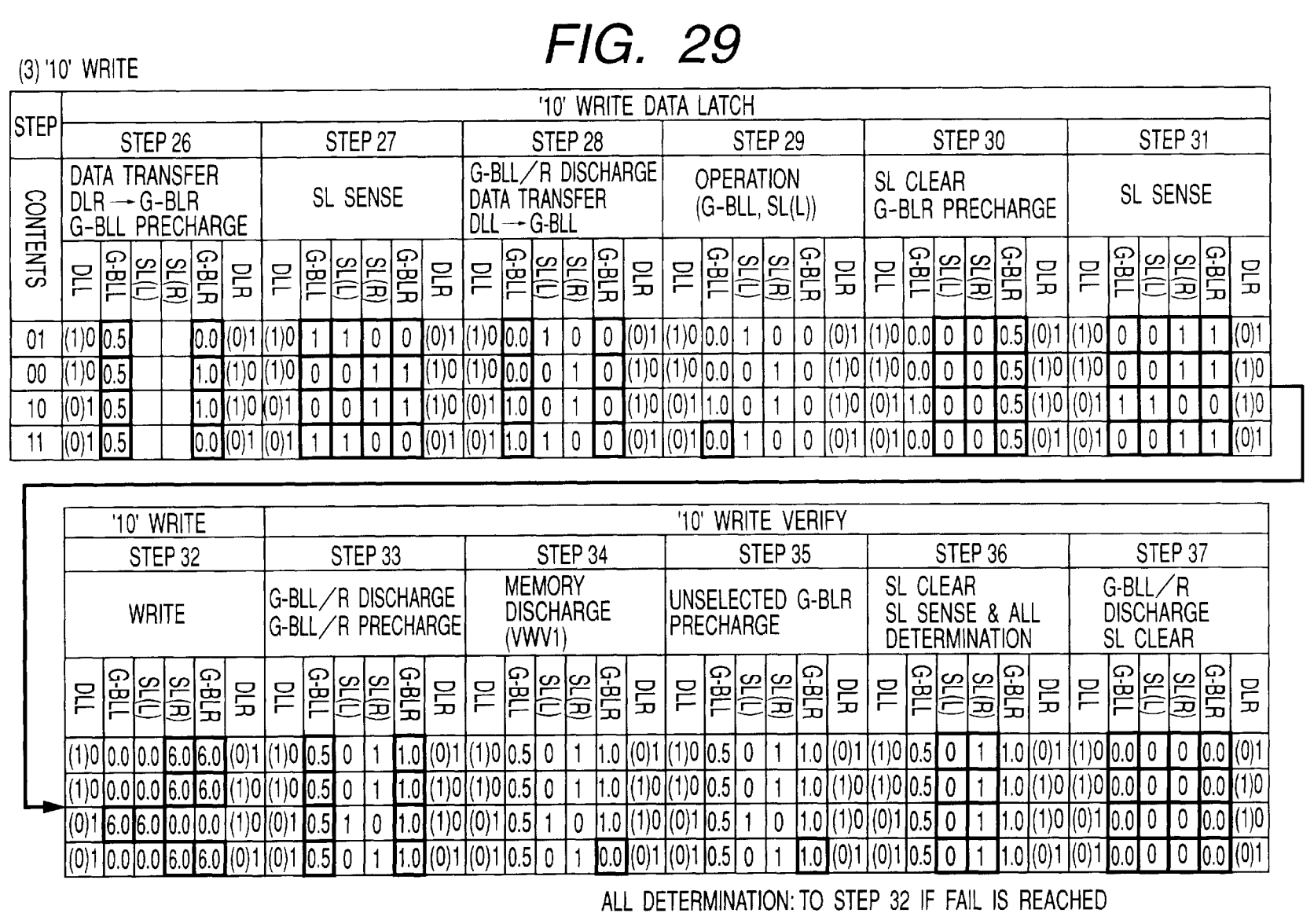

A detailed one example of the "00" write process is shown in FIG. 28. A detailed one example of the "10" write process is shown in FIG. 29. The contents of these processes are simply different from the "01" write process in terms of data latch processing. Since the difference therebetween can easily be understood from the arithmetic logic of FIG. 21, their detailed description will be omitted.

One example of the "11" word disturb detecting process is shown in FIG. 30. This process is roughly divided into "11" word disturb data latch processing of from Step 38 through Step 43, and "11" word disturb detecting processing of from Step 44 through Step 48. The "11" word disturb data latch processing is similar to the aforementioned data latch processing and is a specific process for implementing the arithmetic logic described in FIG. 21. Further, the "11" word disturb detecting processing is similar to the "01" write verify process described in FIG. 27 and is different therefrom in that, for example, a word disturb detecting voltage VWDS is used in place of the verify voltage VWV3. Therefore, its detailed description will be omitted.

Figure 31:
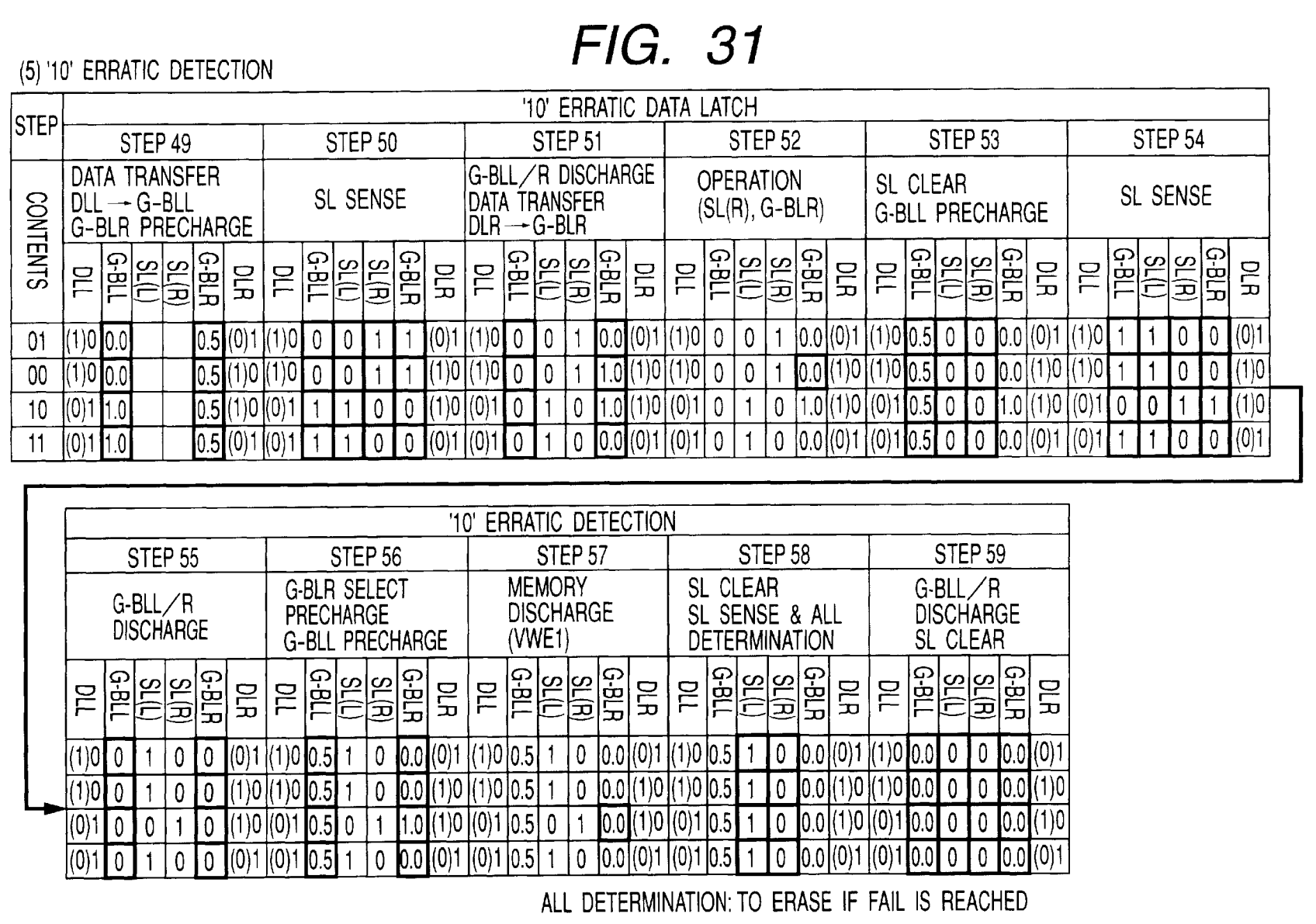
Figure 32:
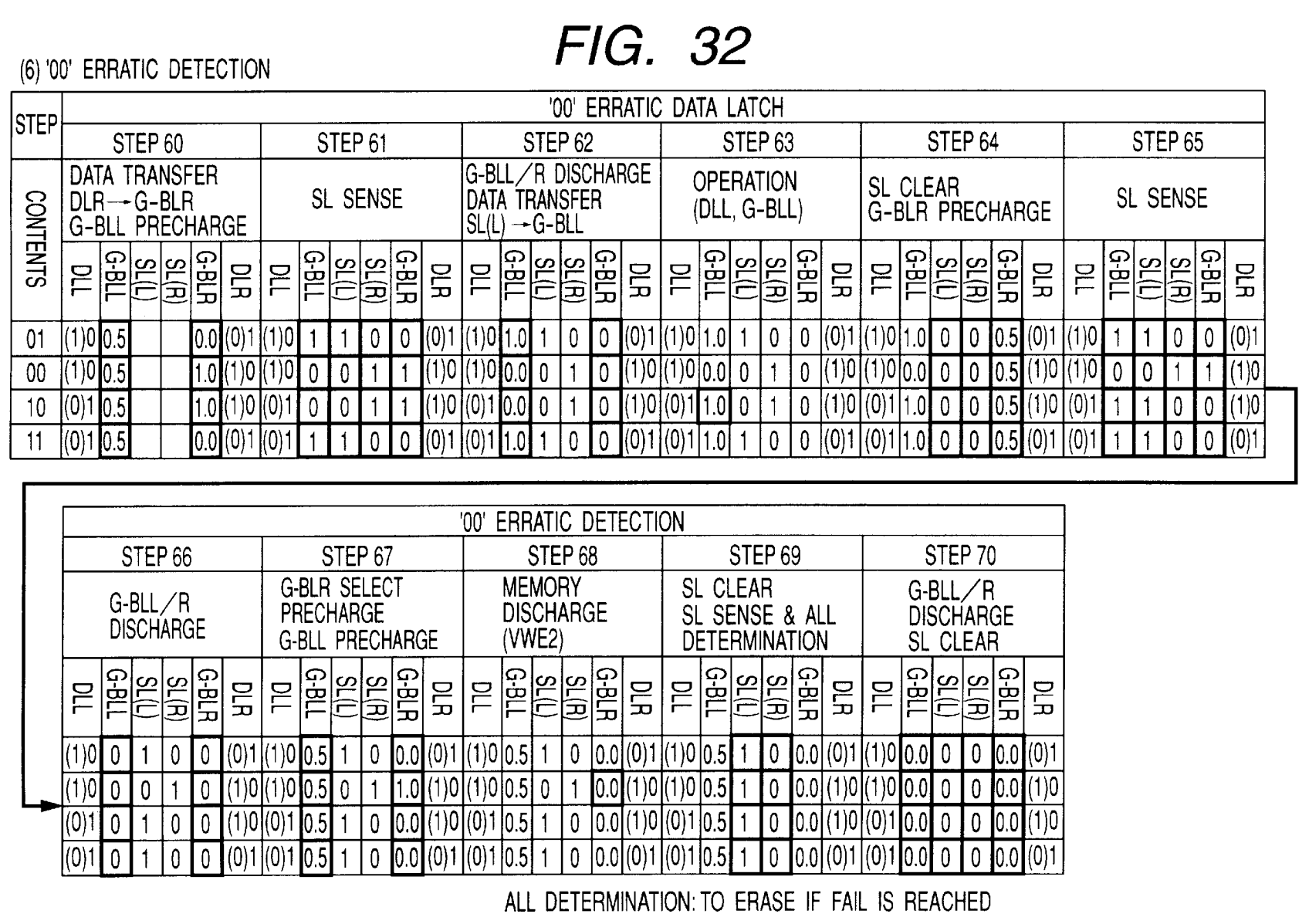

The details of the "10" erratic detecting processing are illustrated in FIG. 31 by way of example. The details of the "00" erratic detecting processing are illustrated in FIG. 32 by way of example. They are respectively roughly divided into erratic data latch processing and erratic detecting processing. The erratic data latch processing is similar to the aforementioned data latch processing and is a specific process for implementing the arithmetic logic described in FIG. 21. The erratic detecting processing is similar to the "01" write verify processing described in FIG. 27 and is simply different therefrom in that, for example, erratic detecting voltages VWE1 and VWE2 are used in place of the verify voltage VWV3. Therefore, its detailed description will be omitted.

<Additional Write Operation>>

A flowchart for the additional write operation is also shown in FIG. 15 in conjunction with the write operation. The additional operation is different from the write operation in terms of processes up to the "01" write process TS1. The additional write operation is also set as sector writing with a word line as one unit. When the flash memory accepts an additional write command, it takes in or captures the next input as a sector address, and brings an input subsequent to the capturing of the sector address to each of data latches DLL and DLR as write data (WS3). The captured sector address is an X address and one word line to which a write high voltage is applied, is selected thereby. The capturing of the write data is effected on the data latches DLL and DLR in byte units while progressively incrementing the Y-address counter 12 from its initial value. As shown in FIG. 6, for example, the write data are latched in the data latch arrays DLLA and DLRA assigned to the pair of memory mats MML and MMR related to one sense latch array SLA.

After the latching of the write data, a logic combining process WS4 and an erase-back process WS5 are carried out. Thereafter, the "01" write process TS1 through the erratic/disturb detecting process TS4 are performed.

The concept of the additional writing is shown in FIG. 23. Memory cells to each of which a write voltage is applicable upon additional writing, are defined as memory cells respectively held in an erase state. FIG. 23 shows the manner of information stored in the memory cells and data (logic values at input/output node on the bit-line connected side) latched in their corresponding data latches DLL and DLR.

Figure 23A:
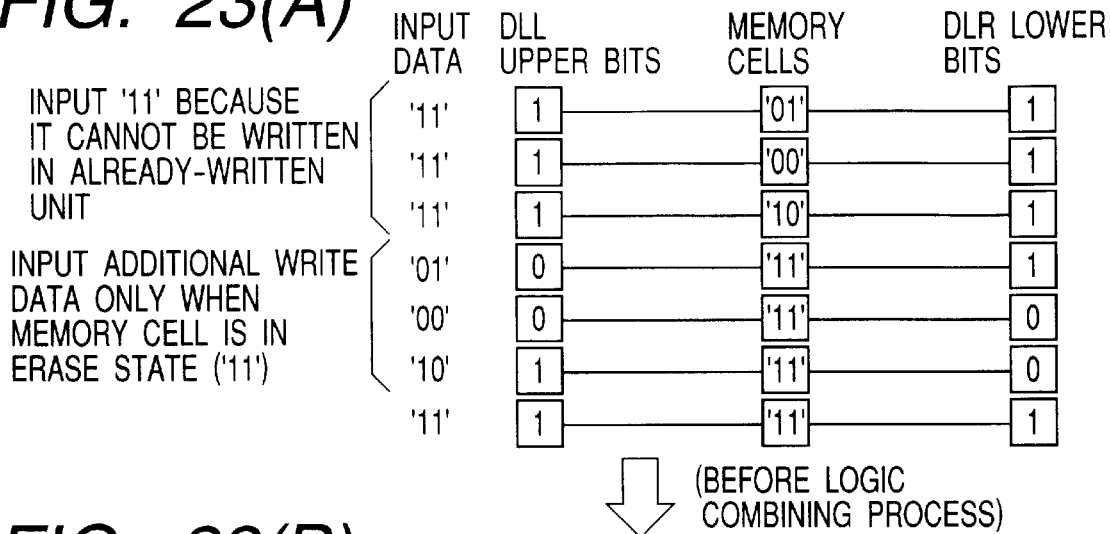
FIGS. 23A to 23C are explanatory views showing the concept of additional writing.

As shown in FIG. 23(A), the memory cells held in a write state are prohibited from being written, and data inputted thereto are limited to "11". Writing is allowed only for memory cells (having stored data "11" therein) each held in an erase state. Thus, the data "11" are inputted to their corresponding data latches DLR and DLL corresponding to the memory cells held in the write state, and desired write data "01", "00", "01" and "11" are inputted to their corresponding data latches DLR and DLL corresponding to the memory cells held in the erase state.

Figure 23B:
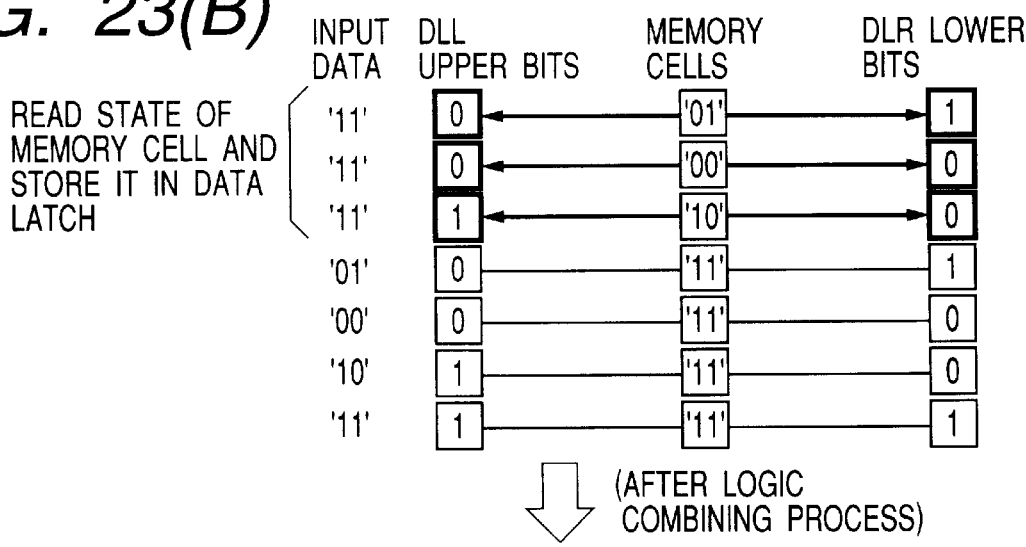
Figure 23C:
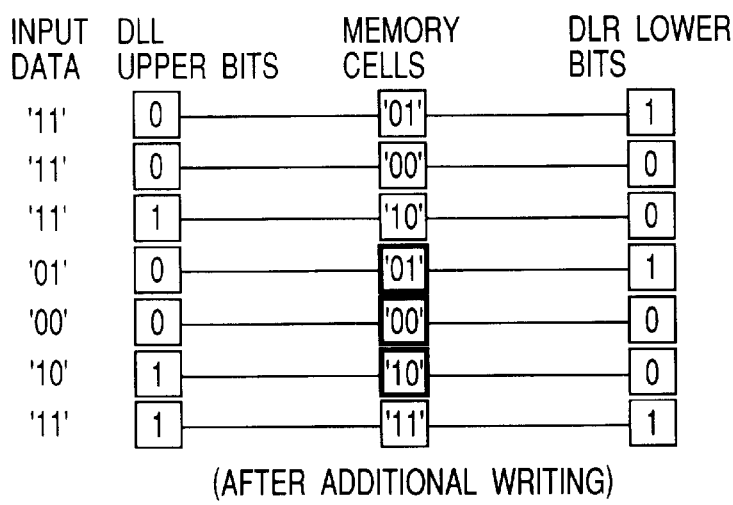

In the logic combining process, as shown in FIG. 23(B), data for programming the same write state into each of nonvolatile memory cells held in a write state and programming a write state specified by additional write data into each of nonvolatile memory cells held in an erase state are logically combined together. The data obtained by the logic combining process are latched in their corresponding data latches DLR and DLL. As shown in FIG. 23(C) by way of example, write processing is effected based on the d data latched in the data latches DLR and DLL.

Figure 17:
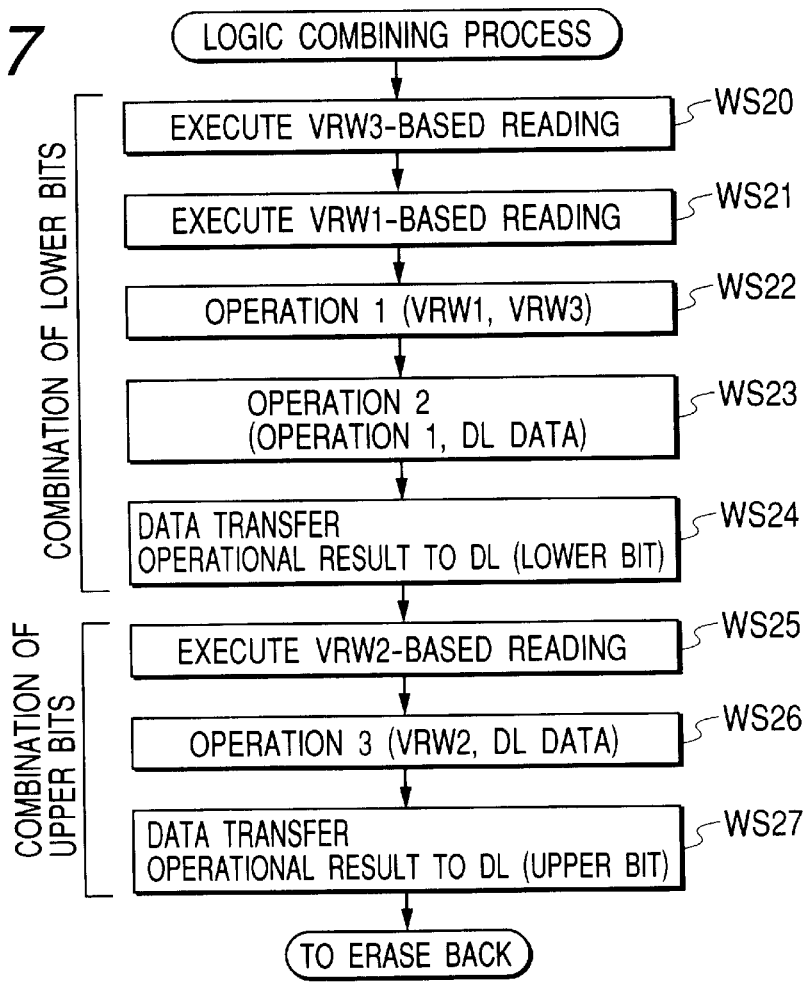
FIG. 17 is a flowchart illustrating one detailed example of a logic combining process included in the additional write operation.

A detailed flowchart for the logic combining process is illustrated in FIG. 17 by way of example. The combination of lower bits is carried out at the beginning of the logic combining process. Namely, word-line voltage VRW3-based read (WS20) is carried out to allow a sense latch to perform latching. Further, word-line voltage VRW1-based read (WS21) is carried out and an arithmetic operation 1 (exclusive OR or exclusive negative-OR operation) is effected on the result of reading by WS20 and the result of reading by WS21, whereby a lower bit for information read from a memory cell held in a write state is determined (WS22). Thereafter, an arithmetic operation 2 (OR operation) is effected on write data inputted to a data latch and the result computed in the arithmetic operation 1 to thereby determine a lower bit for logically-combined additional write data. The result thereof is transferred to the corresponding data latch DLR where it is latched (WS24). Upon combination of upper bits, word-line voltage VRW2-based read (WS25) is carried out to allow the corresponding sense latch to perform latching. An arithmetic operation 3 (exclusive OR or exclusive negative-OR operation) is effected on write data inputted to the corresponding data latch and the result of reading in WS25 (WS26) to thereby determine an upper bit for logically-combined additional write data. The result thereof is transferred to the corresponding data latch DLL where it is latched (WS27).

The contents of the lower and upper bits obtained in the logic combining process WS4 are represented by logical expressions in FIG. 24. In the same drawing, / is used as a logic inverted sign (corresponding to a sign which means that data marked therewith is logically inverted). On the drawing, signs marked with + within ○ are used as exclusive OR signs. In the specification, 'EXOR' is used as an exclusive OR sign. Sign · is used as an AND sign. The lower bit is obtained from a0·(b1 'EXOR'b3) and the upper bit is obtained from /a1 'EXOR'/b2. A0 indicates a lower bit for additional write data latched in a data latch circuit DLR, a1 indicates an upper bit for additional write data latched in a data latch circuit DLL, b1 indicates data read from the corresponding memory cell according to VRW1, b2 indicates data read from the corresponding memory cell according to VRW2, and b3 indicates data read from the corresponding memory cell according to VRW3.

Figure 25:
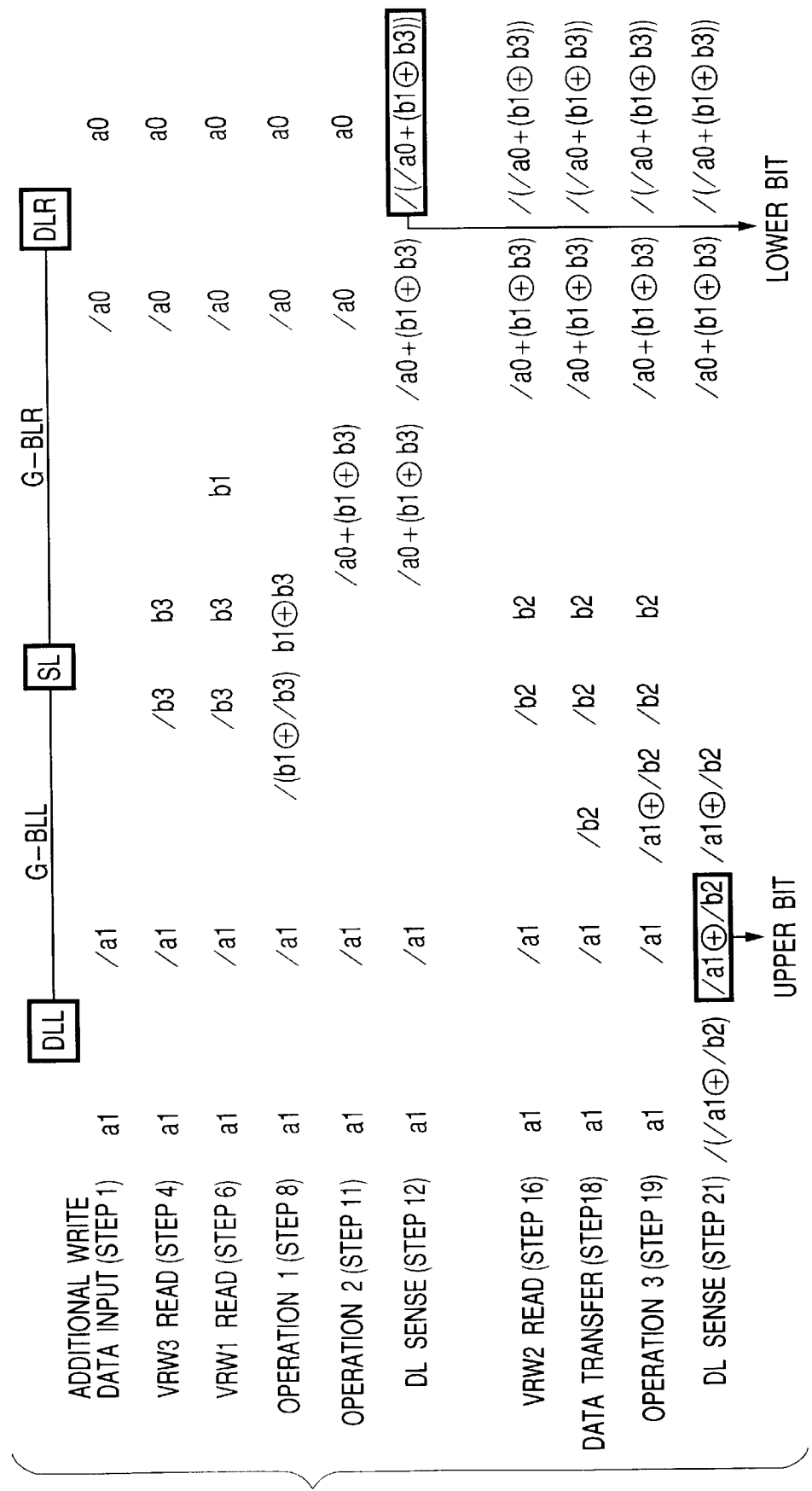
FIG. 25 is an explanatory view logically illustrating the operation for obtaining the result of FIG. 24 according to an additional write process.

Operations for obtaining the result of FIG. 24 according to the additional write processing are logically illustrated in FIG. 25. In the same drawing, the values of respective input/output nodes are shown on the rights and lefts of a sense latch SL, data latches DLL and DLR. In the same drawing, the result of VRW3-based reading is retained in the sense latch SL, and the result of VRW1-based reading is held at a bit line G-BLR. The data b3 latched in the sense latch SL and the data on the bit line G-BLR are exclusive-ORed b1'EXOR'b3 in an arithmetic operation 1. The lower bit a0 for the additional write data and the result of the arithmetic operation 1 are ORed in an arithmetic operation 2, which in turn is latched in the data latch DLR as a lower bit for logically-combined additional write data. The ORing /(/a0+ (b1 'EXOR'b3)) is equivalent to a0·/(b1 'EXOR'b3) through an expression's modification. Next, data read /b2 and b2 obtained according to VRW2 read are held in the sense latch SL. The data /b2 is transferred to a bit line G-BLL and is exclusively ORed with additional write data /a1 according to an arithmetic operation 3, which in turn is latched in the data latch DLL as an upper bit for the logically-combined additional write data.

Figure 33:
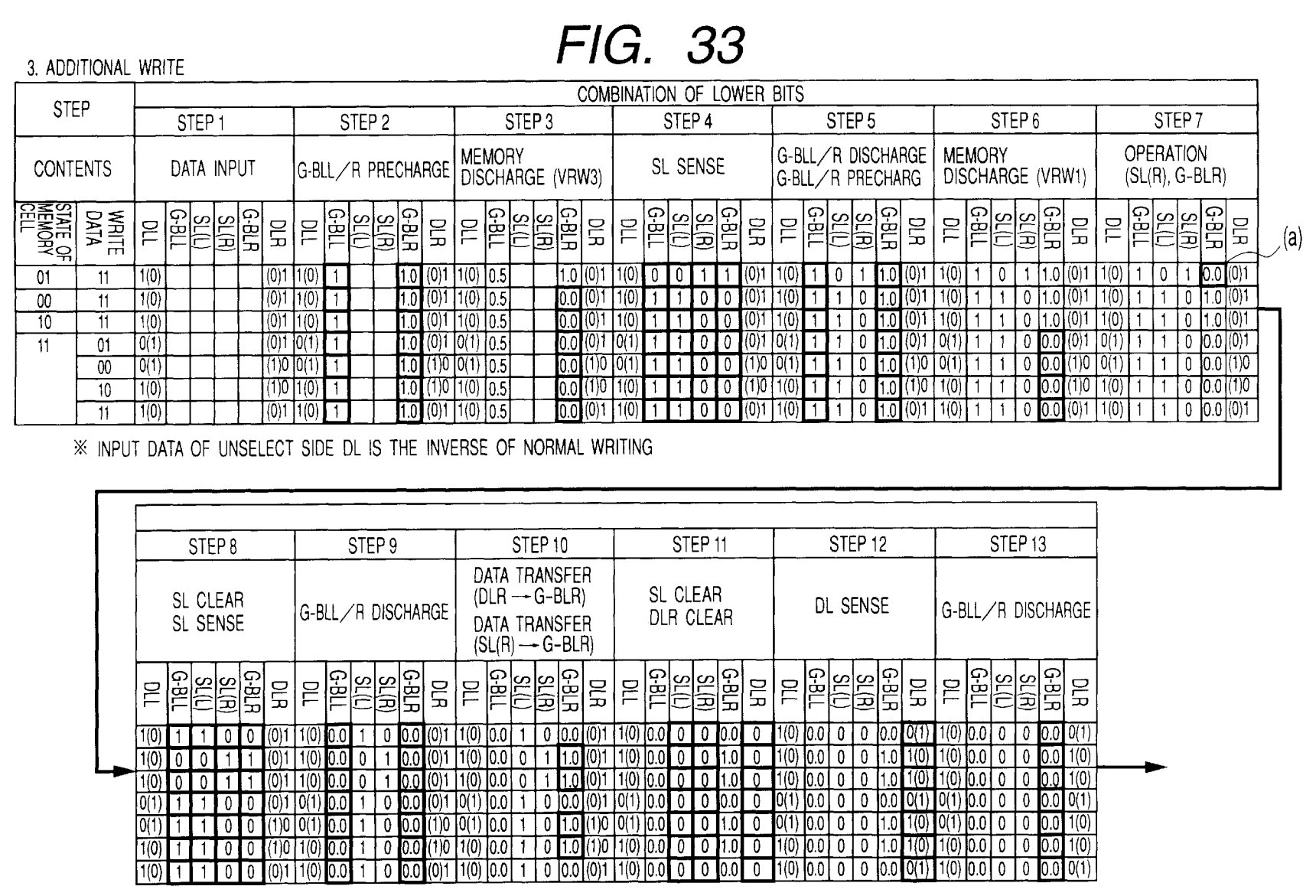
Figure 34:
FIG. 34 is an explanatory view depicting an additional write upper-bit combining process in detail.
Figure 36:
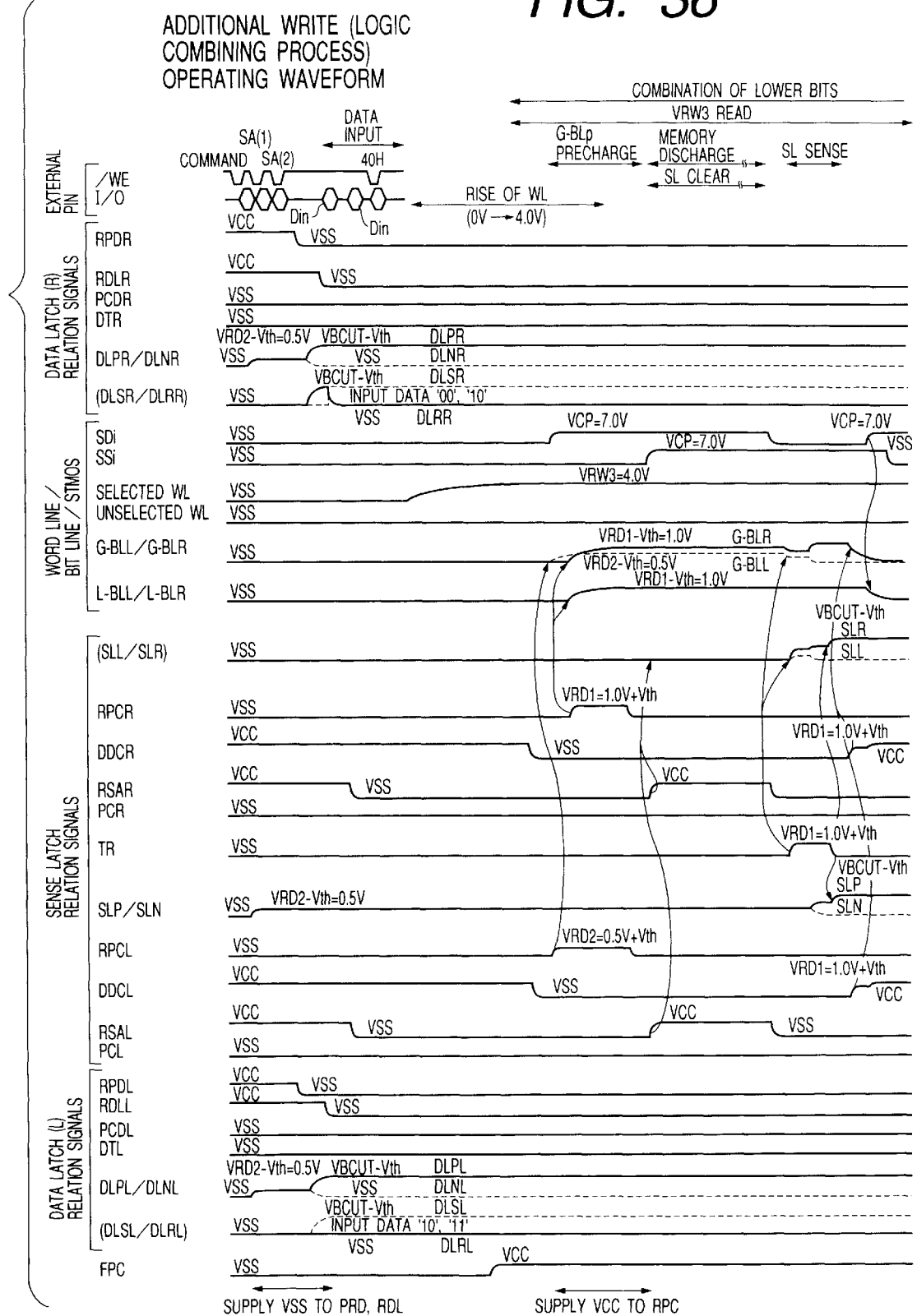
FIG. 36 is a timing chart showing some of an additional write logic combining process by operating waveforms.
Figure 37:
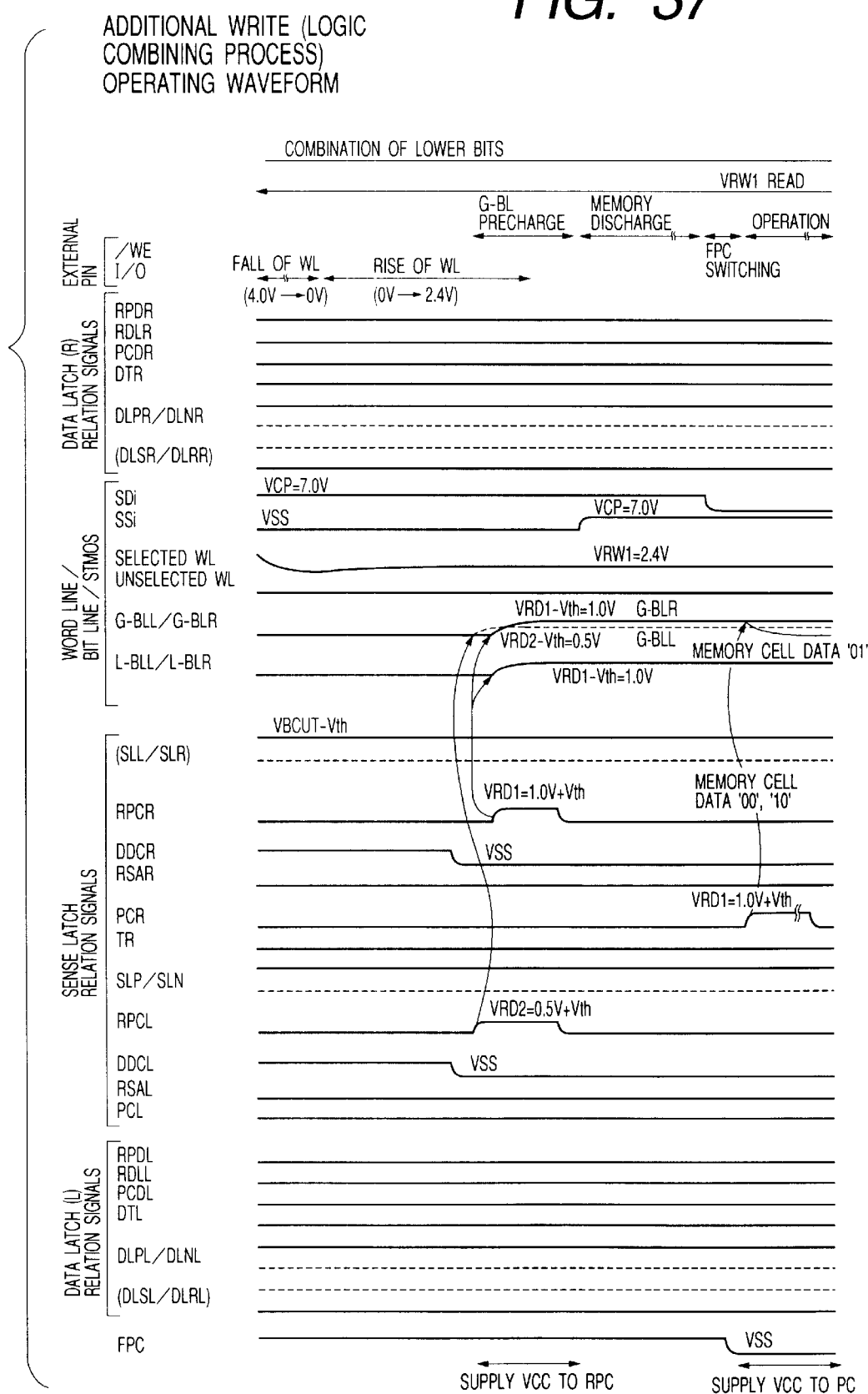
FIG. 37 is a timing chart illustrating some of the additional write logic combining process by operating waveforms following FIG. 36.
Figure 38:
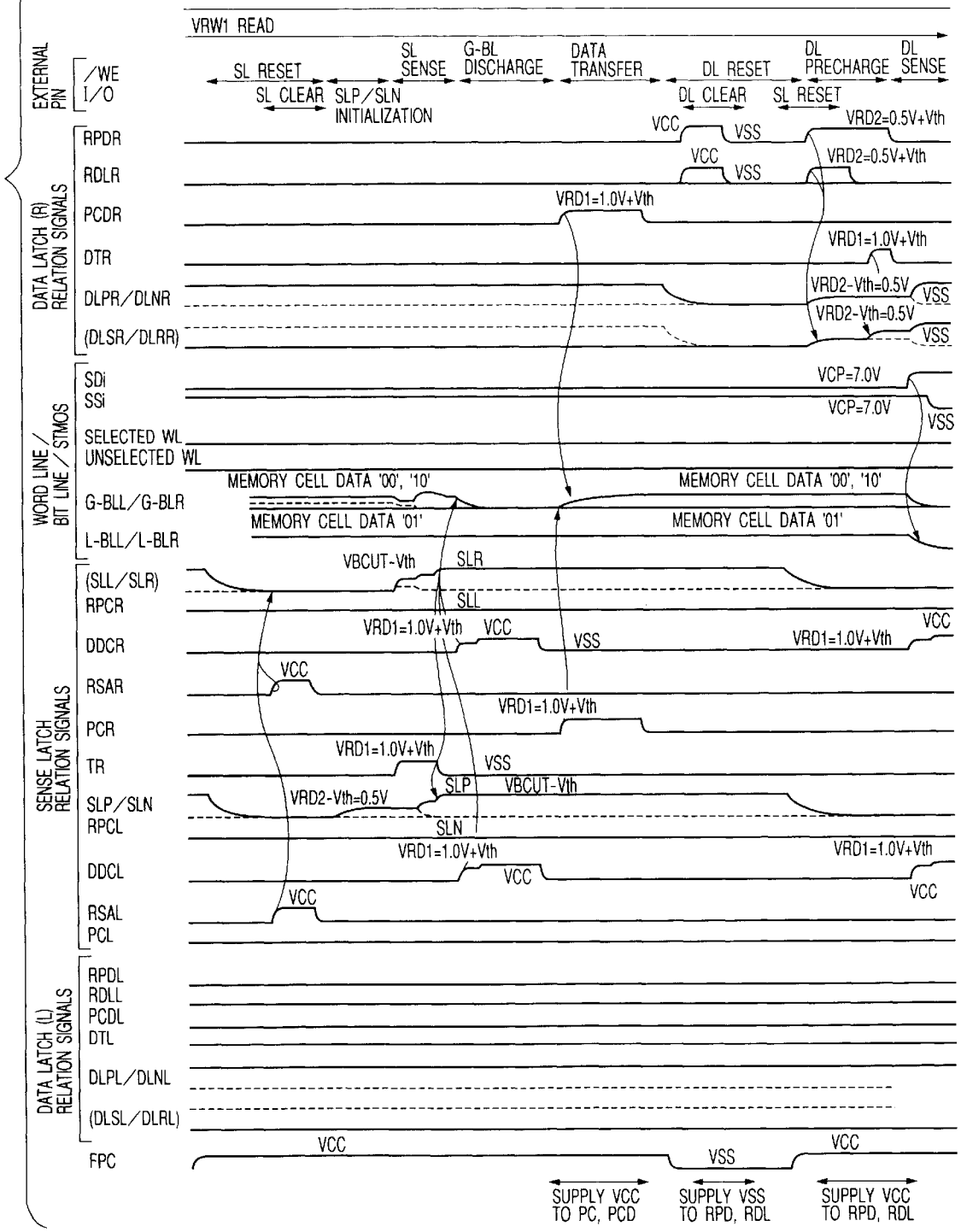
FIG. 38 is a timing chart depicting some of the additional write logic combining process by operating waveforms following FIG. 37.
Figure 39:
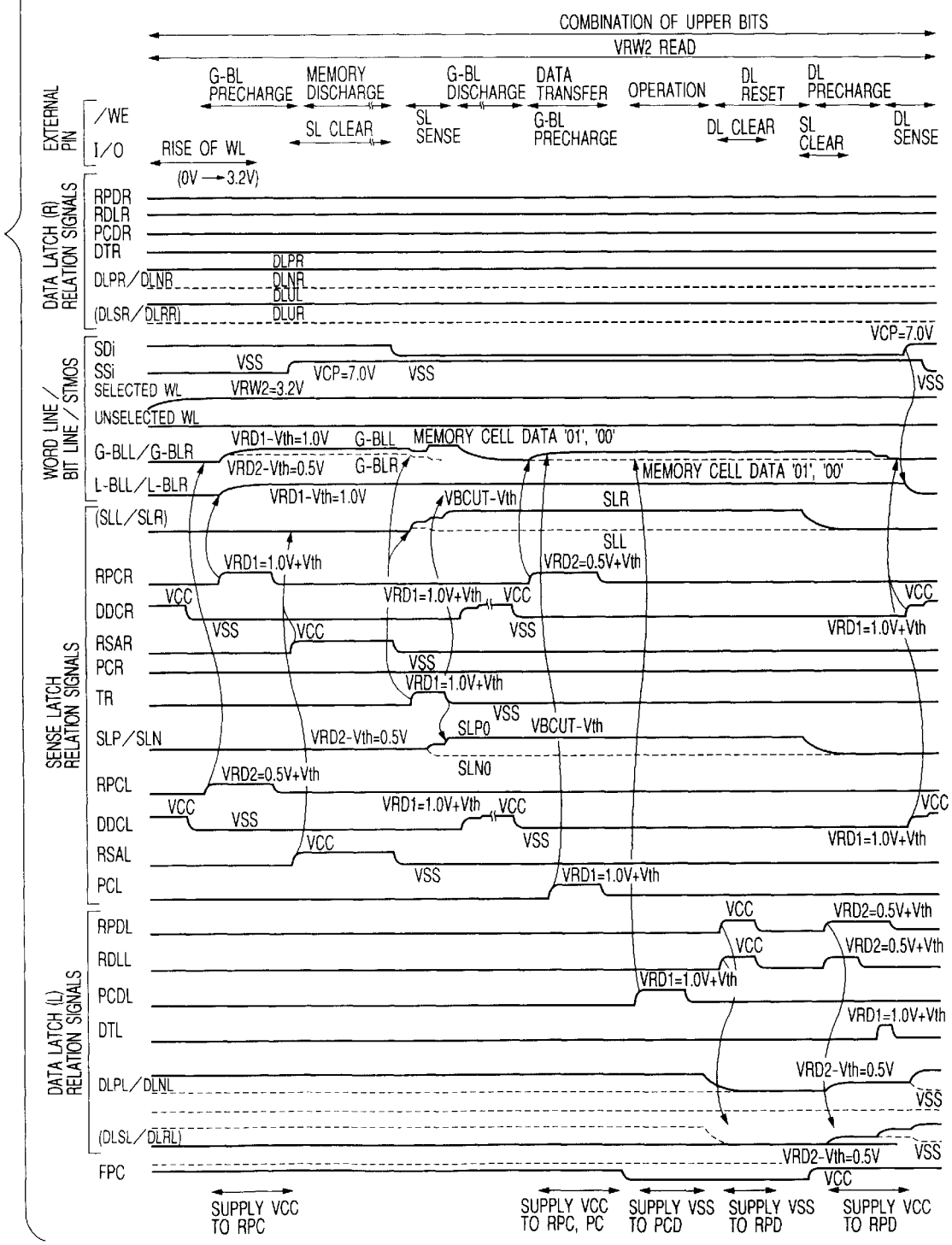
FIG. 39 is a timing chart showing some of the additional write logic combining process by operating waveforms following FIG. 38.

A further detailed operation flowchart for the additional write processing is illustrated in FIGS. 33 and 34. Expressive formats shown in the same drawings are similar to FIG. 26. Incidentally, the numbers of Steps described in FIG. 25 correspond to Step numbers described in FIGS. 33 and 34 in terms of processing.

2-bit write data are latched in their corresponding data latches DLL and DLR (Step 1). All of seven types of combinations (combinations described in FIG. 23) of information stored in memory cells and additional write data stored therein will be described in the drawings. Data inputted to the data latch DLL on the non-selected memory mat side at this time is inverted in logic value as compared with the normal writing. This is done to reduce the number of subsequent processing steps. In Step 2, 1V is precharged to each bit line G-BLR on the operation selected memory mat side, and 0.5V for reference is precharged to each bit line G-BLL on the operation non-selected memory mat side in order to read data. In Step 3, the reading of data from the corresponding memory cell is carried out with a voltage VRW3 between a threshold voltage of "01" data and a threshold voltage of "00" data as a word-line selection level. Bit lines for each memory cell having a threshold voltage distribution of data other "01" data are discharged. The result thereof is sensed by and latched in a sense latch SL (Step 4).

Next, the bit lines G-BLR and G-BLL are discharged in Step 5. Thereafter, 1V is precharged to the bit lines G-BLR on the operation selected memory mat side, and 0.5V for reference is precharged to the bit lines G-BLL on the operation selected memory mat side. In Step 6, the reading of data from each memory cell is carried out with a voltage VRW1 placed between a threshold voltage of "10" data and a threshold voltage of "11" data as a word-line selection level. Bit lines for each memory cell having a threshold voltage distribution of "11" data are discharged. The result thereof is sensed by and latched in the corresponding sense latch SL (Step 6). In Step 7, a value at an input/output node SLR of each sense latch SL and a value at each bit line G-BLR are exclusive-ORed. The exclusive ORing is executed by turning on a transistor M20R when the value at the input/output node SLR of the sense latch SL is "1" and thereby determining whether the bit line G-BLR corresponding to "1" is discharged to "0" toward FPC. Such discharge occurs in (a) of FIG. 33. Thus, a lower bit for data read from each memory cell is determined, which in turn is latched in the corresponding sense latch SL in Step 8.

Next, the bit lines G-BLR and G-BLL are discharged in Step 9. In Step 10, a lower bit for logically-combined additional write data is thereafter produced. Namely, the data latched in the sense latch SL and the data latched in the data latch DLR of the memory mat on the operation selection side are transferred to the corresponding bit line G-BLR, whereby the ORing of the lower bit for the data read from the memory cell and a lower bit for additional write data initially loaded into the data latch DLR is obtained. The result of ORing is defined as a lower bit for logically-combined additional write data. After the sense latch SL and the data latch DLR are cleared in Step 11, the lower bit for the logically-combined additional write data on the bit line G-BLR is latched in the corresponding data latch DLR in Step 12. In Step 13, the bit line G-BLR is cleared for the next operation. The term clear means the discharge to a ground potential or "0".

The next operation is an upper-bit combining process. In order to read data, in Step 14, 1V is first precharged to each bit line G-BLR on the operation selected memory mat side and 0.5V for reference is precharged to each bit line G-BLL on the operation non-selected memory mat side. In Step 15, a voltage VRW2 lying between a threshold voltage of "10" data and a threshold voltage of "00" data is used as a word-line selection level to perform data reading of each memory cell. Bit lines for each memory cell having threshold voltage distributions of "11" data and "10" data are discharged. The result thereof is sensed by and latched in the corresponding sense latch SL in Step 16.

Next, the bit lines G-BLR and G-BLL are discharged in Step 17. Thereafter, the value at the input/output node SLL on the non-selected memory mat side, of each sense latch SL is transferred to the corresponding bit line G-BLL in Step 18. In Step 19, a value at each data latch DLL and a value at each bit line G-BLL are exclusive-ORed. The exclusive ORing is executed by turning on a transistor M26L when a value at an input/output node DLLR of each data latch DLL is "1" and thereby determining whether the bit line G-ELL corresponding to "1" is discharged to "0" toward FPC. Such discharge occurs in (b) of FIG. 34. Thus, the exclusive ORing of an upper bit for the data read from the memory cell and an upper bit for additional write data initially loaded in the corresponding data latch DLL is obtained. The result of the exclusive ORing is defined as an upper bit for logically-combined additional write data. In Step 20, the sense latch SL and the data latch DLL are cleared. Thereafter, the upper bit for the logically-combined additional write data on the bit line G-BLL is latched in the corresponding data latch DLL in Step 21. In Step 22, the bit line G-BLL is cleared for the next operation.

Figure 18E:
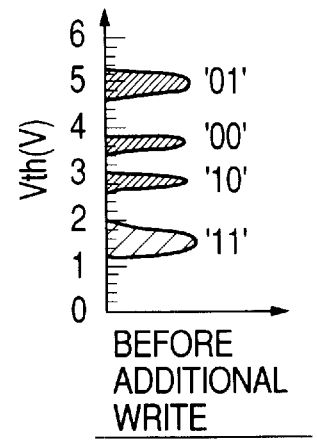
Figure 18F:
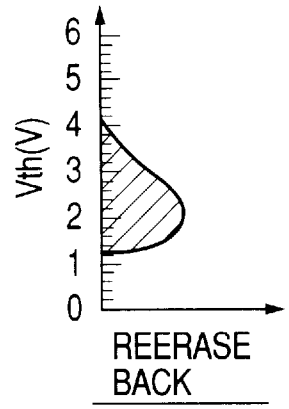

After the upper and lower bits for the logically-combined additional write data have been latched in the data latches DLL and DLR, erasure-back is effected on a sector intended for writing (Step 23). Thereafter, a write process using the data latched in the data latches DLL and DLR is carried out. The write process is connected to Step 2 in FIG. 27. The erasure-back is a kind of erase operation for reducing threshold voltages of all memory cells lying within the sector for writing to avoid the influence (undesired rise in threshold voltage in the present example) due to word disturb. The normal erase operation is a process for repeating the application of an erase voltage and erase verify until all the memory cells intended for erasure reach less than a threshold voltage constantly. In the case of an erasure-back process, however, a desired object can be achieved by performing an erase voltage applying process once alone. The erase voltage may be identical to that for the normal erase operation. A threshold voltage distribution prior to additional write is shown in FIG. 18(E), whereas a threshold voltage distribution subsequent to the execution of the erasure-back process is illustrated in FIG. 18(F) by way of example.

FIGS. 36 through 39 respectively show one example illustrative of diagrams for describing operating waveforms subjected to a logic combining process at additional write.

<<Erase Operation>>

One example of an erase operation is shown in FIG. 19. Although not restricted in particular, the erase operation can also be performed with a sector as a minimum unit. When the flash memory accepts an erase command, it captures the next input as a sector address. The captured sector address is an X address. One word line for applying an erase voltage is selected according to the X address. When the erase operation is specified, an erase verify operation (erase verify 1) is first carried out (ES1). When erasure is specified to a sector held in an erase state, an erase time can be shortened except for needless operations. When no erasure is specified, an erase voltage is applied to the sector intended for erasure (ES2) and an erase verify operation (erase verify 2) is effected thereon (ES3). The erase voltage applying process is repeated until the erase verify passes (until the threshold voltage reaches VEV or less). When the erase verify has passed, a "11" erratic detection is carried out (ES4). When the erratic detection has failed, a write bit is set (ES5), and selective write is executed until write verify (ES7) passes (ES6). After the write verify (ES7) has passed, the "11" erratic detection is effected on the corresponding write (ES8). When the "11" erratic detection has failed, the erase operation is re-executed from the beginning until the number of times that the "11" erratic detection is carried out, reaches a predetermined number of times.

Figure 20A:
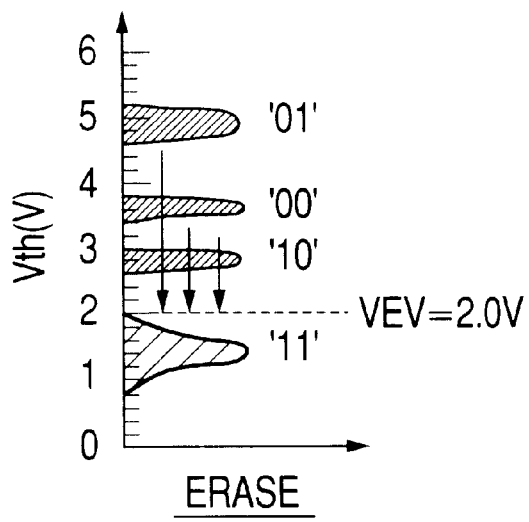
FIGS. 20A and 20B are explanatory views depicting an erase voltage applying process based on an erase operation and a deplete preventing process in the form of a threshold voltage distribution of the flash memory cell transistor.

A verify voltage VEV for erase verify processing with respect to a write state, and a threshold voltage distribution based on an erase operation are shown in FIG. 20(A).

Figure 20B:
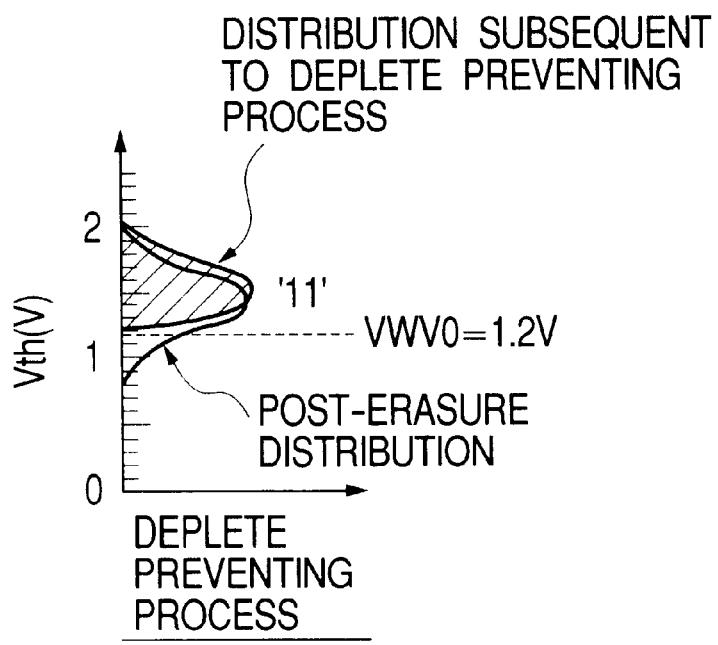

When overerasure is detected by the erratic detection (ES4), the process of ES5 through ES7 is defined as a deplete preventing process for modifying its over-erased state. One example of a change in threshold voltage distribution according to the deplete preventing process is shown in FIG. 20(B). The erratic detection indicated by ES8 is one for detecting an undesired rise in threshold voltage due to word-line disturb produced by the writing in ES6. When abnormality of the threshold voltage due to the disturb is detected, the erase operation is re-done from the application of the erase voltage.

A further detailed operation flowchart of erase processing is shown in FIG. 35. An expressive format shown in the same drawing is identical to that in FIG. 26. In the same drawing, "11" is assumed to be a memory cell whose threshold voltage is less than or equal to VEV according to the application of an erase voltage. "Below 11" is supposed to be a memory cell whose threshold voltage is less than or equal to VWV0, i.e., a memory cell intended for a writeback process for deplete prevention.

In the erase verify 1, 1V is first precharged to each bit line G-BLR on the operation selected memory mat side and 0.5V for reference is precharged to each bit line G-BLL on the operation non-selected memory mat side (Step 1). The corresponding memory cell on the operation selected memory mat side is selected with the verify voltage VEV as 2.0V, for example. If the selected memory cell is not in an erase state, then the bit lines on the operation selected memory mat side are not discharged (Step 2). The sense latch SL senses this state and performs all determination (Step 3). The example shown in the drawing indicates the case in which no memory cells are in the erased state. After all determination, the bit lines G-BLR and G-BLL and the sense latch SL are cleared (step 4). If the result of determination by the erase verify 1 indicates the uncompletion of erasure, then an erase voltage is applied to each memory cell of a sector intended for erasure (Step 5).

In an erase verify 2, first of all, 1V is precharged to the corresponding bit lines G-BLR on the operation selected memory mat side, and 0.5V for reference is precharged to the corresponding bit lines GBLL on the operation non-selected memory mat side (Step 6). The corresponding memory cell on the operation selected memory mat side is selected with the verify voltage VEV as 2.0V, for example. If the selected memory cell is in an erase state, then each bit line on the operation selected memory mat side is discharged (Step 7). The corresponding sense latch SL senses this state and performs all determination (Step 8). The example shown in the drawing indicates the case in which each memory cell is in the erase state. After all determination, the bit lines G-BLR and G-BLL and the sense latch SL are cleared (step 9).

Next, a "11" erratic detection is carried out. First of all, 1V is precharged to the corresponding bit lines G-BLR on the operation selected memory mat side, and 0.5V for reference is precharged to the corresponding bit lines G-BLL on the operation unselected memory mat side (step 10). Further, the corresponding memory cell on the operation selected memory mat side is selected with an erratic detection voltage VWV0 as 1.2V, for example. If the selected memory cell is in an overerased state, then the corresponding bit line thereof is discharged (Step 11). The corresponding sense latch SL senses this state and performs all determination (Step 12).

Since the discharge is performed at a portion indicated by (a) in the example shown in the drawing, the result of all determination in Step 12 is defined as fail. In such a case, a write process for deplete prevention is executed. Whether the application of the write voltage in the present write process is done, is determined according to the value latched in the sense latch SL in Step 12. The sense latch operation in Step 12 is defined as one example of the write bit setting process (ES5) of FIG. 19. In Step 13, an input/output node SLR on the operation selected memory mat side of the sense latch SL serves so as to supply a write blocking voltage (6.0V) to the corresponding bit line corresponding to a logic "1", whereby selective writing is performed (Step 13). Next, 1V is precharged to the corresponding bit lines G-BLR on the operation selected memory mat side, and 0.5V is precharged to the corresponding bit lines G-BLL on the operation unselected memory mat side for the purpose of verify (Step 14). The corresponding memory cell on the operation selected memory mat side is selected with a write verify voltage VWV0 as 1.2V, for example. If the selected memory cell is in an overwritten state, then the corresponding bit lines therefor are discharged (Step 15). The sense latch SL senses this state and performs all determination (Step 16).

Finally, 1V is precharged to the corresponding bit lines G-BLR on the operation selected memory mat side and 0.5V for reference is precharged to the corresponding bit lines G-BLL on the operation unselected memory mat side in order to perform a "11" erratic detection according to "11" word disturb (Step 17). Further, the corresponding memory cell on the operation selected memory mat side is selected with a disturb detection voltage VWDS as 2.3V, for example. If the threshold voltage of the selected memory cell is less than or equal to the disturb detection voltage VWDS, then the corresponding bit lines therefor are discharged (Step 18). The sense latch SL senses this state and performs all determination (Step 19). The example of Step 19 indicates the case in which no memory cells are under the influence of disturb, and corresponds to a state in which the "11" erratic detection ES8 of FIG. 19 has passed. Finally, the sense latch SL and the bit lines G-BLL and G-BLR are cleared.

Various voltage conditions set every operation modes or forms of the flash memory described above are illustrated in FIG. 12. In FIG. 12, a word line voltage for reading "11" data is 2.4V, a word line voltage for reading "10" data is 3.2V, and a word line voltage for reading "00" data is 4.0V. A "10" data write word line voltage is 15.1V, a "00" data write word line voltage is 15.8V, and a "01" data write word line voltage is 17.0V. A "10" data verify word line voltage is 2.8V, a "00" data verify word line voltage is 3.6V, and a "01" data verify word line voltage is 4.5V. A "11" word disturb detecting voltage is 2.3V, a "10" erratic detecting voltage is 3.1V, and a "00" erratic detecting voltage is 3.9V.

<<Flash Memory Card>>

Figure 40:
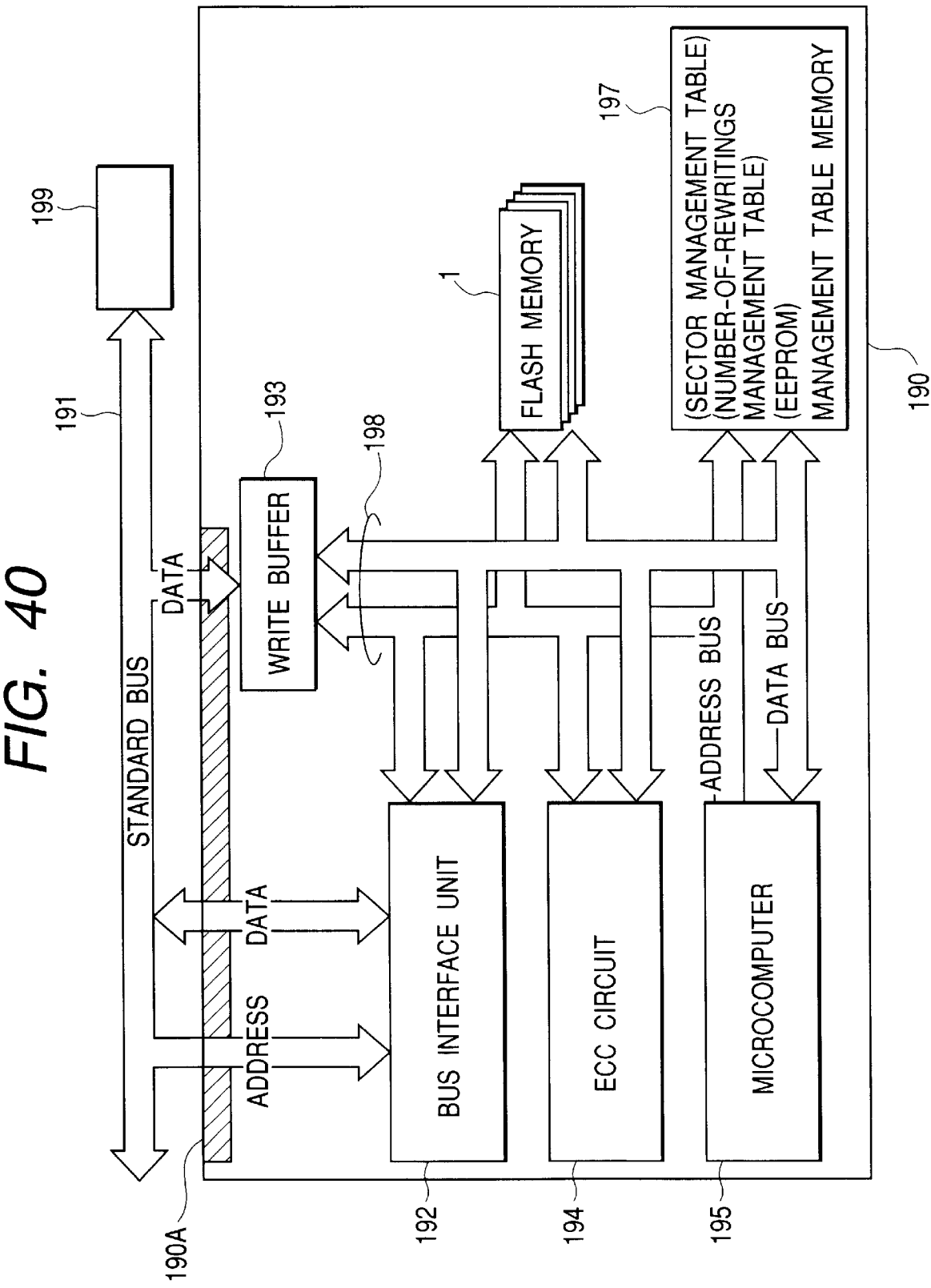
FIG. 40 is a block diagram of a file memory system using four-value flash memories.

A block diagram showing one example of a file memory system using each of the flash memories 1 is shown in FIG. 40. Although not restricted in particular, designated at numeral 190 is a flash memory card brought into PC card form, which is a kind of ATA (AT Attachment) card. Although not restricted in particular, the flash memory card 190 can detachably be mounted via a connector 190A to a computer 199 such as a personal computer or the like through a standard bus 191 based on IDE (Integrated Device Electronics).

The flash memory card 190 has a bus interface unit 192, a write buffer 193, an ECC circuit 194, a microcomputer 195, at least one flash memory 1, and a management table memory 197. They are commonly connected to an internal bus 198.

The bus interface unit 192 performs interface control with the standard bus 191 so as to comply with the specifications of the ATA card or the like. The write buffer 193 is a data buffer for temporarily storing write data supplied from the standard bus 191. The data stored in the write buffer 193 is written into the flash memory 1. The ECC circuit 194 is a circuit having an error detecting and error correcting function for improving the accuracy of data stored in the flash memory 1. The management table memory 197 comprises an electrically rewritable or programmable semiconductor memory like, for example, a flash memory or an EEPROM and has a sector management table and the like formed therein. The microcomputer 195 controls the interior of the card over its entirety according to an access request to the flash memory card 190 and issues operation instructions and the commands to the flash memory 1, for example, to thereby access-control the flash memory 1 and control the management table memory 197.

According to the flash memory, memory card and data processing system described above, the following operations and effects can be obtained.

[1] Write data supplied from outside is latched in each of data latches DLL and DLR. To which threshold voltage in a multivalue the latched write data corresponds is determined every write operations in plural stages. Write information indicative of the result of determination is latched in each sense latch SL. Write operations for setting multi-valued threshold voltages to memory cells are carried out stepwise according to the write information latched in the sense latch SL. Accordingly, even if the write operations are completed, the write data supplied from outside at first remain in the data latches DLL and DLR. Thus, even when the operation of writing of the multi-information to each memory cell MC is performed again according to the result of the word disturb detection or erratic detection, it is not necessary to receive the write data from outside again.

[2] A flash memory 1 performs additional writing through the input WS3 of additional write data, a process WS4 for logically combining data read from each memory cell and the additional write data, erasure-back WS5 and write TS1 through TS4. The logic combining process WS4 serves so as to generate data for programming the same write state into each of nonvolatile memory cells held in a write state and programming a write state specified by the additional write data into each of nonvolatile memory cells held in an erase state, based on the additional write data inputted to their corresponding data latches DLR and DLL and the data read from the memory cell MC, and to latch the generated data in the data latches DLR and DLL. Thus, even if the additional write operation is completed, the logically-combined data remains in each of the data latches DLR and DLL. If the data about the result of logic combining processing is held in each of the data latches DLR and DLL till the completion of each write operation, then the latched data can be reused for write abnormality, and there is no need to receive write data from outside again where the additional write operation is performed again. Thus, a processor or the like for access-controlling the flash memory 1 may not hold write data in a work memory or the like for a while after the write operation for the flash memory. Further, the memory access for the flash memory 1 or the efficiency of data processing incident to the memory access can be improved.

[3] Prior to the execution of writing into each nonvolatile memory cell in accordance with the data about the result of logic combining processing latched in the data latches DLR and DLL after the latching of the data obtained by the logic combining process into the data latches DLR and DLL, erase operations (erasure back, soft or weak erasure) are effected on each non-volatile memory cell intended for the write operation in advance, whereby the states of the memory cells placed immediately before the additional writing can substantially be kept uniform as the erase states even in the case of the additional writing. It is therefore possible to abolish a restriction on the number of additional writings within a range of rewrite resistance characteristics and improve the reliability of the additionally-written data.

[4] A decision as to whether the state of a threshold voltage based on the application of a write voltage has reached a target threshold voltage state, is made using the data latched in the data latches DLL and DLR every time for each write voltage applying process (WS12, WS13). Therefore, even if it is erroneously determined that the threshold voltage has reached a desired threshold voltage according to a write verify operation in a write initial stage or the like, its failure is confirmed and rewriting is allowed.

[5] Executing an erratic/disturb detection after writing allows the detection of abnormality of a threshold voltage distribution due to the writing.

[6] When it is desired to store information in each nonvolatile memory cell in multi-value form, a word disturb detection having high possibility that the erratic/disturb detection will fail as an overwritten state, is first performed, whereby a processing time spent up to the detection of the state of fail where it fails, can be shortened.

[7] Writeback is effected on memory cells each held in an over-erased state for the purpose of deplete prevention after erasing, thereby making it possible to match the threshold voltages of the memory cells in the erase state to a predetermined voltage or higher. Further, the execution of the disturb detection after the execution of the writeback for the deplete prevention makes it possible to detect the abnormality of a threshold voltage. Owing to these, distributions of the threshold voltages of the memory cells held in the erase state can be uniformed.

[8] An erase verify is performed before erasing and erasing is effected only on a failed sector, whereby a needless time for the erase operation can be saved.

[Embodiment 2]

A flash memory according to the present invention will be described. The flash memory to be described below is different from the prior art in that data latch processes in respective write processes of "01", "00" and "10" are greatly simplified. The differential points will centrally be described below.

<<Input Decode of Write Data>>

Figure 42:
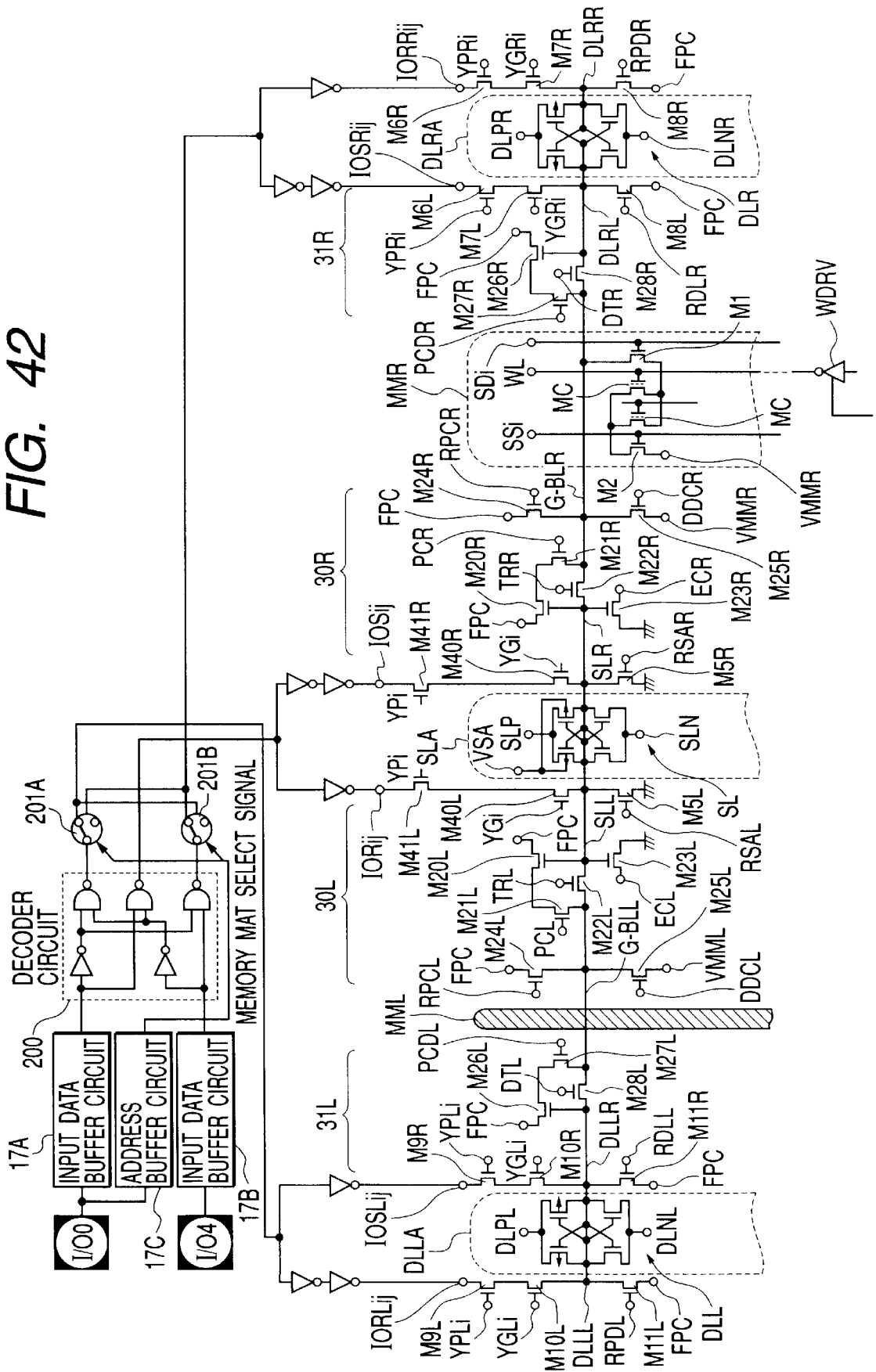
FIG. 42 is a circuit diagram illustrating the details of a memory array employed in the flash memory according to the present invention.

The details of a memory array employed in the flash memory according to the present invention are illustrated in FIG. 42 by way of example. The point of difference between FIG. 42 and FIG. 1 resides in that a circuit 200 for decoding write data is provided to generate write control data and connected to the data latches DLL, DLR and sense latch SL. The decoder circuit 200 shown in FIG. 42 is a circuit which is associated with external input/output terminals corresponding to 2 bits for I/O0 and I/O4. The circuit is supplied with 2-bit write data through input data buffer circuits 17A and 17B and decodes the supplied 2 bits according to predetermined logic. The outputs outputted from the decoder circuit 200 are supplied to the data latches DLL and DLR and the sense latch SL according to inverse and non-inverse differential signals through selectors 201A and 201B. The selectors 201A and 201B are respectively supplied with a predetermined 1 bit of an address signal regarded as a memory mat select signal from an address buffer 17C. The selection of the outputs by the selectors 201A and 201B is carried out based on the 1 bit. The data latch DLL receives the differential signals sent from the selectors 201A and 201B at terminals IORLij and IOSLij, and the data latch DLR receives the differential signals sent from the selectors 201A and 201B at terminals IOSRij and IORRij. The sense latch receives the differential signals sent from the selectors 201A and 201B at terminals IOSij and IORij. It should be understood that the input buffers 17A through 17C are included in the input buffer 17 shown in FIG. 2, the decoder circuit 200 is included in the data control circuit 16 shown in FIG. 2, and the selectors 201A and 201B are included in the data control circuit 16 shown in FIG. 2. Incidentally, M40L, M41L, M40R and M41R respectively indicate column selection MOS transistors on the sense latch SL side. Although not illustrated in the drawing, circuits corresponding to other external input/output terminals I/O1 through I/O3 and I/O5 through I/O7 are also configured in a manner similar to the above.

The logic of generating control data by the decoder circuit is illustrated in FIG. 43 by way of example. FIG. 43 illustrates, as an example, logic for input data of 2 bits sent from the input/output terminals I/O0 and I/O4. This logic complies with such a rule that write selection and unselection respectively correspond to selection when the data latched in the sense latch SL is "0" and non-selection when it is "1". When write data is "01" upon the selection of a right mat, for example, "0" is latched in its corresponding input/output node SLR of the sense latch SL, "1" is latched in its corresponding input/output node DLLR of the data latch DLL, and "1" is latched in its corresponding input/output node DLRL of the data latch DLR. Similarly, when the write data is "00", "0" is latched in its corresponding input/output node DLLR of the data latch DLL. When the write data is "10", "0" is latched in its corresponding input/output node DLRL of the data latch DLR. In short, "01" write control data for specifying or designating "01" write selection/unselection is latched in the sense latch SL, "00" write control data for specifying "00" write selection/non-selection is latched in the data latch DLL, and "10" write control data for specifying "10" write selection/unselection is latched in the data latch DLR, respectively. Upon the selection of a left mat, points to latch write control data of "0" that means write selection, are mirror-symmetrical with respect to those at the selection of the right mat.

<<Write Operation>>

Figure 44:
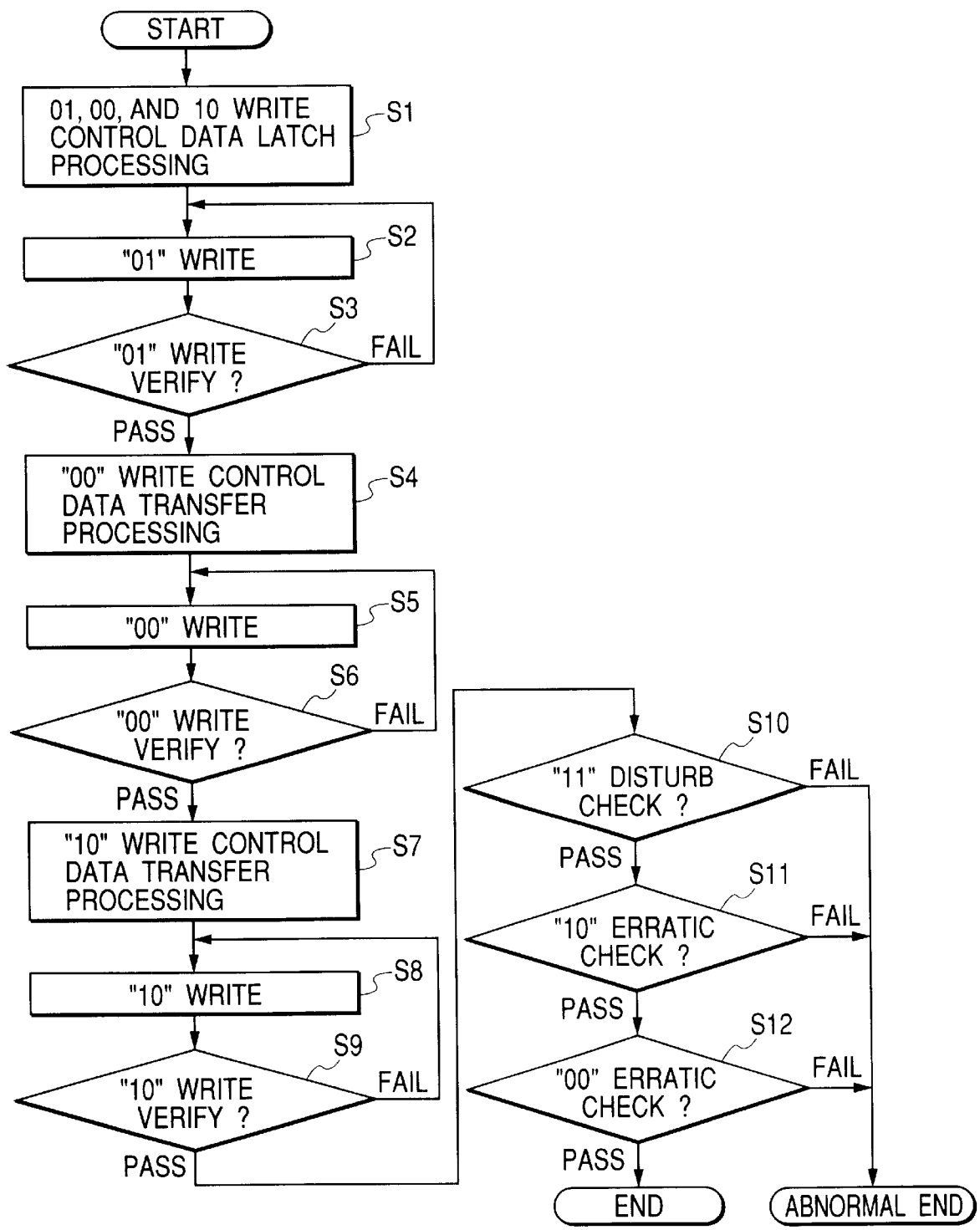
FIG. 44 is a flowchart illustrating a write operating procedure as an example.

A flowchart for a write operation is illustrated in FIG. 44 by way of example. A control circuit, e.g., the mode control circuit 18 illustrated in FIG. 2 performs control on an operation procedure shown in the same drawing. FIG. 44 illustrates, as an example, the case in which the memory mat on the right side is defined as a mat intended for writing and Case 1 of FIG. 10 is adopted as the turn for writing.

Referring to FIG. 44, "01", "00" and "10" write control data are respectively latched in the sense latch SL and data latches DLL and DLR every 2 bits of write data in association with one another in Step S1. Next, a 01 write process (S2) corresponding to a logic value of "01" write control data supplied to the sense latch SL is carried out. A "01" write verify process corresponding to it is carried out (S3). When the "01" write control data is of a logic value "0", the "01" write process (S2) performs the application of a write voltage, whereas when it is of a logic value "1", the "01" write process (S2) restrains the application of the write voltage. The "01" write verify process is carried out according to the all determination using the verify voltage VWV3 of FIG. 18. The processes of Steps S2 and S3 are identical to those of Steps 8 through 13 described in FIG. 27. The 01 write data latch processing of Steps 2 through 7 described in FIG. 27 is absolutely unnecessary.

Next, the "00" write control data is transferred from the data latch DLL to the sense latch SL (S4). This transfer may be simple information transfer. A "00" write process (S5) corresponding to the "00" write control data logic value supplied to the sense latch SL is carried out. A "00" write verify process corresponding to it is carried out (S6). When the "00" write control data is of a logic value "0", the "00" write process (S5) performs the application of a write voltage, whereas when it is of a logic value "1", the "00" write process (S5) restrains the application of the write voltage. The "00" write verify process (S6) is carried out according to the all determination using the verify voltage VWV2 of FIG. 18. The processes of Steps S5 and S6 are identical to those of Steps 20 through 25 described in FIG. 28. The "00" write data latch processing of Steps 14 through 19 described in FIG. 28 is absolutely unnecessary.

Next, the "10" write control data is transferred from the data latch DLR to the sense latch SL (S7). This transfer may be simple information transfer. A "10" write process (S8) corresponding to the "10" write control data logic value supplied to the sense latch SL is carried out. A "10" write verify process corresponding to it is carried out (S9). When the "10" write control data is of a logic value "0", the "10" write process (S8) performs the application of a write voltage, whereas when it is of a logic value "1", the "10" write process (S8) restrains the application of the write voltage. The "10" write verify process (S9) is carried out according to the all determination using the verify voltage VWV1 of FIG. 18. The processes of Steps S8 and S9 are identical to those of Steps 32 through 37 described in FIG. 29. The "10" write data latch processing of Steps 26 through 31 described in FIG. 29 is absolutely unnecessary.

Decoding the write data by the decoder circuit 200 upon the input of the data in this way makes it possible to reduce the time required to perform data latch processing which has heretofore been carried out by the data latches, sense latch and logic combining circuits 30L, 30R, 31L and 31L on the bit line.

Figure 45:
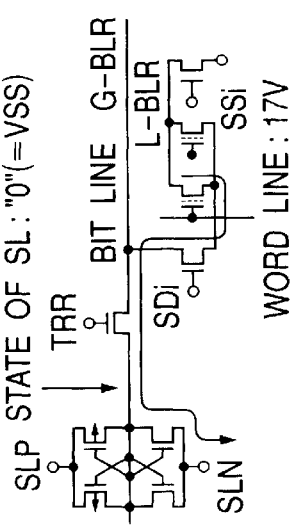
FIG. 45 is an explanatory view showing the state of a write operation at write selection based on write control information latched in a sense latch and the state of a write inhibiting operation at write unselection.

The states of write operations based on write select for write control information latched in the sense latch circuit SL, and write inhibiting operations based on a write unselection state are illustrated in FIG. 45 by way of example. An AND memory cell takes the memory cell structure having the control gate, floating gate, source and drain and has a structure wherein data writing is carried out by an FN tunnel. An AG-AND memory cell has an auxiliary gate in addition to a control gate and has a structure wherein the auxiliary gate is controlled to accelerate or decelerate a channel current to thereby enable hot carrier-writing.

<<Disturb/Erratic·Check>>

The verify operations (S3, S6 and S9) shown in FIG. 44 respectively result in a check of a lower limit of an intended threshold voltage distribution. In order to check for an upper limit of an intended threshold voltage distribution, the control circuit like the mode control circuit 18 performs a "11" disturb check (S10), a "10" erratic check (S11) and a "00" erratic check (S12) illustrated in FIG. 44.

Since the "01" write control data is latched in the sense latch SL in the input decode system, the threshold voltage of each memory cell is brought to an intended threshold voltage while write and verify operations are repeated, and correspondingly, the logic value of the write control data latched in the sense latch SL also changes. Thus, when the "01" write verify process of Step S3 in FIG. 44 is performed, the data latched in the sense latch SL having specified the "01" write select will disappear. As is apparent by reference to FIG. 43, the state in which the data latched in the sense latch SL at the "01" write is inverted from a write selection ("0") to a write non-selection ("1"), cannot be distinguished from the "11" write data where the data latched in the latches DLL, DLT and SL are merely seen. Since the "11" disturb check must make a decision as to the threshold voltage of each memory cell corresponding to the write data "11", a distinction must be made as to whether data written in each memory cell is "11" or "01". The "11" disturb check (S10) needs to perform its distinction and allow only the sense latch SL for the memory cell having regarded the write data as "11" to latch "0" data that means an operation selection, thereby carrying out a disturb check.

A flowchart for the "11" disturb check is illustrated in FIG. 46 by way of example. Whether or not the logic value of the data latched in the data latch DLL or the logic value of the data latched in the data latch DLR is "0", is first determined by a logical product operation, for example (S20). If the result of operation is of the logic "0", then the corresponding state of memory cell is found to be a "00" or "10" state.

Next, the state of the corresponding memory cell is read based on a read voltage Vrw2 (S21). This processing is a process for determining whether the corresponding state of memory cell is a "01" state. In the present process, as illustrated in FIG. 47 by way of example, the reading is carried out based on a word line voltage Vrw2 between the "00" state and the "10" state without performing the reading based on a word line voltage Vrw3 between the "01" state and the "00" state. This is done to improve the reliability of determination in consideration of the case in which a "01" threshold voltage distribution is hemmed up to a "00" threshold voltage distribution region as shown in FIG. 47 due to degradation of the reliability of writing. If the data read according to the process of FIG. 21 is of the logic value "0", then the corresponding state of memory cell is found to be the "01" state or "00". Thus, if the result of operation in Step S20 and the data read in Step S21 are ANDed and the result of ANDing is latched in the corresponding sense latch SL for the memory cell, then control data of the logic value "0" that means the operation selection for the sense latch SL, can be set only to the corresponding memory cell to be held in an erase threshold voltage state corresponding to a "11" state. Thus, all determination is thereafter made using a word line voltage VWDS as described in FIG. 18, whereby whether the threshold voltage state of the memory cell can be distinguished from the threshold voltage state of the "10" state higher than that in threshold voltage, in short, whether a "11" disturb error has occurred, can be determined. The control circuit like the mode control circuit 18 performs the processes of Step S20 through S23 by use of the logic combining circuits 30L, 30R, 31L and 31R.

The details of operations executed by the latches SL, DLL, DLR and logic combining circuits 30L, 30R, 31L and 31R for the "11" disturb check according to the flowchart of FIG. 46 are illustrated in FIG. 48 by way of example. The meaning of the signs shown in FIG. 48 is as described in FIG. 26, and the same drawing indicates the case in which an operation selected memory mat is defined as the right memory mat MMR. When the left memory mat MML is regarded as the operation selected mat, the value may be inverted from side to side with the center being placed between SL(L) and SL(R).

The process of obtaining ANDing or logical product in Step S20 can be implemented by operations of Steps 30 through 37 in FIG. 48. The process of Step S21 in FIG. 46 can be implemented by operations of Steps 38 and 39 in FIG. 48. The process of Step S22 in FIG. 46 can be implemented by operations of Steps 40 and 41 in FIG. 48. A process of Steps 42 through 45 in FIG. 48 can implement the process of Step S23 in FIG. 46.

In an "10" erratic check (S11), although not shown in the drawing in particular, "10" write control data held in the data latch DLR is internally transferred to the sense latch SL upon the selection of the right mat, whereas 10 write control data held in the data latch DLL is internally transferred to the sense latch SL upon the selection of the left mat. Further, a read operation using the word line selection level VWE1 in FIG. 18, and the all determining operation may be carried out.

Similarly, in a "00" erratic check (S12), "00" write control data held in the data latch DLL is internally transferred to the sense latch SL upon the selection of the right mat, whereas "00" write control data held in the data latch DLR is internally transferred to the sense latch SL upon the selection of the left mat. Further, a read operation using the word line selection level VWE2 in FIG. 18, and the all determining operation may be carried out.

<<Program Retry>>

When the control circuit like the mode control circuit 18 has detected write abnormality (write abnormal end) (fail) in the "11" disturb check (S10), "10" erratic check (S11) and "00" erratic check (S12) in FIG. 44, it may execute a program retry. At this time, the original "01" write control data of the sense latch SL, lost by the write operation must be restored.

The write abnormal end might occur in the course of the "01" write. In the abnormal end during the "01" write in particular, there is considered a state in which a "01" write completed (Pass→SL=1: non-intended for writing) memory cell and a "01" write uncompleted (Fail→SL=0: intended for writing) exit in mixed form. This manner is illustrated as a threshold voltage distribution of FIG. 49 by way of example.

Figure 50:
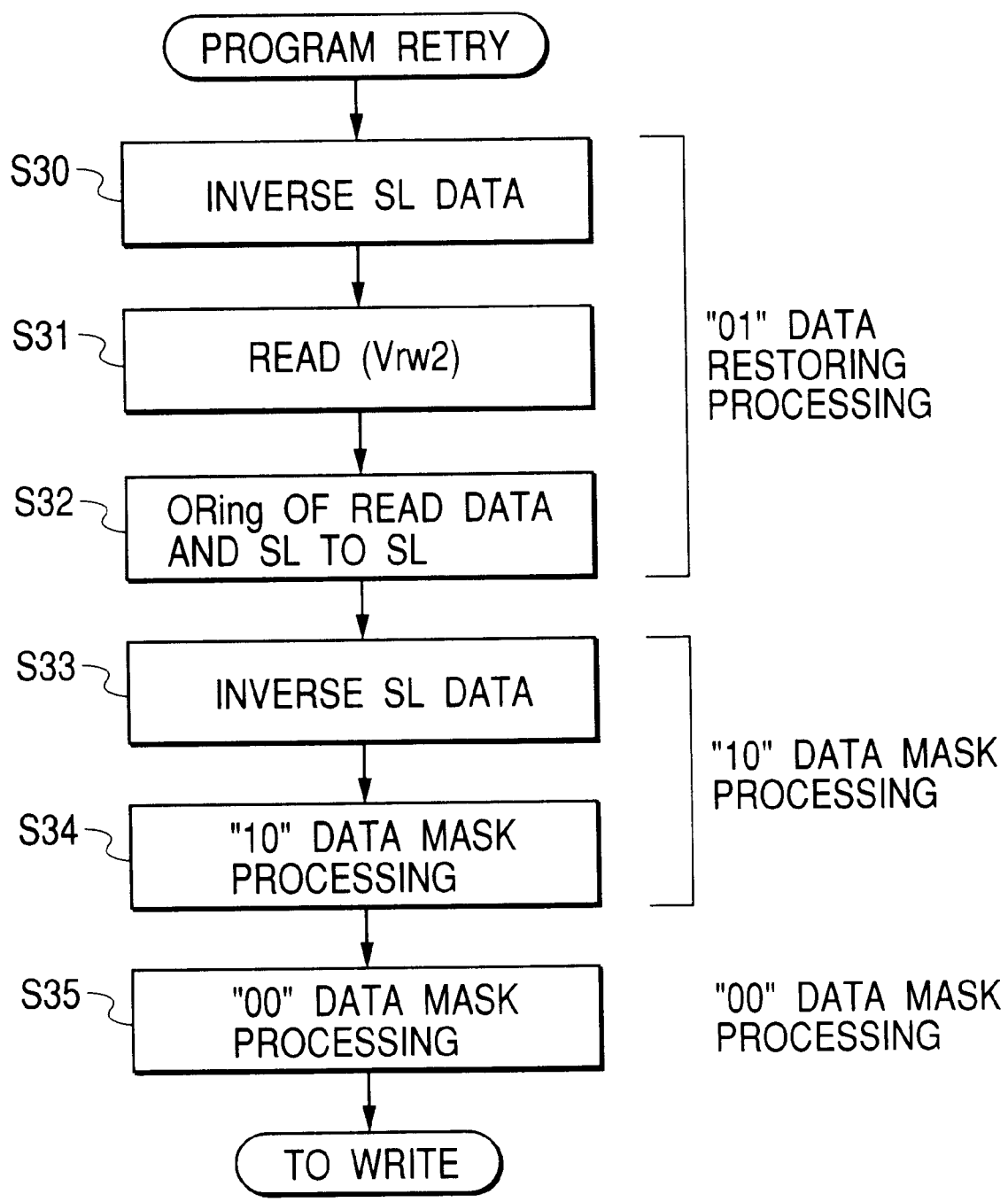
FIG. 50 is a flowchart illustrating, as an example, a procedure of a write control data restoration processing procedure for a program retry when the mixed state of Pass and Fail for "01" writing is taken into consideration.

A write control data restoring processing procedure for executing the program retry when the "01" write Pass and Fail mixed states are taken into consideration, is illustrated in FIG. 50 by way of example. The restoring process includes "01" data restoring processing of Steps S30 through S32, "10" data mask processing of Steps S33 and S34, and "00" data mask processing of Step S35.

The data stored in the corresponding sense latch SL is first inverted (S30). This process is a process effected on a logic value "1" to match data (logic value "0") latched in the sense latch SL in which the "01" write is regarded as uncompleted (Fail), with a subsequent logical operation. Next, the reading of each memory cell is performed by use of a word line selection level Vrw2 of FIG. 49 (S31). According to the read operation, the "01" write is completed (pass), and each memory cell holding no "11" erase state therein can be identified. Namely, data read into the corresponding bit line from such a memory cell is brought to the logic value "1". In Step S32, the read data in Step S31 and the value of the sense latch SL, which has been inverted in Step S30 in logic value, are ORed, and the result of ORing is latched in the corresponding sense latch SL. In short, information in which a "11" state is masked in the "01" write pass state, and information indicative of the "01" write Fail state held in the sense latch SL are ORed according to this processing, whereby the restoration of the "01" write control information and the mask processing of the "11" state are finished.

The "10" data mask processing is a process for, when the data latched in the sense latch SL is brought to completion while the logic value "0" remains as it is under the abnormal end during the "10" write processing, coping with it. Since the "01" write control information restored to the sense latch SL in Step S33 is of the value subjected to the logic-value inversion, the data latched in the sense latch SL is first subjected to the logic-value inversion in Step S33. Next, the "10" data mask processing (S34) is carried out. According to this processing, when, for example, an accessed memory mat corresponds to the right mat, the data latched in the data latch DLR is read into the corresponding bit line. When it is of a logic value that means write instructions, the data latched in the sense latch SL is forcedly set to the logic value "1". If not so, then the data latched in the sense latch SL is maintained as it is.

The "00" data mask processing is a process for, when the data latched in the sense latch SL is brought to completion while the logic value "0" remains as it is under the abnormal end during the "00" write processing, coping with it. In the "00" data mask processing (S35), when, for example, an accessed memory mat corresponds to the right mat, the data latched in the data latch DLL is read into the corresponding bit line. When it is of a logic value that means write instructions, the data latched in the sense latch SL is forcedly set to the logic value "1". If not so, then the data latched in the sense latch SL is maintained as it is.

As described above, the "01" data having disappeared can be restored for the program retry. After its restoration, the write process of FIG. 44 may be resumed by using the write control data latched in the sense latch SL and data latches DLL and DLR.

Although not restricted in particular, when the number of times the abnormal end is made, has not reached a predetermined number of times, each nonvolatile memory cell indented for program processing is the same as the immediately preceding program processing when the above program processing is resumed. In short, a write retry is executed inside a semiconductor device.

Although not restricted in particular, when the number of times the abnormal end is made, has reached the predetermined number of times, each nonvolatile memory cell indented for program processing is newly specified. In short, it is specified or designated by a new write sector address or the like supplied together with the retry command sent from outside the semiconductor device such as the host device or the like as described above.

Figure 51:
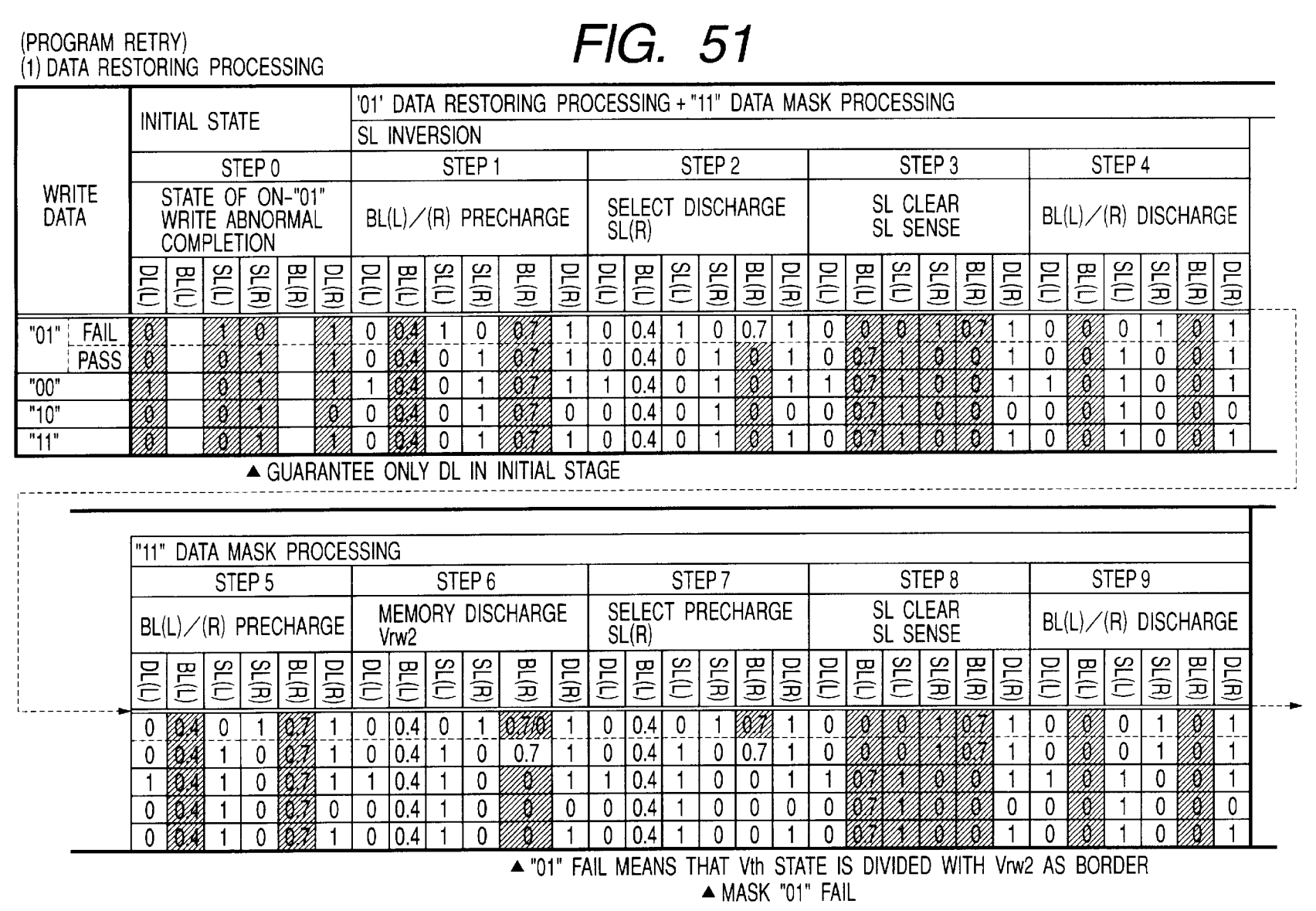
Figure 52:
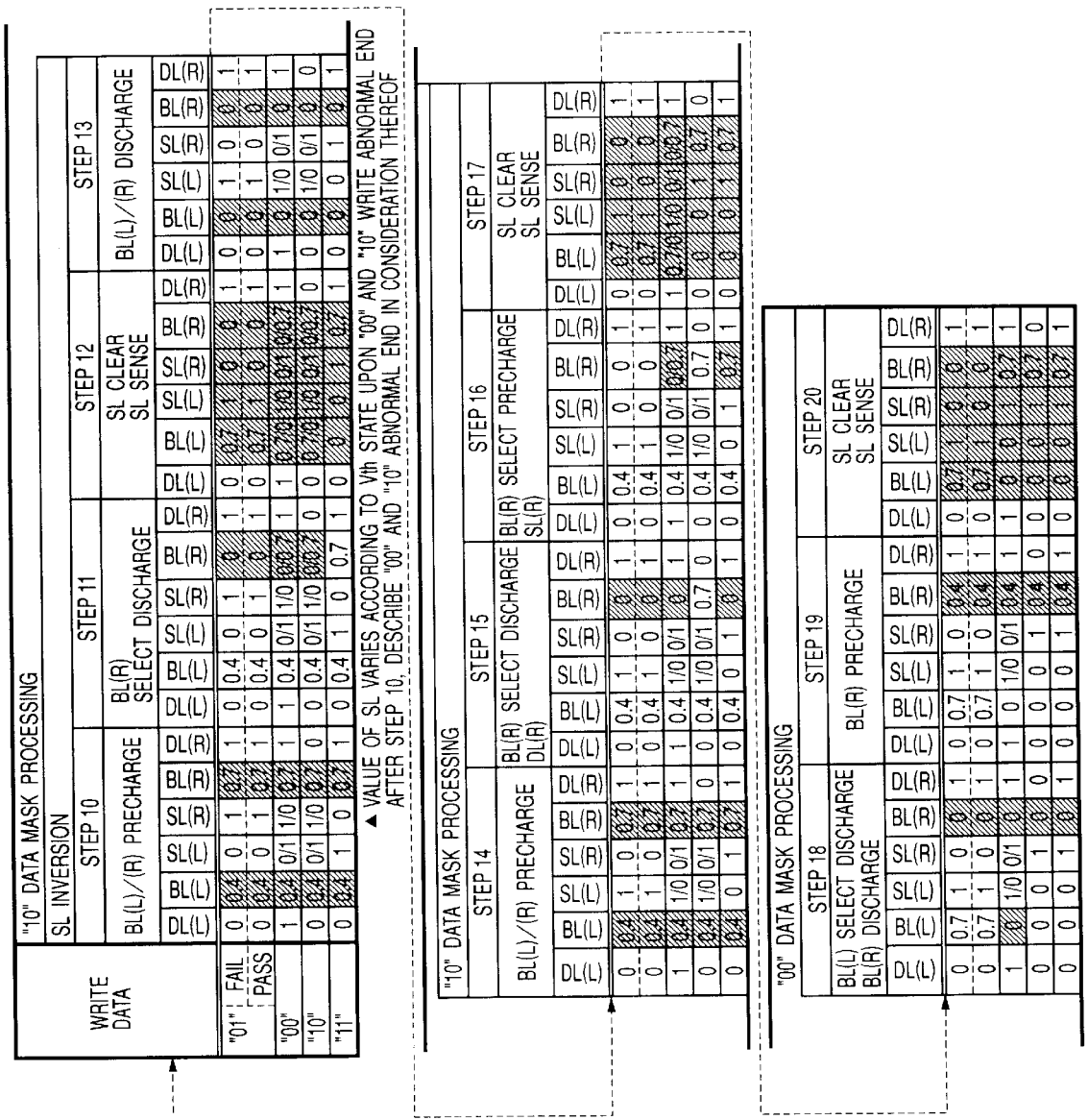
FIG. 52 is an explanatory view showing the latter half of the data restoration processing procedure for the program retry according to the flowchart of FIG. 50.

The details of operations of the latches SL, DLL and DLR, and logic combining circuits 30L, 30R, 31L and 31R in the data restoring process for the program retry according to the flowchart of FIG. 50 are illustrated in FIGS. 51 and 52 by way of example. The meanings of signs shown in FIG. 51 are as described above.

The SL data inverting process (S30) of FIG. 50 can be implemented by the operations of Steps 1 through 4 in FIG. 51. The processes of Steps S31 and S32 in FIG. 50 are feasible by the operations of Steps 5 through 9 in FIG. 52. The SL data inverting process (S33) of FIG. 50 can be achieved by the operations of Steps 10 through 13 in FIG. 52. The process of Step S34 in FIG. 50 can be implemented by the process of Steps 14 through 17 in FIG. 52, and the process of Step S35 in FIG. 50 is feasible by the process of Steps 18 through 20 in FIG. 52.

<<Data Recovery>>

When the control circuit like the mode control circuit 18 has detected write abnormality (write abnormal end) (fail) in the "11" disturb check (S10), "10" erratic check (S11) and "00" erratic check (S12), it may execute a data recovery.

A flowchart for a data recovery read operation is illustrated in FIG. 53 by way of example. Even in this case, the original "01" write control data of the sense latch SL, which has been lost by the write operation, must be restored. Therefore, the processes (S30 through S35) for the program retry of FIG. 50 are first executed, and the "01" write control data is restored (S40). Thereafter, write data represented in 2-bit units are restored based on the restored latched data of the sense latch SL and the latched data of the data latches DLL and DLR. The restored upper bit is latched in one data latch DLL, and the restored lower bit is latched in the data latch DLR (S41 and S42), after which they can be outputted to the outside.

The details of a write data restoring process are illustrated in FIG. 54 by way of example. A process for restoring the "01" write control data is omitted from the drawing. The process of Step S41 in FIG. 53 can be implemented by operations of Steps 0 through 5 in FIG. 54. The process of Step S42 in FIG. 53 is feasible by operations of Steps 6 through 13.

Figure 55:
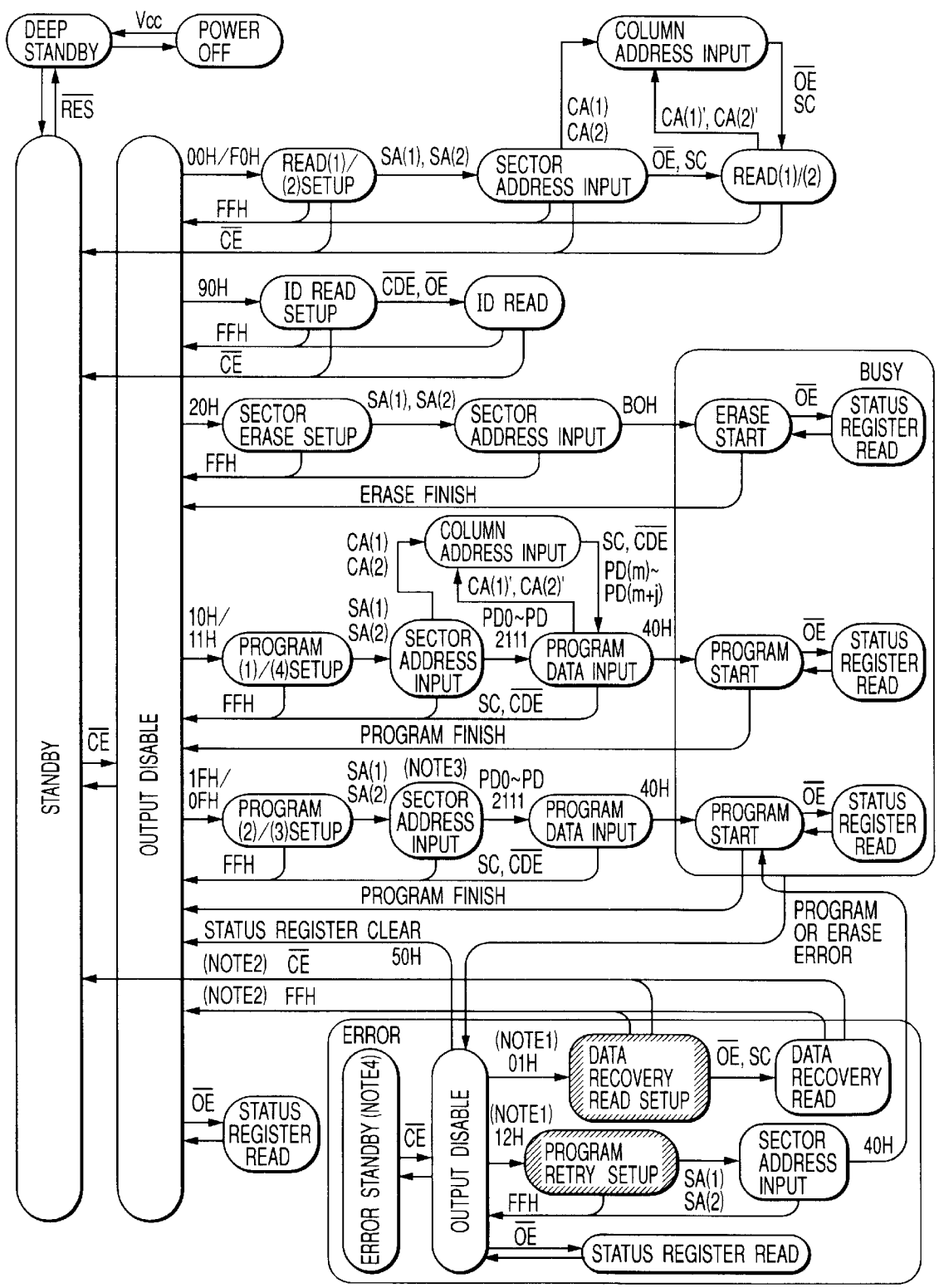
FIG. 55 is a state transition diagram illustrating, as an example, a transition state of each internal operation of a flash memory having a retry and a recovery read functions.

FIG. 55 shows the state of transition of internal operations of the flash memory having the retry and recovery read functions. The flash memory is brought to a deep standby state (Deep Standby) when power is turned on. Further, the flash memory is brought to a standby state (Standby) according to the negation of a reset signal. When the state of the flash memory is shifted from the standby state to a chip selected state, it is brought to an output disabled state (Output disable) and is thereby capable of performing operations corresponding to command inputs. The operations corresponding to the command inputs are roughly divided into Read set up, Sector Erase set up, Program set up, etc. When an error (ERROR) occurs in erasure or writing, the flash memory can accept a recovery read command (Recovery Read set up) and a retry write command (Program Retry set up).

The flash memory described subsequently to FIG. 42 is also applicable to the memory card 19 described in FIG. 40 and a data processing system.

Owing to the decoding of the write data by the decoder circuit 200 upon the data input, the flash memory described subsequently to FIG. 42 is capable of reducing the time required to perform the data latch processing which has heretofore been carried out by the data latches, the sense latch and the logic combining circuits on the bit line. It is also possible to accurately restore the initial data of the sense latch, which has disappeared in the course of the write operation, and carry out a data disturb check, an erratic check, a program retry and a data recovery read. Thus, the use of the memory card and the data processing system having used such a flash memory makes it possible to improve the efficiency of data processing with access to the flash memory.

While the invention made above by the present inventors has been described specifically by the illustrated embodiments, the present invention is not limited to the embodiments. It is needless to say that various changes can be made thereto within the scope not departing from the substance thereof.

For example, the information held in one memory cell is not limited to four values or may be greater than the four values. When it is desired to represent the information as eight values, the number of data latches connected to each bit line may further be increased. The method of performing operation on the data latch processing is not limited to the above description and may suitably be changed. Further, the number of memory mats, a write voltage condition, an erase voltage condition, a verify voltage condition, etc. may suitably be changed. The erase state and the write state can also be defined contrary to the aforementioned description. Each of the memory mats employed in the flash memory is not limited to the AND type and may take other structures such as a NOR type, a DiNOR type, an NAND type, etc.

The semiconductor device according to the present invention is not limited to the memory chip like the flash memory. The present invention can widely be applied even to a semiconductor device for data processing or logic operation, such as a microcomputer with a built-in flash memory. Further, the present invention is also applicable even to an EEPROM.

Advantageous effects obtained by typical ones of the inventions disclosed in the present application will be described in brief as follows:

Decoding write data upon data input makes it possible to reduce the time required to perform data latch processing which has heretofore been carried out by logic combining circuits connected to each bit line.

It is possible to accurately restore the initial data of a sense latch, which has been lost in the course of a write operation and perform a data disturb check, an erratic check, a program retry, and a data recovery read.

Using a memory card and a data processing system using such a flash memory allows an improvement in the efficiency of data processing associated with access to the flash memory.

What is claimed is:

1. A semiconductor device which allows one electrically erasable and programmable nonvolatile memory cell to store multi-valued information therein, comprising:
 a sense latch having a pair of input/output terminals;
 bit lines provided in association with the respective input/output terminals of the sense latch;
 a plurality of nonvolatile memory cells selectively connected to the bit lines and capable of electrically performing erasure and writing;
 data latches respectively connected to the bit lines;
 a first logic combining circuit connected to the data latches and the sense latch; and
 a control circuit connected to the sense latch, the data latches and the first logic combining circuit;
 wherein the first logic combining circuit generates control data used to define to which threshold voltage state a threshold voltage state of one nonvolatile memory cell is set, every plural bits of write data and to supply the generated data to the corresponding sense latch and data latches respectively on a parallel basis, and
 wherein the control circuit is capable of performing program control so as to control the operations of the sense latch, the data latches and the first logic combining circuit to thereby bring each volatile memory cell to a predetermined threshold voltage state according to a logic value of the control data supplied from the first logic combining circuit to the sense latch and successively bring volatile memory cells to predetermined threshold voltage states according to logic values of control data supplied from the data latches to the sense latch.

2. A semiconductor device comprising:
 a first latch having a pair of input/output nodes;
 a first bit line connected to one input/output node of the first latch and connected with a plurality of electrically rewritable nonvolatile memory cells;
 a second bit line connected to the other input/output node of the first latch and connected with a plurality of electrically rewritable nonvolatile memory cells;
 a second latch connected to the first bit line;
 a third latch connected to the second bit line;
 a first logic combining circuit connected to the first through third latches;
 a second logic combining circuit connected to the first bit line;
 a third logic combining circuit connected to the second bit line; and
 a control circuit connected to the first through third latches and the first through third logic combining circuits;
 wherein the first logic combining circuit generates control data used to define to which of first through third threshold voltage states one nonvolatile memory cell is set with respect to a fourth threshold voltage state and to supply the generated data to the corresponding first through third latches, and
 wherein the control circuit is capable of performing program control so as to control the operations of the first through third latches and the first through third logic combining circuits to thereby bring each volatile memory cell to a first threshold voltage state according to a logic value of the control data supplied from the first logic combining circuit to the first latch, bring each volatile memory cell to a second threshold voltage state according to a logic value of the control data supplied from the second latch to the first latch, and bring each volatile memory cell to a third threshold voltage state according to a logic value of the control data supplied from the third latch to the first latch.

3. The semiconductor device according to claim 2, wherein the control circuit determines whether the threshold voltage state of the corresponding nonvolatile memory cell has reached an intended threshold voltage state through the use of the second and third logic combining circuits each time a voltage is applied for varying the threshold voltage of each nonvolatile memory cell in response to the predetermined logic value of the control data supplied to the first latch under the program control, and inverts the logic value of the control data of the first latch when the threshold voltage state thereof is found to have reached the intended threshold voltage state and subsequently suppresses a change in threshold voltage state with respect to the corresponding nonvolatile memory cell.

4. The semiconductor device according to claim 3, wherein the control circuit is capable of performing disturb check control for determining under the program control whether the threshold voltage state of the nonvolatile memory cell to be maintained at the fourth threshold voltage state is distinguishable from an adjacent threshold voltage state higher than that in threshold voltage, first erratic check control for determining under the program control whether a threshold voltage state of a nonvolatile memory cell, which is to be changed to the adjacent threshold voltage state, is distinguishable from a further adjacent threshold voltage state higher than that in threshold voltage, and second erratic check control for determining under the program control whether a threshold voltage state of a nonvolatile memory cell, which is to be changed to the further adjacent threshold voltage state, is distinguishable from a still further adjacent threshold voltage state higher than that in threshold voltage.

5. The semiconductor device according to claim 4, wherein the disturb check control is a process for allowing the control circuit to determine through the use of the second and third logic combining circuits whether each memory cell should be maintained at the fourth threshold voltage state, based on the control data held in the second and third latches and data read from the corresponding memory cell, and for allowing the control circuit to set control data having a predetermined logic value prior to the logic value inversion to the first latch only with respect to the memory cell to be held in the fourth threshold voltage state thereby to determine whether the threshold voltage state of the memory cell is distinguishable from the adjacent threshold voltage state higher than that in threshold voltage.

6. The semiconductor device according to claim 5, wherein the first erratic check control is a process for allowing the control circuit to transfer the control data held in a predetermined one of the second latch and the third latch to the first latch through the use of the second and third logic combining circuits thereby to determine whether the threshold voltage state of the memory cell is distinguishable from the further adjacent threshold voltage state higher than that in threshold voltage, and the second erratic check control is a process for allowing the control circuit to transfer the control data held in the predetermined other of the second latch and the third latch to the first latch through the use of the second and third logic combining circuits thereby to determine whether the threshold voltage state of the memory cell is distinguishable from the further adjacent threshold voltage state higher than that in threshold voltage.

7. The semiconductor device according to any one of claims 4 through 6, wherein when a state undistinguishable from a predetermined threshold voltage state is detected upon the disturb check control, the first erratic check control or the second erratic check control, the control circuit restores the control data sent from the first logic combining circuit to the first latch related to a memory cell, based on the control data held in the second and third latches and data read from the memory cell through the use of the second and third logic combining circuits, thereby allowing the resumption of the program process.

8. The semiconductor device according to claim 7, wherein when the program process is resumed, each nonvolatile memory cell intended for the program process is the same as the immediately preceding program process.

9. The semiconductor device according to claim 7, wherein when the program process is resumed, each nonvolatile memory cell intended for the program process is a newly-specified one.

10. The semiconductor device according to any one of claims 4 through 6, wherein when a state undistinguishable from a predetermined threshold voltage state is detected upon the disturb check control, the first erratic check control or the second erratic check control, the control circuit restores the control data sent from the first logic combining circuit to the first latch related to a memory cell, based on the control data held in the second and third latches and data read from the memory cell through the use of the second and third logic combining circuits, and restores write data represented in 2-bit units, based on the restored latched data of the first latch circuit and the latched data of the second and third latches, thereby allowing the output of the restored write data to the outside through the second and third latches.

11. A data processing system comprising:
a semiconductor device according to any one of claims 1 through 6;
a memory controller which access-controls the semiconductor device; and
a processor which controls the memory controller.

12. A memory card comprising:
a card substrate including,
a semiconductor device according to any one of claims 1 through 6, a memory controller which access-controls the semiconductor device, and an external interface circuit connected to the memory controller, all of which are packaged thereon.

13. A data processing system comprising:
a semiconductor device according to claim 7;
a memory controller which access-controls the semiconductor device; and
a processor which controls the memory controller.

14. A data processing system comprising:
a semiconductor device according to claim 8;
a memory controller which access-controls the semiconductor device; and
a processor which controls the memory controller.

15. A data processing system comprising:
a semiconductor device according to claim 9;
a memory controller which access-controls the semiconductor device; and
a processor which controls the memory controller.

16. A data processing system comprising:
a semiconductor device according to claim 10;
a memory controller which access-controls the semiconductor device; and
a processor which controls the memory controller.

17. A memory card comprising:
a card substrate including,
a semiconductor device according to claim 7, a memory controller which access-controls the semiconductor device, and an external interface circuit connected to the memory controller, all of which are packaged thereon.

18. A memory card comprising:
a card substrate including,
a semiconductor device according to claim 8, a memory controller which access-controls the semiconductor device, and an external interface circuit connected to the memory controller, all of which are packaged thereon.

19. A memory card comprising:
a card substrate including,
a semiconductor device according to claim 9, a memory controller which access-controls the semiconductor device, and an external interface circuit connected to the memory controller, all of which are packaged thereon.

20. A memory card comprising:
a card substrate including,
a semiconductor device according to claim 10, a memory controller which access-controls the semiconductor device, and an external interface circuit connected to the memory controller, all of which are packaged thereon.

21. A data processing system comprising:
a control device; and
one or plural nonvolatile memory devices connected to the control device;
wherein each of the nonvolatile memory devices has a first latch device connected to one ends of first and second bit lines, second and third latch devices respectively connected to the other ends of the first and second bit lines, and a plurality of memory cells respectively connected to the first and second bit lines, wherein each of the memory cells is capable of changing a threshold voltage thereof so as to store predetermined data therein, wherein a first control circuit is connected to the first through third latch devices, and generates threshold voltage information to be set to the memory cell and sets predetermined information to the first through the third latch devices according to the threshold voltage to be set to the memory cell, wherein a second control circuit is provided which controls the setting of the threshold voltage to the memory cell according to control information from the control device, and wherein the control device supplies the control information and the data to be stored in the memory cell to each of the nonvolatile memory devices and performs a predetermined control operation.

22. The data processing system according to claim 21, wherein the threshold voltage to be set to the memory cell has threshold voltage levels of three stages or more corresponding to information of at least 2 bits of the data to be stored in the memory cell.

23. The data processing system according to claim 22, wherein the nonvolatile memory device has a plurality of select lines, the memory cells are respectively connected to the corresponding select lines, and the change in threshold voltage of the memory cell is effected on a memory cell selected by the select line.

24. A data processing system comprising:

a control device; and one or plural nonvolatile memory devices connected to the control device, wherein the control device supplies control information and data to be stored in each of the nonvolatile memory devices to the one or plural nonvolatile memory devices or performs predetermined processing, wherein the nonvolatile memory device has a control circuit and a plurality of bit lines, said bit lines being connected to a plurality of memory cells and information storage circuits, and said each memory cell having threshold voltage distributions of at least three stages and set to any of the threshold voltage distributions, based on information stored in the information storage circuit, wherein the control circuit divides the data into at least partial data set by 2 bits, generates control information for determining the threshold voltage distribution of each memory cell, based on the partial data, and supplies the generated control information to the corresponding information storage circuit.

* * * * *